(12) United States Patent
Ausserlechner et al.

(10) Patent No.: US 9,103,853 B2
(45) Date of Patent: Aug. 11, 2015

(54) CURRENT SENSOR

(71) Applicant: Infineon Technologies AG, Neubiberg (DE)

(72) Inventors: Udo Ausserlechner, Villach (AT); Wolfgang Scherr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/508,670

(22) Filed: Oct. 7, 2014

(65) Prior Publication Data

US 2015/0061662 A1    Mar. 5, 2015

Related U.S. Application Data

(63) Continuation-in-part of application No. 12/949,419, filed on Nov. 18, 2010, now Pat. No. 8,878,531.

(51) Int. Cl.
*G01R 33/02*   (2006.01)
*G01R 19/00*   (2006.01)
(Continued)

(52) U.S. Cl.
CPC .......... *G01R 19/0092* (2013.01); *G01R 15/207* (2013.01); *G01R 33/07* (2013.01); *G01R 33/091* (2013.01); *G01R 33/18* (2013.01)

(58) Field of Classification Search
CPC .. G01R 19/0092; G01R 33/18; G01R 33/091; G01R 33/07; G01R 15/207
USPC ............... 324/163, 173, 174, 207.11–207.15; 702/138, 145, 130; 73/766–767, 774, 73/777, 779
See application file for complete search history.

(56) References Cited

U.S. PATENT DOCUMENTS 5,074,152 A    12/1991   Ellner et al.
6,988,414 B2    1/2006   Ruhrig et al.
(Continued)

FOREIGN PATENT DOCUMENTS

EP    1113277 A1    7/2001
WO    0123899 A1    4/2001

OTHER PUBLICATIONS

Non-Final Office Action dated Aug. 8, 2013 in connection with U.S. Appl. No. 12/949,419.
(Continued)

*Primary Examiner* — Melissa Koval
*Assistant Examiner* — Trung Nguyen
(74) *Attorney, Agent, or Firm* — Eschweiler & Associates, LLC

(57) ABSTRACT

Embodiments of the disclosure provide a current sensor including a conductive element and at least two magnetic field sensors. The conductive element includes at least three separate terminal areas, a common conductive area and at least three separate intermediate areas connecting the respective separate terminal areas to the common conductive area. Each of the terminal areas is connected separately via a respective separate intermediate area of the at least three separate intermediate areas to the common conductive area to guide a current applied to the respective terminal area into the common conductive area. The at least two magnetic field sensors are arranged at different geometric positions adjacent to the at least three separate intermediate areas, wherein each of the magnetic field sensors is configured to sense a magnetic field component of each current flowing into the common conductive area to provide a sensor signal based thereon.

29 Claims, 35 Drawing Sheets

(51) Int. Cl.
*G01R 33/18* (2006.01)
*G01R 33/09* (2006.01)
*G01R 33/07* (2006.01)
*G01R 15/20* (2006.01)

(56) References Cited

U.S. PATENT DOCUMENTS 7,474,093 B2    1/2009    Ausserlechner

2002/0034055 A1    3/2002    Seyama et al.
2006/0081954 A1    4/2006    Tondra et al.
2006/0219436 A1    10/2006    Taylor et al.
2010/0156394 A1    6/2010    Ausserlechner et al.

OTHER PUBLICATIONS

Final Office Action dated Mar. 20, 2014 in connection with U.S. Appl. No. 12/949,419.

Notice of Allowance dated Jul. 7, 2014 in connection with U.S. Appl. No. 12/949,419.

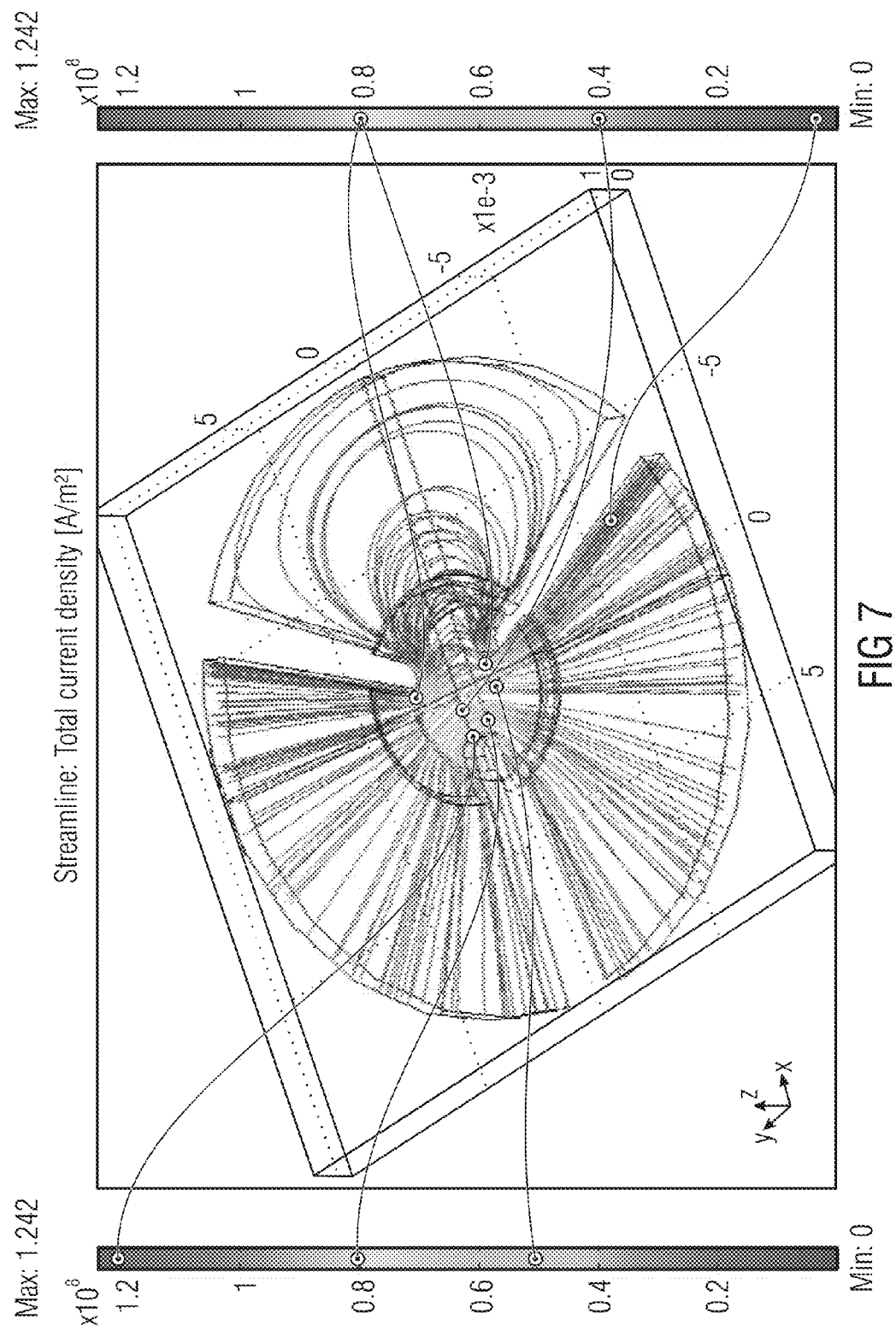

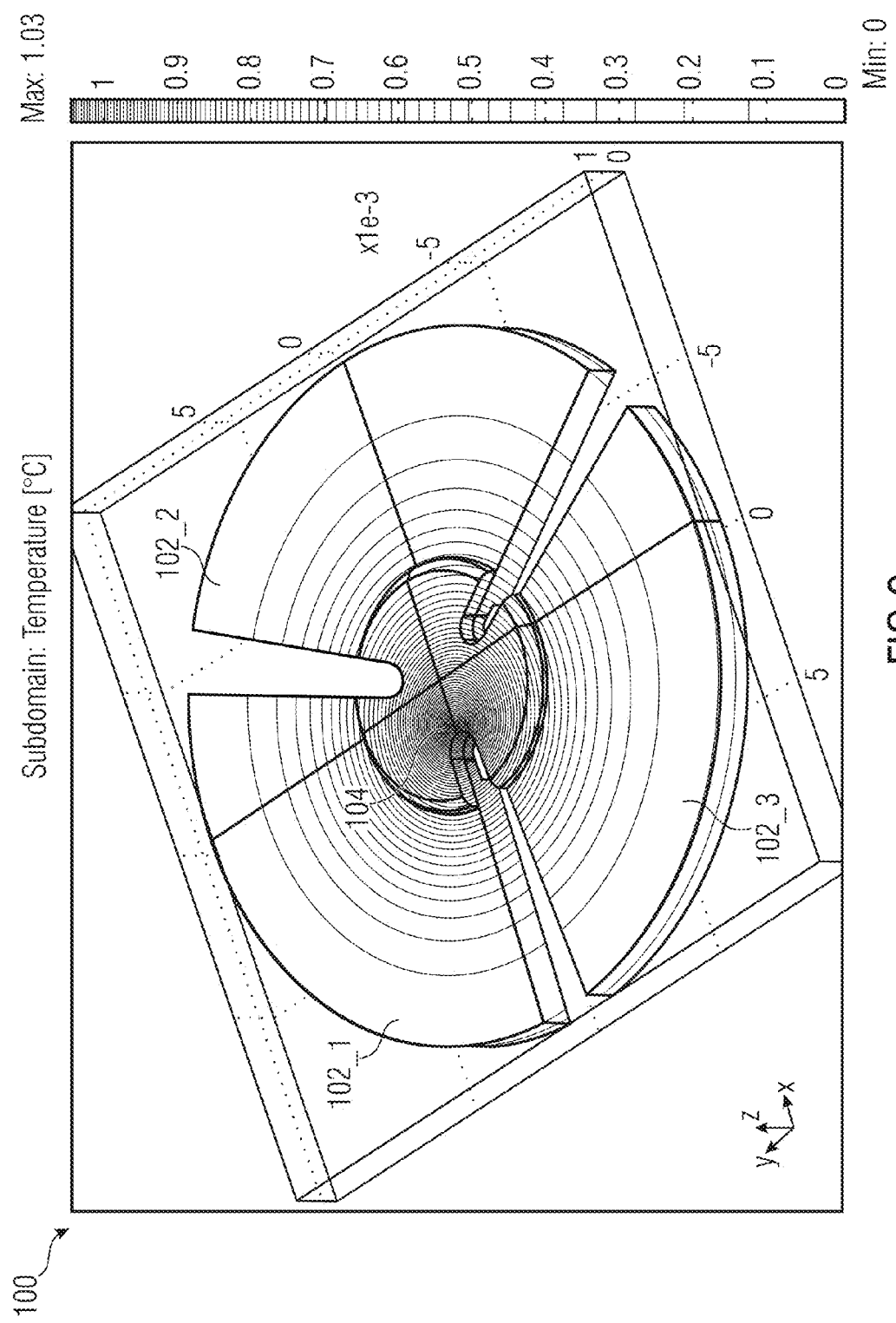

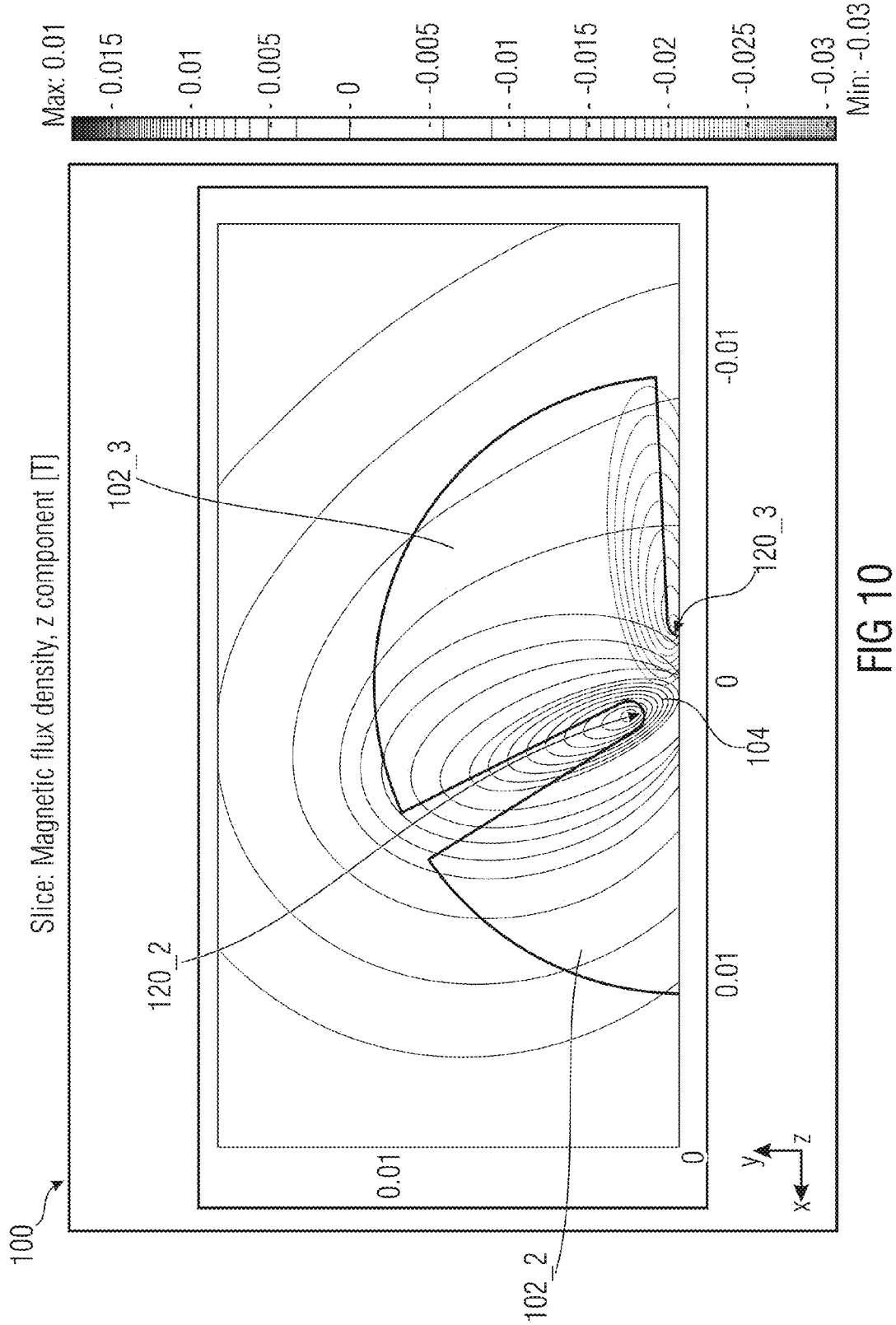

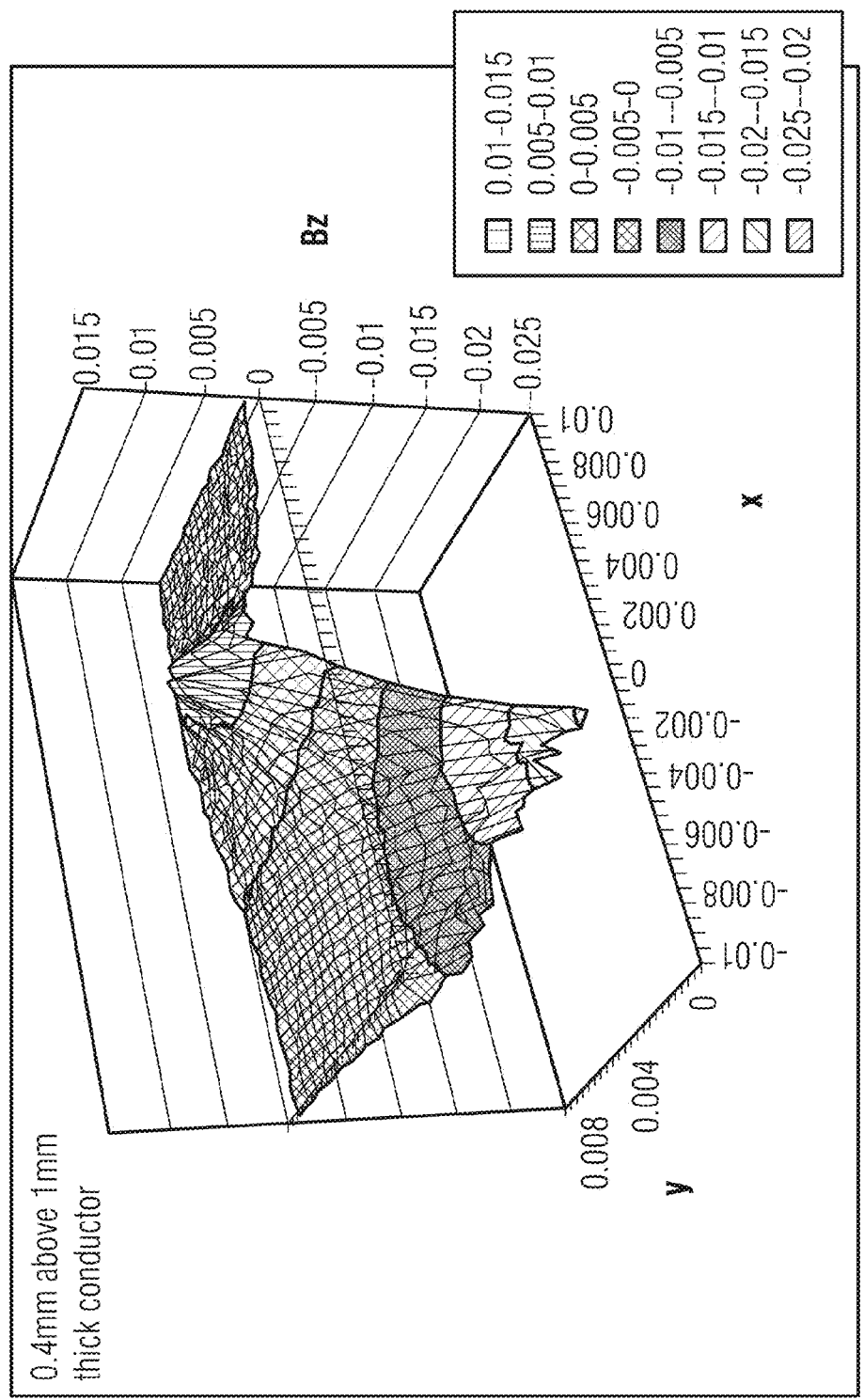

CURRENT SENSOR

CROSS-REFERENCE TO RELATED APPLICATIONS

This application is a continuation-in-part of application Ser. No. 12/949,419 filed Nov. 18, 2010. The entire disclosure of the foregoing application is incorporated herein by reference.

FIELD

Embodiments of the present invention relate to a current sensor. Some embodiments relate to a current sensor node with at least three terminal areas and at least two magnetic field sensors for sensing each current flowing into the current sensor node.

BACKGROUND

Current sensors are used for a variety of applications, such as for measuring or detecting how a current splits up if several conductors are connected in a circuit node.

FIG. 32 shows a node connecting three wires (or conductors). This is a common situation in many power distribution systems, where primary energy may be input to the system via I1 (wherein I1 may designate a first current). It may flow to a load via I2 (wherein I2 may designate a second current), but it can also flow to a back-up battery via I3 (wherein I3 may designate a third current). It may also happen that in some instances I1 is equal to zero (I1=0) and the load (I2) is supplied merely by the battery (I3). This situation can also occur in electric vehicles where I1 may be supplied by a charger, I2 is flowing through the electric motor of the vehicle, which can also serve as a means for recuperation of kinetic energy into electric energy, and I3 comes from a large bank of batteries in the vehicle. In such situations it is not only of interest to measure a single current in a single branch of this network, but rather to measure the currents in all 4 branches (or in at least three branches or conductors).

SUMMARY

Embodiments of the present invention provide a current sensor comprising a conductive element and at least two magnetic field sensors. The conductive element comprises at least three terminal areas, a common conductive area and at least three separate intermediate areas connecting the at least three separate terminal areas to the common conductive area, wherein each of the at least three terminal areas is connected separately via a respective separate intermediate area of the at least three separate intermediate areas to the common conductive area to guide a current applied to the respective terminal area into the common conductive area. The at least two magnetic field sensors are arranged at different geometric positions adjacent to the at least three separate intermediate areas, wherein each of the at least two magnetic field sensors is adapted to sense a magnetic field component of the current flowing into the common conductive area to provide a sensor signal based on the sensed magnetic field component, wherein a geometric area surrounding and abutting the common conductive area is divided into two geometric sectors, each of the two geometric sectors abutting the common conductive area, wherein the at least three terminal areas are arranged in a first geometric sector of the two geometric sectors, and wherein signal terminals of the at least two magnetic field sensors are arranged in a second geometric sector of the two geometric sectors.

Additionally, the current sensor can comprise an evaluator adapted to evaluate a value of each current flowing into the common conductive area.

Further embodiments of the present invention provide a method for measuring at least three currents in a measuring node, wherein the measuring node comprises at least two magnetic field sensors and a conductive element with at least three separate terminal areas, a common conductive area and at least three separate intermediate areas connecting the at least three separate terminal areas to the common conductive area, wherein each of the at least three separate terminal areas is connected separately via a respective separate intermediate area of the at least three separate intermediate areas to the common conductive area to guide separately one of the at least three currents applied to the respective terminal area into the common conductive area, wherein the at least two magnetic field sensors are arranged adjacent to the at least three separate intermediate areas such that values of the at least three currents separately guided by the at least three separate terminal areas via the at least three separate intermediate areas into the common conductive area are separately evaluable, wherein a geometric area surrounding and abutting the common conductive area is divided into two geometric sectors, each of the two geometric sectors abutting the common conductive area, wherein the at least three terminal areas are arranged in a first geometric sector of the two geometric sectors, and wherein signal terminals of the at least two magnetic field sensors are arranged in a second geometric sector of the two geometric sectors. The method comprises the following steps: sensing separately magnetic field component of the at least three currents flowing into the measuring node with the at least two magnetic field sensors; and evaluating the values of the at least three separate currents flowing into the measuring node based on the separately sensed magnetic field components.

Some embodiments of the present invention provide a current sensor for measuring a current distribution in at least three conductors connected to the at least three terminal areas of the current sensor. Further, the at least three terminal areas are connected together electrically in a defined area, herein referred to as the common conductive area. However, outside this area the at least three terminal areas are isolated from each other, for example, by an isolating material. The isolating material bends the current applied to the respective terminal area, so that the current is guided into the common conductive area. In the common conductive area the current has to change the flow direction due to bends. The at least two magnetic field sensors are placed or arranged, for example, close to these bends, where the magnetic field caused by the flow of the current is maximized.

The evaluator can evaluate or compute the value of the current applied to each terminal area, for example, as a linear superposition of the sensor signals of the at least two magnetic field sensors. Furthermore, the evaluator can be adapted to evaluate a value of a background magnetic field based on the sensor signals of the at least two magnetic field sensors, so that the value of the current applied to each terminal area can be further evaluated or computed based on the value of the background magnetic field. Optionally, a confidence level of the measurement can be judged based on the value of the background magnetic field.

BRIEF DESCRIPTION OF THE DRAWINGS

Embodiments of the present invention are described herein making reference to the appended drawings.

FIG. 7 shows an illustrative view of a distribution of a total current density across the conductive element of the exemplary embodiment of the current sensor for a current applied to one terminal area and flowing between two terminal areas.

FIG. 9 shows an illustrative view of a thermal profile over the conductive element of the exemplary embodiment of the current sensor for a current applied to one terminal area and flowing between two terminal areas.

FIG. 10 shows an illustrative view of a distribution of a z-component of a magnetic flux density 0.1 mm above the conductive element of the exemplary embodiment of the current sensor for a current applied to one terminal area and flowing between two terminal areas.

FIGS. 11A-11D show in illustrative views the intensity profiles of the z-component of the magnetic field 0.1 mm, 0.2 mm, 0.3 mm and 0.4 mm, respectively, above the conductive element of the exemplary embodiment of the current sensor for a current applied to one terminal area and flowing between two terminal areas.

Figure 1:
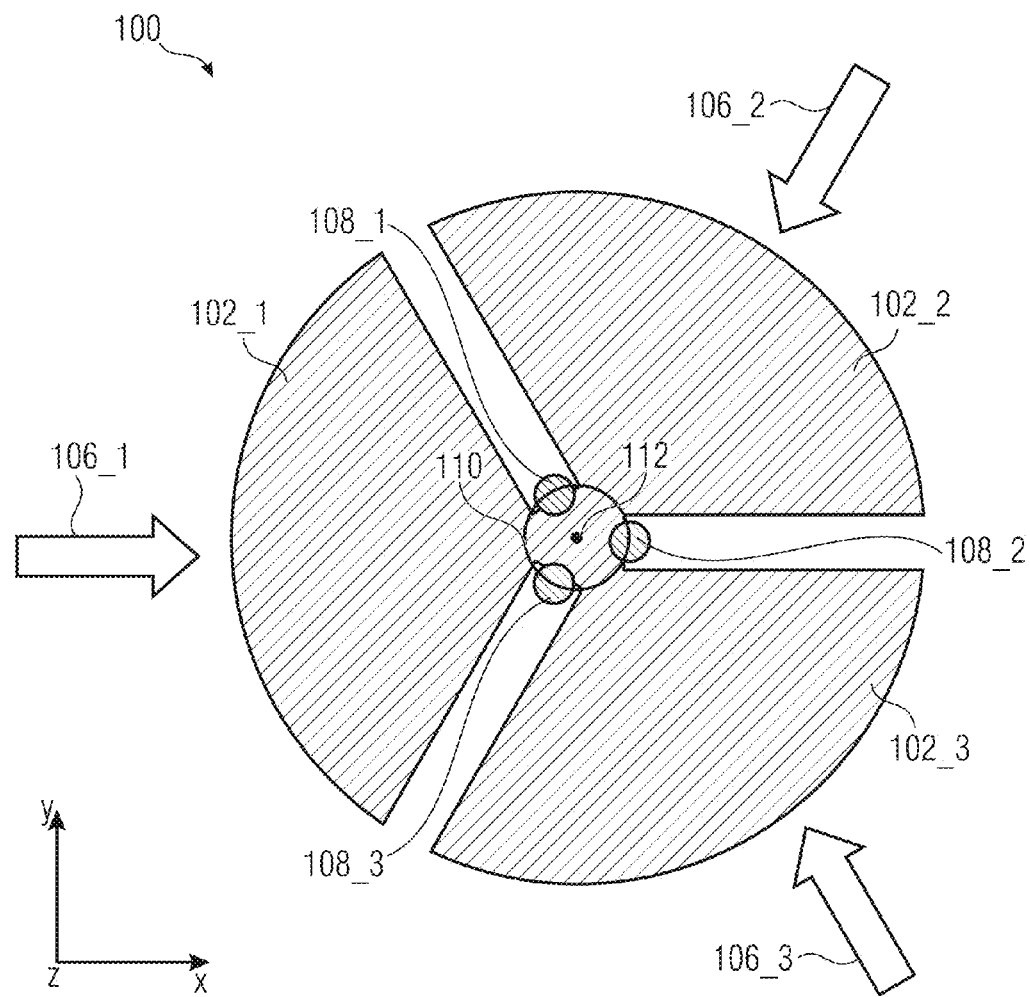
FIG. 1 shows an illustrative view of an embodiment of a current sensor with three terminal areas and three magnetic field sensors.

Equal or equivalent elements or elements with equal or equivalent functionality are denoted in the following description by equal or equivalent reference numerals.

DETAILED DESCRIPTION

FIG. 1 shows an illustrative view of an embodiment of a current sensor 100. The current sensor 100 comprises a conductive element (or current rail) with three terminal areas 102_1 to 102_3 and a common conductive area 104, wherein each of the three terminal areas 102_1 to 102_3 is connected to the common conductive area 104 to guide a current 106_1 to 106_3 applied to the respective terminal area 102_1 to 102_3 into the common conductive area 104. The current sensor 100 further comprises three magnetic field sensors 108_1 to 108_3 arranged at different geometric positions adjacent to the common conductive area 104, wherein each of the three magnetic field sensors 108_1 to 108_3 is adapted to sense a magnetic field component of the current (for example, of each current 106_1 to 106_3) flowing into the common conductive area 104 to provide a sensor signal based on the sensed magnetic field component.

The current sensor 100 shown in FIG. 1 comprises exemplarily three terminal areas 102_1 to 102_3 and three magnetic field sensors 108_1 to 108_3. Naturally, the current sensor 100 can comprise up to n terminal areas 102_1 to 102_$n$, that are connected to the common conductive area 104, wherein n may be a natural number greater than or equal to three. Furthermore, the current sensor 100 can comprise up to m magnetic field sensors 108_1 to 108_$m$, that are adapted to sense a magnetic field component of each current 106_1 to 106_$n$ flowing into the common conductive area 104 to provide a sensor signal based on the sensed magnetic field component, wherein m may be a natural number greater than or equal to two. In other words, the m magnetic field sensors 108_1 to 108_m_ are adapted to sense up to n currents 106_1 to 106_n_ applied to n terminal areas 102_1 to 102_n_.

In some embodiments, the number m of magnetic field sensors 108_1 to 108_m_ may be equal to the number n of terminal areas 102_1 to 102_n_. Furthermore, the number m of magnetic field sensors 108_1 to 108_m_ may be greater than or equal to the number n of terminal areas 102_1 to 102_n_ (m≥n), for sensing n independent currents 106_1 to 106_n_ applied to n terminal areas 102_1 to 102_n_. The number m of magnetic field sensors 108_1 to 108_m_ optionally may be one less than the number n of terminal areas 102_1 to 102_n_, wherein the n independent currents 106_1 to 106_n_ applied to the n terminal areas 102_1 to 102_n_ might be calculated based on the sensor signals of the m magnetic field sensors 108_1 to 108_m_ and on Kirchhoff's circuit law.

In the following, an exemplary current sensor 100 with at least three terminal areas 102_1 to 102_n_ (n≥3) and at least three magnetic field sensors 108_1 to 108_m_ (m≥3) is described. Furthermore, the number m of magnetic field sensors 108_1 to 108_m_ may be greater than or equal to the number n of terminal areas 102_1 to 102_n_ (m≥n). Naturally, the following description is also applicable to other embodiments of the current sensor 100.

In the present embodiment of the current sensor 100 shown in FIG. 1, the number m of magnetic field sensors 108_1 to 108_m_ is exemplarily chosen to be 3 (m=3). Furthermore, the number n of terminal areas 102_1 to 102_n_ is exemplarily chosen to be 3 (n=3).

Each current flowing into the common conductive area 104 may generate a magnetic field through each of the at least three magnetic field sensors 108_1 to 108_m_ (m≥3). Additionally, the at least three magnetic field sensors 108_1 to 108_m_ (m≥3) can be arranged in such a manner, that the sensed magnetic field component is maximized or within a range having at least 50% or 80% of the maximum magnetic field strength for one specific current. For example, for a current applied to one specific terminal area 102_1 to 102_n_ or for a current between two specific terminal areas 102_1 to 102_n_.

The conductive element comprising the common conductive area 104 and the at least three terminal areas 102_1 to 102_n_ (n≥3) can be formed or arranged in such a manner, that a current density for different currents 106_1 to 106_n_ flowing into the common conductive area 104 or between the at least three terminal areas 102_1 to 102_n_ (n≥3) is maximized at different geometric positions. For example, a current density for a first current 106_1 flowing into the common conductive area 104 can be maximized at a first geometric position, wherein a current density for a second current 106_2 flowing into the common conductive area 104 can be maximized at a second geometric position, and wherein a current density for a third current 106_3 flowing into the common conductive area 104 can be maximized at a third geometric position. A maximized current density implies a maximized magnetic field, so that the at least three magnetic field sensors 108_1 to 108_m_ (m≥3) may be placed or arranged at the corresponding geometric positions, where the current densities and the magnetic field components therefrom are maximized or within a range having at least 50% or 80% of the maximum magnetic field strength.

Additionally, the current sensor 100 can comprise an evaluator adapted to evaluate a value of each current 106_1 to 106_n_ flowing into the common conductive area 104. The evaluator may optionally comprise an output for outputting the value of each current 106_1 to 106_n_ flowing into the common conductive area 104.

In a possible application the current sensor 100 shown in FIG. 1 with three terminal areas 102_1 to 102_3 and three magnetic field sensors 108_1 to 108_3 can be placed in a circuit as a node that connects three conductors or wires. Thereby, the current sensor 100 can measure simultaneously all three currents 106_1 to 106_3. This saves space, costs, volume, material, complexity, and dissipation, and increases the reliability.

Furthermore, embodiments of the present invention allow measuring all three currents simultaneously without the need of DSP (DSP=digital signal processor) capabilities for computing the third current. Thereby, cost benefits are created and the customer can focus on the application requiring just the current values. Finally, reducing the amount of components to a single component (or current sensor 100) allows further power consumption and accuracy optimizations.

In an environment with a background magnetic field, the at least three magnetic field sensors 108_1 to 108_m_ (m≥3) will not only sense or detect a component of a magnetic field caused by each current 106_1 to 106_n_ flowing into the common conductive area 104, but will also sense or detect a component of the background magnetic field. For compensating or minimizing the sensed component of the background magnetic field, the evaluator can further be adapted to derive a value of the background magnetic field based on the sensor signal of each of the at least three magnetic field sensors 108_1 to 108_m_ (m≥3), and to evaluate or estimate the value of each current 106_1 to 106_n_ flowing into the common conductive area 104 based on the value of the background magnetic field.

The appended figures show a respective axis of an x-y-z-coordinate system, wherein the x-axis and the y-axis define a lateral plane or lateral dimension parallel to the conductive element, that comprises the common conductive area 104 and the at least three terminal areas 102_1 to 102_n_ (n≥3), and wherein the z-axis defines a vertical dimension vertical to the conductive element of the current sensor 100.

The at least three magnetic field sensors 108_1 to 108_m_ (m≥3) can be arranged at different geometric positions adjacent to the common conductive area 104. For example, the at least three magnetic field sensors 108_1 to 108_m_ (m≥3) can be arranged in such a manner, that the at least three currents 106_1 to 106_n_ (n≥3) flowing into the common conductive area 104 can be measured or computed simultaneously as a superposition of the magnetic field on each of the at least three magnetic field sensors 108_1 to 108_m_ (m≥3). Therefore, the at least three magnetic field sensors 108_1 to 108_m_ (m≥3) can be arranged on a circle 110, wherein the at least three magnetic field sensors 108_1 to 108_m_ (m≥3) may be isolated against the conductor (or conductive element). Further, the at least three magnetic field sensors 108_1 to 108_m_ (m≥3) can be arranged symmetrically on the circle 110. A center point 112 of the circle 110 may coincide with or match a center point of the common conductive area 104. Additionally, the at least three magnetic field sensors 108_1 to 108_m_ (m≥3) can be arranged with (360°/m) symmetry. If the current sensor 100 comprises three magnetic field sensors 108_1 to 108_3, the three magnetic field sensors 108_1 to 108_3 can be arranged with 120° symmetry. If the current sensor 100 comprises four magnetic field sensors 108_1 to 108_4, the four magnetic field sensors 108_1 to 108_4 can be arranged with 90° symmetry.

Furthermore, the at least three magnetic field sensors 108_1 to 108_m_ (m≥3) (or the center of the effective or active sensitive area of the corresponding magnetic field sensor 108_1 to 108_*m*) can be arranged on the circle 110 between two adjacent terminal areas 102_1 to 102_*n*. In FIG. 1 the three magnetic field sensors 108_1 to 108_3 are arranged near the ends of the slots, or in other words, between two adjacent terminal areas. Thus, the first magnetic field sensor 108_1 might be placed between the first and the second terminal area 102_1 and 102_2. There the z-component of the magnetic field is maximized or within a range having at least 50% or 80% of the maximum magnetic field strength. Hence, the three magnetic field sensors 108_1 to 108_3 can be magnetic field sensors sensitive to the z-component of the magnetic field.

In some embodiments, the at least three magnetic field sensors 108_1 to 108_*m* (m≥3) can thus be Hall-sensors, Hall-plates or any other magnetic field sensor elements adapted for sensing the z-component of the magnetic field resulting or caused by the current(s) 106_1 to 106_*n* to be measured.

Figure 2:
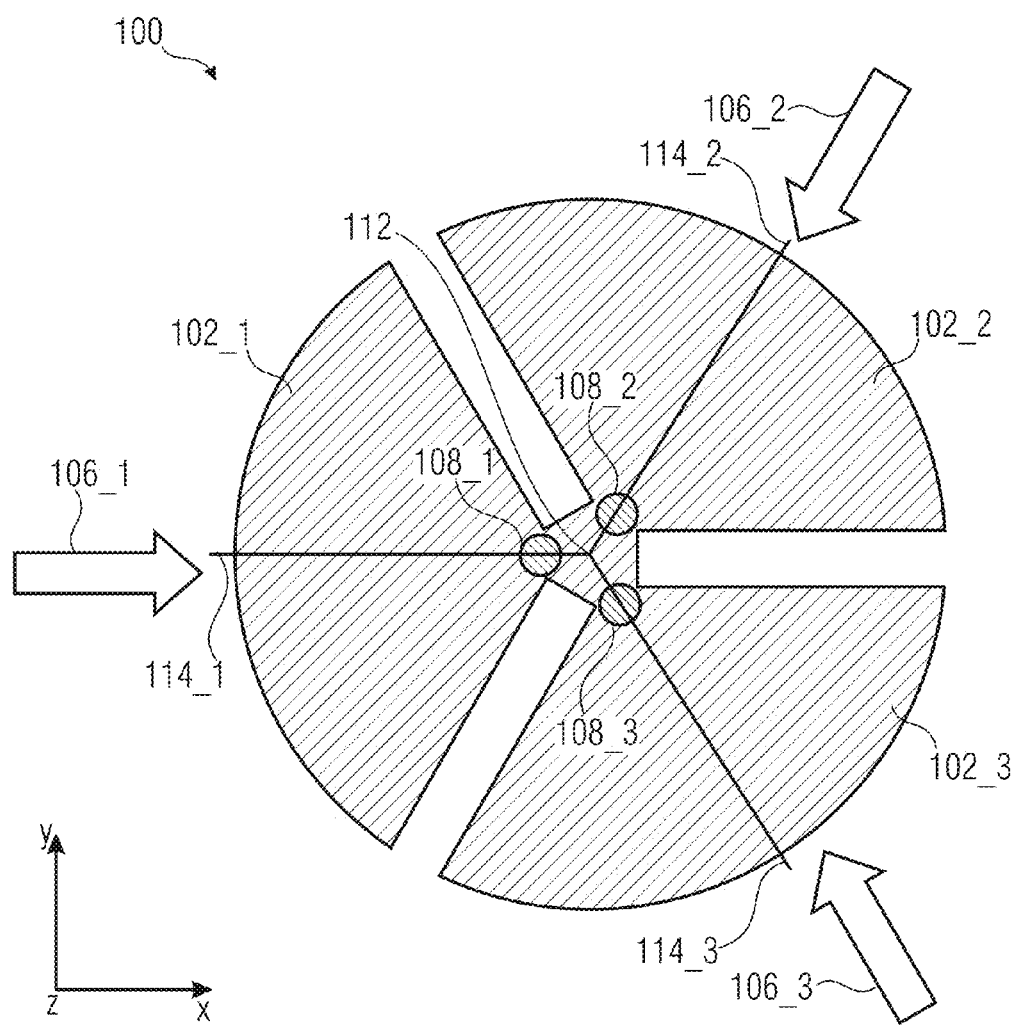
FIG. 2 shows an illustrative view of an alternative embodiment of a current sensor with three terminal areas and three magnetic field sensors.

FIG. 2 shows an illustrative view of an alternative embodiment of a current sensor 100 with three terminal areas 102_1 to 102_3 and three magnetic field sensors 108_1 to 108_3. In contrast to FIG. 1, in FIG. 2 each of the three terminal areas 102_1 to 102_3 is arranged to define a center line 114_1 to 114_3, wherein the center lines 114_1 to 114_3 of the three terminal areas 102_1 to 102_3 intercept in a center point 112, and wherein each of the three magnetic field sensors 108_1 to 108_3 (or the center of the effective or active sensitive area of the corresponding magnetic field sensor 108_1 to 108_3) is arranged at a defined distance from the center point 112 on the center line 114_1 to 114_3 of the respective terminal area 102_1 to 102_3. Furthermore, each of the three magnetic field sensors 108_1 to 108_3 can be arranged at an equal distance from the center point 112 on the center line 114_1 to 114_3 of the respective terminal area 102_1 to 102_3.

Generally, the at least three magnetic field sensors 108_1 to 108_*m* (m≥3) can be arranged on any circumferential line having an geometrically symmetrical form, for example, with respect to a center point. The symmetric arrangement of the at least three magnetic field sensors 108_1 to 108_*m* (m≥3) may increase the accuracy of the current measuring results. However, an asymmetric arrangement of the at least three magnetic field sensors 108_1 to 108_*m* (m≥3) is also possible, wherein the accuracy of the current measurement results might be increased based on a calibration of the current sensor 100. Furthermore, the evaluator can be adapted to evaluate the value of each current 106_1 to 106_*n* flowing into the common conductive area based on, for example, calibration data.

As shown in FIG. 2, the three magnetic field sensors 108_1 to 108_3 might be arranged on the center lines 114_1 to 114_3 between the ends of the slots. There the in-plane component of the magnetic field is maximized or within a range having at least 50% or 80% of the maximum magnetic field strength. Thus, the three magnetic field sensors 108_1 to 108_3 may be magnetic field sensors sensitive to the in-plane component (or x-y-component) of the magnetic field perpendicular to the direction of current flow (such as vertical Hall devices or magneto-resistors MR like (anisotropic MR) AMR, (giant MR) GMR, (tunneling MR) TMR, (colossal MR) CMR).

The current sensor 100 shown in FIG. 2 comprises exemplarily three terminal areas 102_1 to 102_3 and three magnetic field sensors 108_1 to 108_3. Naturally, the idea can be generalized to measure four or more currents 106_1 to 106_*n* flowing into a common node (or current sensor node with n terminal areas 102_1 to 102_*n*).

Furthermore, the at least three magnetic field sensors 108_1 to 108_*m* (m≥3) can be discrete sensors, wherein the sensor signals can be sent to an integrated circuit or microprocessor, that computes the value of the at least three currents 106_1 to 106_*n* (n≥3) flowing into the common conductive area 104. Alternatively, the at least three magnetic field sensors 108_1 to 108_*m* (m≥3) can be a part of an integrated circuit. The integrated circuit may comprise a semiconductor substrate and a plurality of electronic devices that are coupled to a circuit. Thus, the substrate may be a silicon chip or any other substrate that might be commonly used in thick-film technology. Furthermore, the integrated circuit can comprise a PCB (PCB=printed circuit board), a microprocessor, DSP, FPGA (FPGA=field programmable gate array) or other computational solution.

The conductive element may comprise a homogenous electric conducting material with an electrical conductivity of at least $3*10^7$ S/m. Thus, for the conductive element, copper or aluminum alloys are suitable, wherein no magnetic additions may be contained. Magnetic additions like cobalt or iron are otherwise used with massive sheet thicknesses (from 0.3 mm), to make the material harder and thus less flexible and more dimensionally stable.

As depicted in FIG. 1 or FIG. 2, the three terminal areas 102_1 to 102_3 are isolated from each other in an area outside of the common conductive area 104, for example, by an isolating material. The isolating material bends the current 106_1 to 106_3 applied to the respective terminal area 102_1 to 102_3, so that the current 106_1 to 106_3 is guided into the common conductive area 104.

The conductive element of the current sensor 100 can be, as depicted in FIG. 1 or 2, a circular-shaped sheet-like conductor with at least three slots to form the at least three terminal areas 102_1 to 102_*n* (n≥3). In this case, the at least three terminal areas 102_1 to 102_*n* (n≥3) can be isolated from each other by an isolating material, such as air. It is also possible to cut out other shapes from the sheet-like conductor, for example, triangles with their pointed ends towards the center of the structure, or 60° corners or 90° corners cut out of a sheet metal.

Furthermore, the at least three terminal areas 102_1 to 102_*n* (n≥3) of the conductive element can be arranged symmetrically along a circle with (360°/n) symmetry. Thus, the terminal areas of a current sensor 100 with three terminal areas 102_1 to 120_3 can be arranged with 120° symmetry, wherein the terminal areas of a current sensor 100 with four terminal areas 102_1 to 102_4 can be arranged with 90° symmetry. Alternatively, if not all currents 106_1 to 106_*n* are equal or the same size, some terminal areas 102_1 to 102_*n* may be smaller than others. For example, in a three-phase system with a neutral conductor the terminal area corresponding to the neutral conductor might be smaller than the others. Furthermore, the common conductive area 104 of the current sensor 100 can be arranged at the center of the circle.

In some embodiments, the at least three magnetic field sensors 108_1 to 108_*m* (m≥3) may be intimately coupled to one another and to the conductive element. Due to being arranged on one substrate, the at least three magnetic field sensors 108_1 to 108_*m* (m≥3) may comprise, with respect to each other, extremely small positional tolerances and extremely small parameter scattering. Furthermore, the conductive element may be made of one solid piece, so that there is no need to position each of the at least three magnetic field sensors 108_1 to 108_*m* (m≥3) individually on the conductive element. Hence, there is only the need to align the substrate adjacent to the conductive element, for example, like a template. This setup results in a coupling, characterized in that each of the at least three magnetic field sensors 108_1 to 108__m (m≥3) is exposed to magnetic field components of each current 106_1 to 106__n flowing into the common conductive area 104. This coupling can be arithmetically solved by using simple means (for example, as a linear equation system).

Additionally, the at least three magnetic field sensors 108_1 to 108__m (m≥3) may have an almost identical temperature, since the temperature increase in the part of the conductive element that has the highest impedance—which is the common conductive area 104—primarily results in a homogeneous temperature increase in the substrate (or silicon die), and since temperature gradients are smaller by at least one order of magnitude. In other words, each current 106_1 to 106__n flowing into the common conductive area 104 may provide a mean temperature increase of each magnetic field sensor 108_1 to 108__m, wherein a maximum tolerance in increase of temperature between two magnetic field sensors 108_1 to 108__m may amount to 10% of the mean temperature increase.

In some embodiments, the current distribution in several conductors connected in a common node can be measured by connecting the conductors to a sheet-like conductor with several contacts (or at least three terminal areas 102_1 to 102__n (n≥3)). All contacts are connected together electrically in a defined region (or common conductive area 104), yet outside this region they are separated from each other by slots/stamped-out/etched-out parts. There, the current 106_1 to 106__n has to change the flow direction due to bends. The at least three magnetic field sensors 108_1 to 108__m (m≥3) can be placed close to these bends, where the magnetic field of the current 106_1 to 106__n to be measured is maximized. The current 106_1 to 106__n in each contact (or in each of the at least three terminal area 102_1 to 102__n (n≥3)) can be computed as a linear superposition of the magnetic field on each of the at least three magnetic field sensor 108_1 to 108__m (m≥3). Additionally, a background magnetic field disturbance can be estimated to judge the confidence level of the measurement.

Some embodiments of the current sensor 100 comprise a sheet-like conductor with three slots and three large contacts (or terminal areas 102_1 to 102_3) in between the slots. Three magnetic field sensors 108_1 to 108_3 can be placed on top of the conductor (or conductive element) near the ends of the slots (or between the ends of the slots). Further, the magnetic field sensors 108_1 to 108_3 can be electrically isolated against the conductor (or conductive element) by an isolating material. If the magnetic field sensors 108_1 to 108_3 have a linear response to the magnetic field acting on them, then the current through each contact (or terminal area 102_1 to 102_3) is equal to a linear combination of the signals of the magnetic field sensors. In addition, the system (or current sensor 100) can also compute the average external magnetic field acting on all three magnetic field sensors 108_1 to 108_3, meaning any magnetic disturbance which is not caused by the three currents 106_1 to 106_3 to be measured.

In the following, the functionality and current calculation of the current sensor 100 shall be described taking reference to an exemplary embodiment of the current sensor 100. The current sensor 100 can be a CLMCS (CLMCS=core-less magnetic current sensor) for three-phase-current measurement, wherein the magnetic field sensors 108_1 to 108_3 may be Hall plates. Naturally, the following description is also applicable to other embodiments of the current sensor 100.

Figure 3:
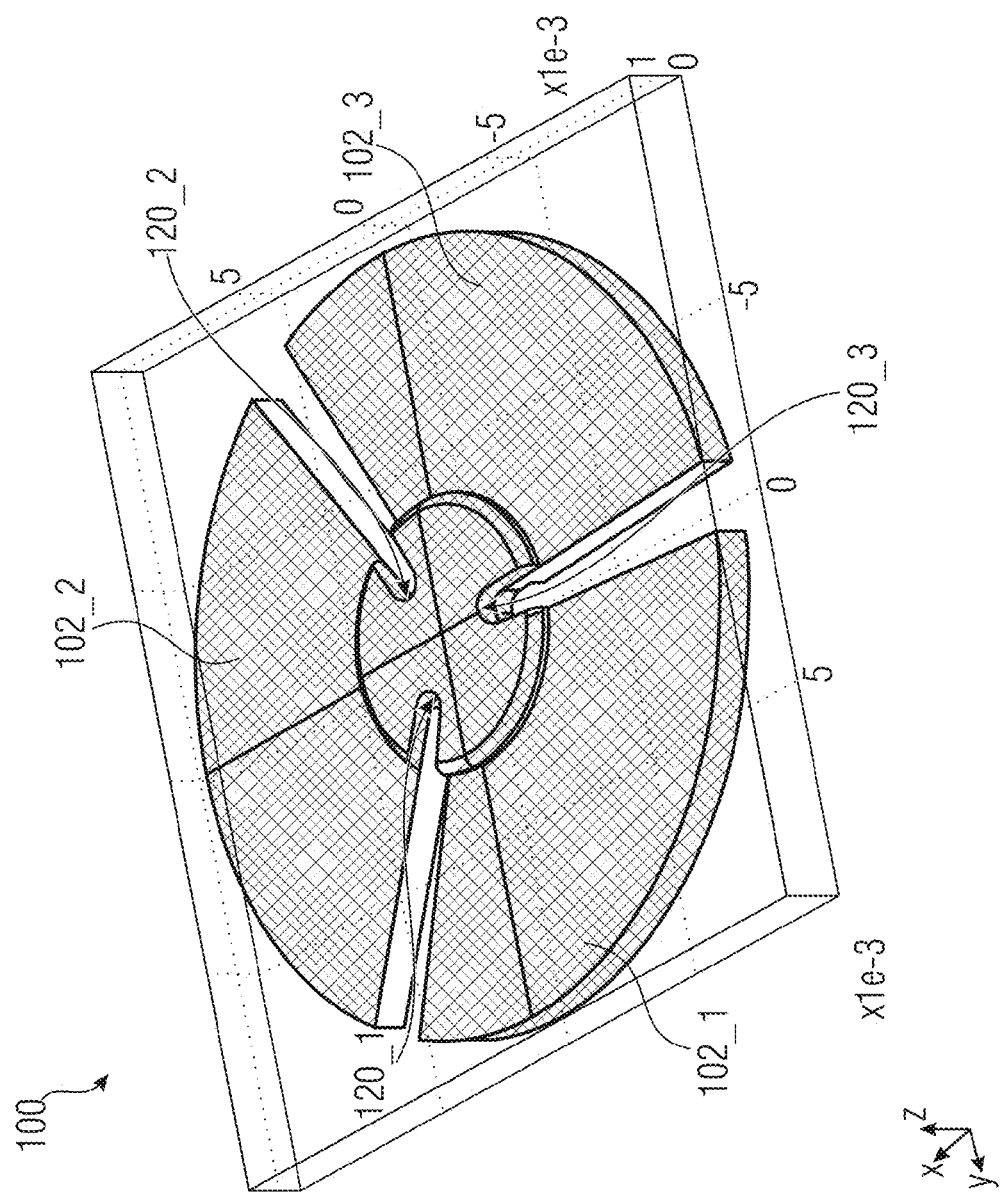
FIG. 3 shows an illustrative top-view of the conductive element or current rail of the exemplary embodiment of the current sensor.

FIG. 3 shows an illustrative top-view of the conductive element or current rail of the exemplary embodiment of the current sensor 100. The conductive element is a circular-shaped sheet-like conductor with three slots to form the three terminal areas 102_1 to 102_3. The three terminal areas 102_1 to 102_3 are arranged symmetrically with 120° symmetry along a circle, wherein the center point of the circle coincides with or matches the center point of the common conductive area 104.

A purpose of forming or profiling the conductive element as a sheet-like conductor is an increase in mechanical stability, on the one hand. On the other hand, an elevation may be created by means of the profile. If a substrate (like a silicon die) is placed thereon, and if said substrate has a thin electric insulation on its bottom side, considerable voltage sustaining capability (voltage isolation) may be achieved by making the substrate project beyond the elevation on all sides (e.g. by 0.5 mm). A further reason for the profile is that a mold compound of a packaging, described later on in FIGS. 12 and 13, may fill the resulting shallow cavity underneath the elevation, wherein an erroneous short circuit caused by incorrect positioning of the module (or current sensor 100) during soldering onto a PCB (PCB=printed circuit board) or caused by inadvertent solder bridges can be avoided.

Furthermore, the current sensor 100 shown in FIG. 3 could be enhanced for sensing up to n currents 106_1 to 106__n applied to n terminal areas 102_1 to 102__n, wherein the n terminal areas 102_1 to 102__n may be arranged with (360°/n) symmetry.

Figure 4:
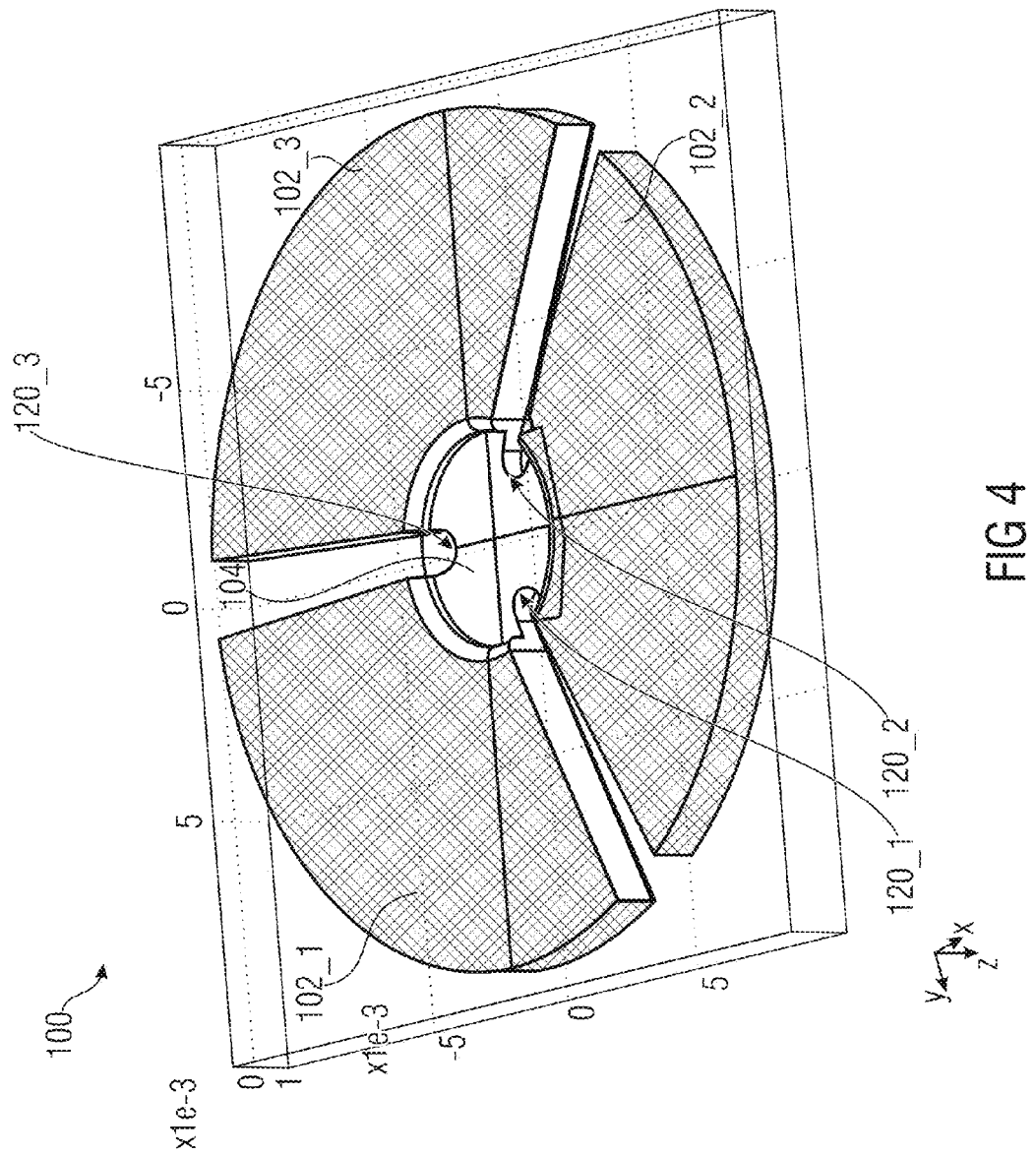
FIG. 4 shows an illustrative bottom-view of the conductive element or current rail shown in FIG. 3.

FIG. 4 shows an illustrative bottom-view of the conductive element or current rail shown in FIG. 3. The three terminal areas 102_1 to 102_3 have a thickness of 1 mm (or between 0.2 mm and 2 mm, or between 0.6 mm and 1.4 mm). The center cleavage (or elevation, or common conductive area 114) protrudes 0.5 mm (or between 0.1 mm and 1 mm, or between 0.3 mm and 0.7 mm) from the contact (or terminal area 102_1 to 102_3) surface (=half shear), wherein the radius of curvature of the rounded tips 120_1 to 120_3 is equal to 0.5 mm (or between 0.1 mm to 1 mm, or between 0.3 mm to 0.7 mm). In some embodiments, each of the three terminal areas 102_1 to 102_3 is a (electrical) contact, wherein only the top and/or bottom surface of the respective terminal area 102_1 to 102_3 might be a true (electrical) area of contact with the surroundings, such as with a conductor. Thus, the (electrical) area of contact can be defined as the area of the respective terminal area 102_1 to 102_3 that which is covered with solder for contacting the conductor that is used as current input or output. For example, the surface (bottom side) of each of the three terminal areas 102_1 to 102_3 shown in FIG. 4 may be a contact area. Alternatively, the surface (top side) of each of the three terminal areas 102_1 to 102_3 shown in FIG. 3 may be a contact area.

Figure 5:
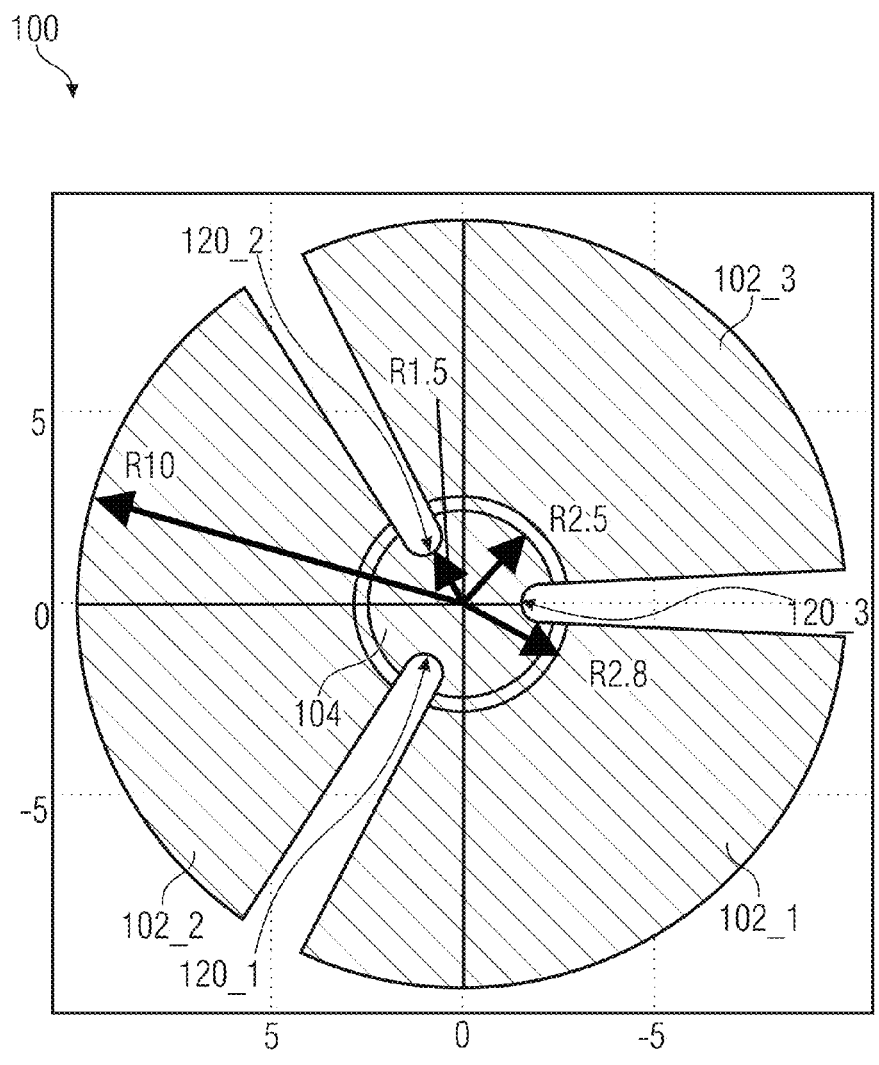
FIG. 5 shows an illustrative plan view of the conductive element or current rail of the exemplary embodiment of the current sensor.

FIG. 5 shows an illustrative plan view of the conductive element or current rail of the exemplary embodiment of the current sensor 100, wherein the dimensions of the radii are given in millimeters. The radius of curvature of the rounded tips 120_1 to 120_3 is, as mentioned above, equal to 0.5 mm (or between 0.1 mm to 1 mm, or between 0.3 mm to 0.7 mm). Furthermore, a circle of 3 mm (or between 1 mm and 6 mm, or between 2 mm and 4 mm) diameter can be inscribed within the tips 120_1 to 120_3. Each contact (or terminal area 102_1 to 102_3) has a size of a 86.3 $mm^2$ (or between 20 $mm^2$ to 160 $mm^2$, or between 50 $mm^2$ to 120 $mm^2$), which can be apt for about 1,700 A homogenous current, if soldered. If the Hall-plates 108_1 to 108_3 are placed in the corners of one edge and in the center of the opposite edge 100 μm distal to the sawing edge, then a silicon die, described later on in FIG. 14, may have an area of 2.4 mm×2.9 mm (or between 0.8 mm×0.8 mm and 5 mm and 5 mm, or between 2 mm×2 mm and 4 mm×4 mm) which is equal to an area of 7 $mm^2$.

In some embodiments, the inner connecting piece of the conductor (or conductive element) that implements the electrical node (or common conductive area 104), may be smaller than the region spanned by the three magnetic field sensors 108_1 to 108_3. In conventional CMOS technology with a feature size of 0.35 µm, a circuit that measures and amplifies the magnetic fields of the three magnetic field sensors 108_1 to 108_3 and that calculates the current distribution therefrom may require a silicon (or silicon die) area of 5 mm² to 8 mm², so that the inner connecting node (or common conductive area 104) of the three terminal areas 102_1 to 102_3 may be smaller than 5 mm² to 8 mm².

Furthermore, the exterior diameter of the conductive element or current rail may be determined by the requirements of the maximum admissible current density. Typically, a soldered contact point may permanently support 20 A to 30 A per mm². Thus, for a 500 A current sensor 100 each contact or terminal area 102_1 to 102_3 has to provide a solderable area of approximately 20 mm².

Figure 6:
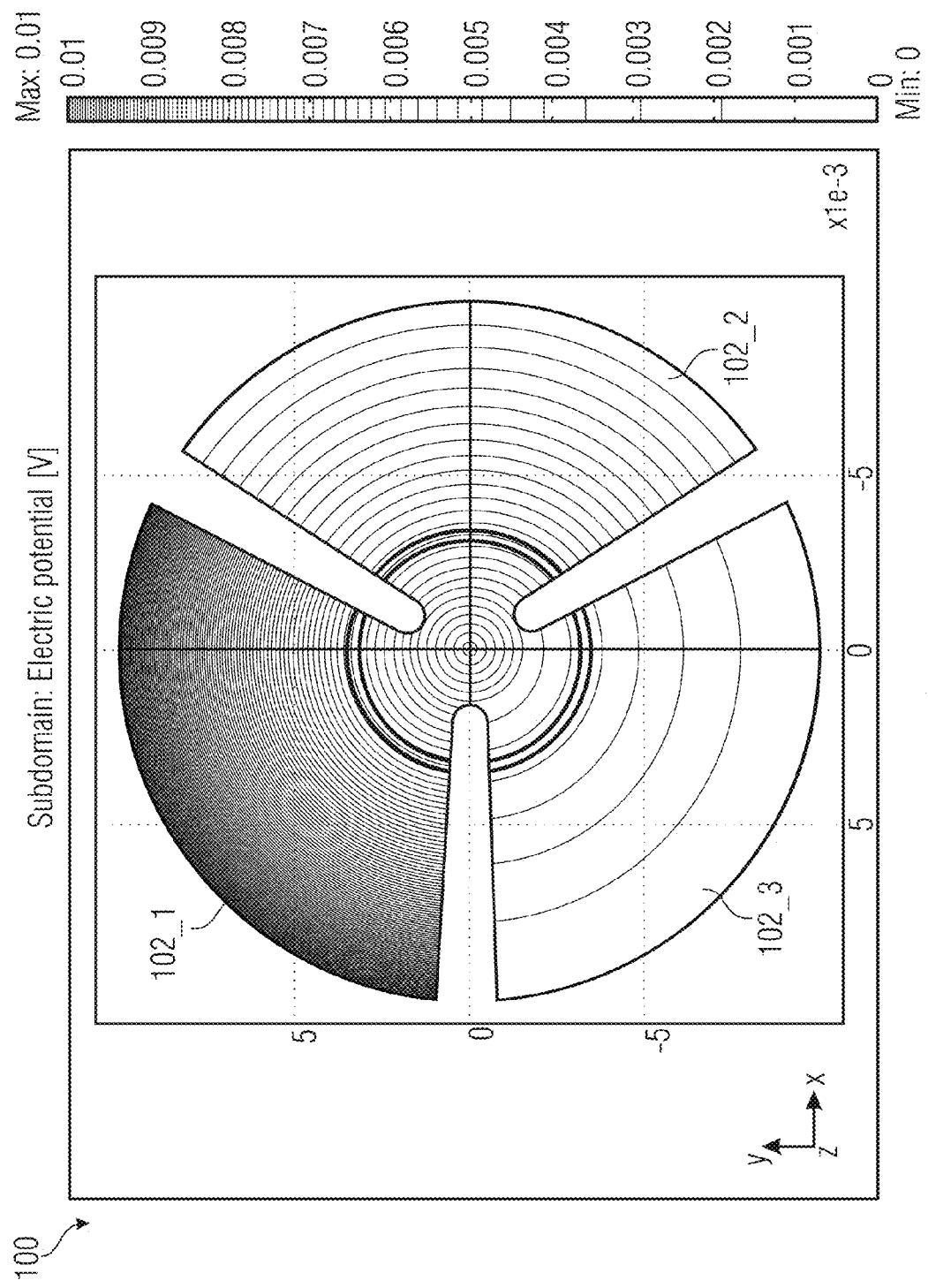
FIG. 6 shows an illustrative view of an electric potential distribution over the conductive element of the exemplary embodiment of the current sensor, for a voltage applied to two adjacent terminal areas.

FIG. 6 shows an illustrative view of an electric potential distribution over the conductive element of the exemplary embodiment of the current sensor for a voltage of 10 mV applied to two adjacent terminal areas 102_1 and 102_3. Applying 10 mV (or between 1 mV and 500 mV) to the perimeter of two terminal areas 102_1 and 102_3 provides a larger resistance than if the contacts (or three terminal areas 108_1 to 108_3) were soldered to massive current rails. However, in DCB modules (DCB=direct copper bond)—as are used for inverters and similar power circuits—the traces are only 0.2 mm to 0.3 mm, which is notably thinner than the contacts (or three terminal areas 102_1 to 102_3) of the current sensor 100. Thus, the current flows mainly laterally in the contacts (or three terminal areas 102_1 to 102_3), which is approximated by the method of contacting the perimeter. If the electric conductivity of the conductive element of the current sensor 100 is assumed to be $43 \ast 10^6$ S/m (as for non-magnetic copper grade for leadframes), then the resistance is equal to 68 µOhm (at room temperature).

FIG. 7 shows an illustrative view of a distribution of a total current density across the conductive element of the exemplary embodiment of the current sensor 100 for 146 A (or between 50 A and 300 A, or between 100 A and 200 A) applied to one terminal area 102_1 or 102_3 and flowing between two terminal areas 102_1 and 102_3. As depicted in FIG. 7, the current of 146 A can be applied to a first terminal area 102_1, wherein the current flows from the first terminal area 102_1 into the third terminal area 102_3, so that the current applied to the third terminal area 102_3 can amount to −146 A, or vice versa. Further, the current in the second terminal area 102_2, or applied to the second terminal area 102_2, may amount to 0 A. Therefore, the second terminal area 102_2 may be open ended.

FIG. 7 exemplarily shows that a current applied to the first terminal area 102_1 flows from the first terminal area 102_1 into the common conductive area 104 and then into the third terminal area 102_3, wherein the magnitude of the current density is increased at the tip 120_3 between the first and third terminal area 102_1 and 102_3. The magnitude of the current density is also slightly enhanced at the tips 120_1 and 120_2 between the terminal areas 102_1 and 102_2, and between the terminal areas 102_2 and 102_3.

Figure 8A:
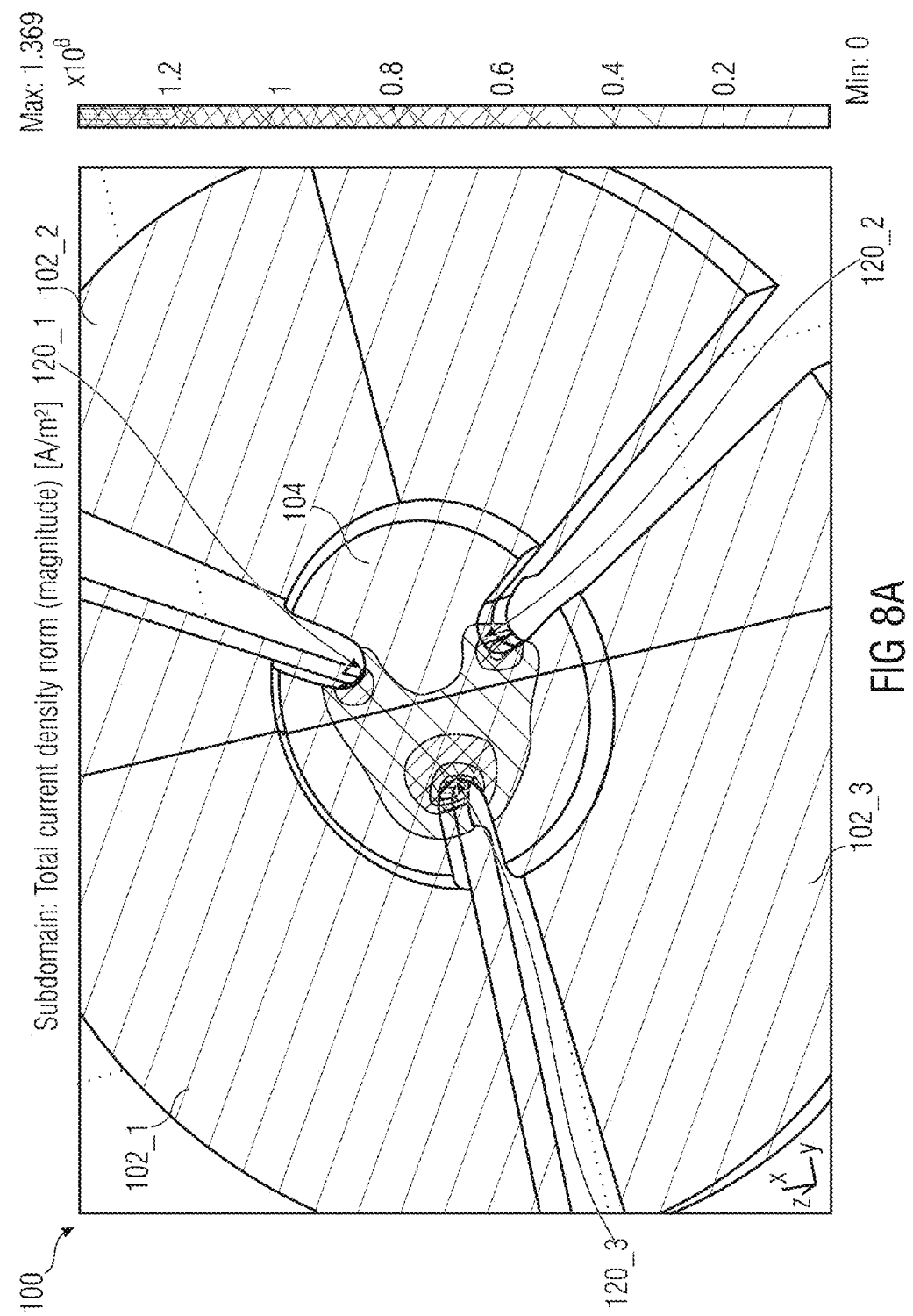
FIGS. 8A and 8B show illustrative views of a distribution of a magnitude of a current density across the conductive element of the exemplary embodiment of the current sensor for a current applied to one terminal area and flowing between two terminal areas.
Figure 8B:
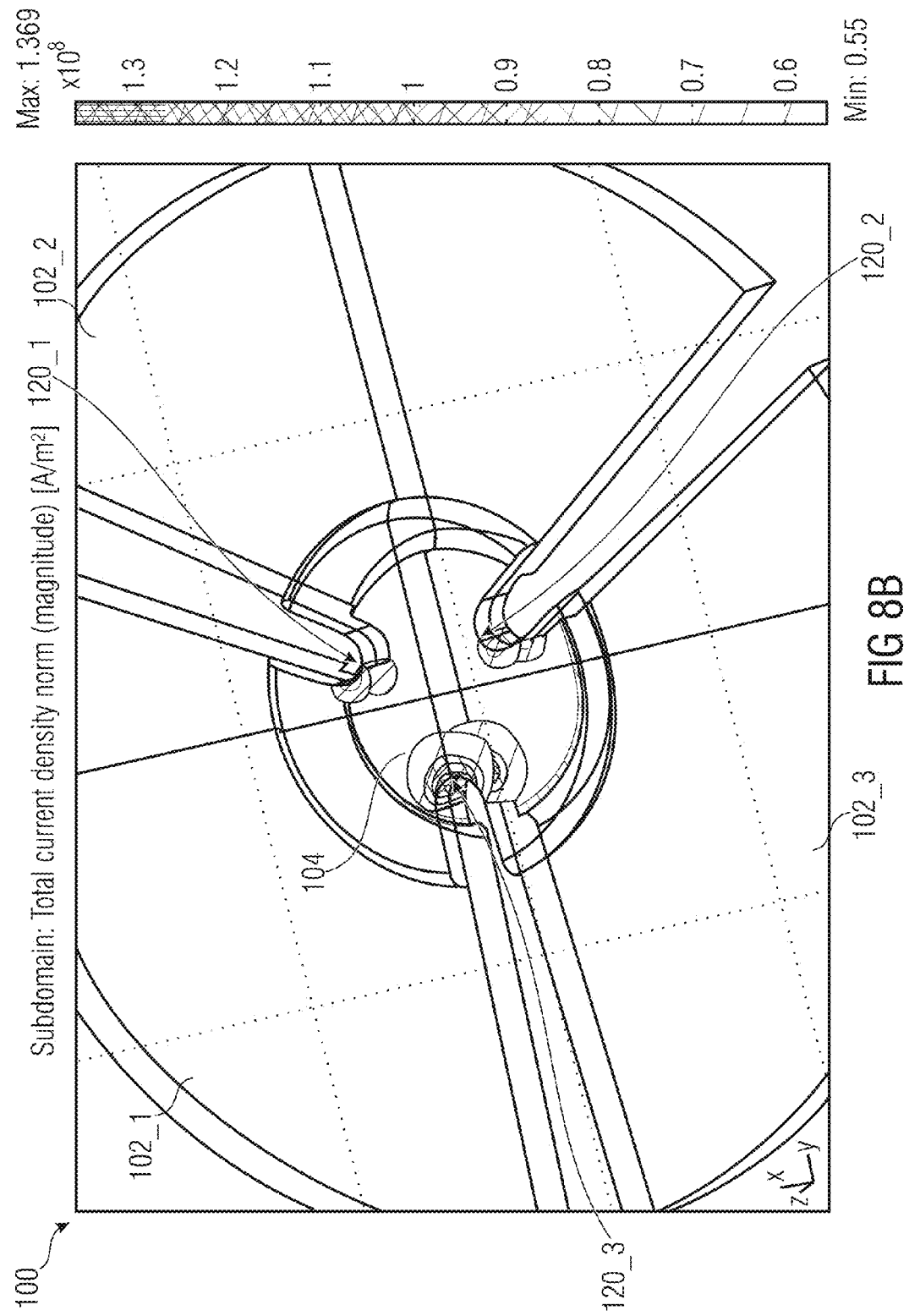

FIGS. 8a and 8b show an illustrative view of a distribution of a magnitude of a current density across the conductive element of the exemplary embodiment of the current sensor 100 for 146 A applied to one terminal area 102_1 or 102_3 and flowing between two terminal areas 102_1 and 102_3. As shown, the magnitude of the current density is enhanced at the tips 120_1 to 120_3 between the three terminal areas 102_1 to 102_3, wherein the magnitude of the current density has a local maximum at the tip 120_3 between the two terminal areas 102_1 and 102_3, that are used as current input and output. Enhancement of the magnitude of the current density is 0.55 over 1.369, which is a factor of 2.49. Hence, the three magnetic field sensors may be placed at or adjacent to the tips 120_1 to 120_3, where the z-component of the magnetic field caused by the enhanced current density is maximized or within a range having at least 50% or 80% of the maximum magnetic field strength.

FIG. 9 shows an illustrative view of a thermal profile over the conductive element of the exemplary embodiment of the current sensor 100 for 146 A applied to one terminal area 102_1 or 102_3 and flowing between two terminal areas 102_1 and 102_3. This may lead to 1.03° C. excess temperature at 1.465905 W dissipation, which in turn leads to a thermal resistance of 0.703° C./W. In FIG. 9, the perimeter of the conductive element of the current sensor 100 is clamped to 0° C. Further, assuming that $T_J$ (junction temperature) stays below 150° C. and that a customer may provide enough cooling to keep the perimeter of the contacts (or three terminal areas 102_1 to 102_3) at 100° C., the maximum allowed dissipation is 71 W, which corresponds to a current of 834 A.

FIG. 10 shows an illustrative view of a distribution of a z-component of a magnetic flux density 0.1 mm above the conductive element of the exemplary embodiment of the current sensor 100 for 146 A applied to one terminal area 102_1 or 102_3 and flowing between two terminal areas 102_1 and 102_3. The maximum amplitude of the z-component of the magnetic flux density amounts to 17.6 mT at the tip 120_2 between the second and third terminal area 102_2 and 102_3, wherein the minimum amplitude of the z-component of the magnetic flux density amounts to −30.4 mT at the tip 120_3 between the first and third terminal area 102_1 and 102_3. Assuming an ideal current sensor 100, the absolute value of the amplitude of the z-component of the magnetic flux density at the tip 120_3 between the terminal areas 102_1 and 102_3, that are used as current input and output, can be higher by a factor of two than the absolute value of the amplitude of the z-component of the magnetic flux density at the tips 120_1 and 120_2 due to symmetry, which leads to an absolute value of 200 µT/A and 100 µT/A, respectively. In other words, FIG. 10 shows that the z-component of the magnetic flux density is maximized near the corner of the slot (or tip 120_3), which is between the two contacts (or terminal areas 102_1 and 102_3) that are used as current 106_1 and 106_3 input and output. Thus, a third Hall-plate 108_3 can be placed at the tip 120_3 or adjacent to the tip 120_3, wherein a first and a second Hall-plate 108_1 and 108_2 can be placed at the tips 120_1 and 120_2, respectively.

Figure 11A:
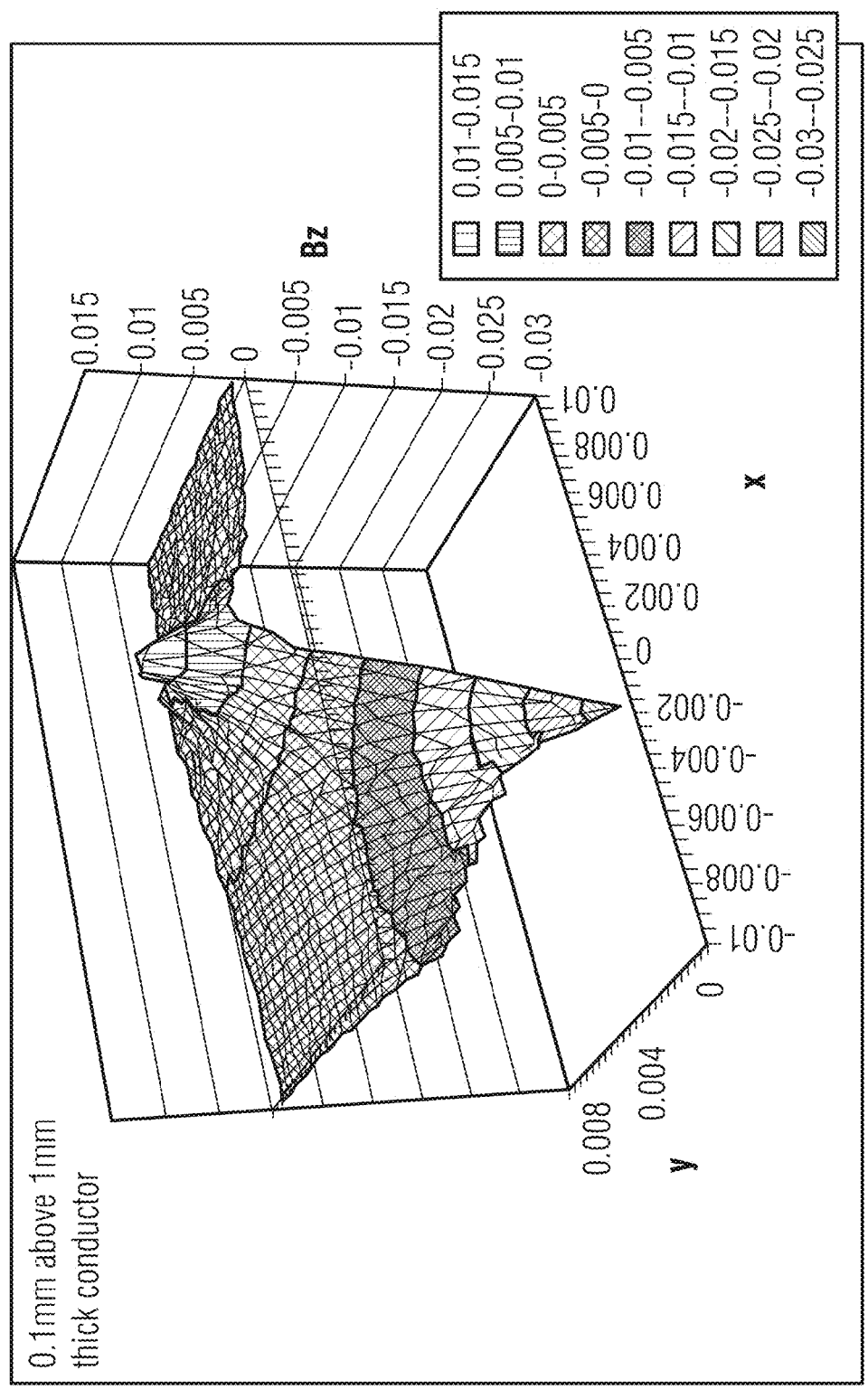
Figure 11B:
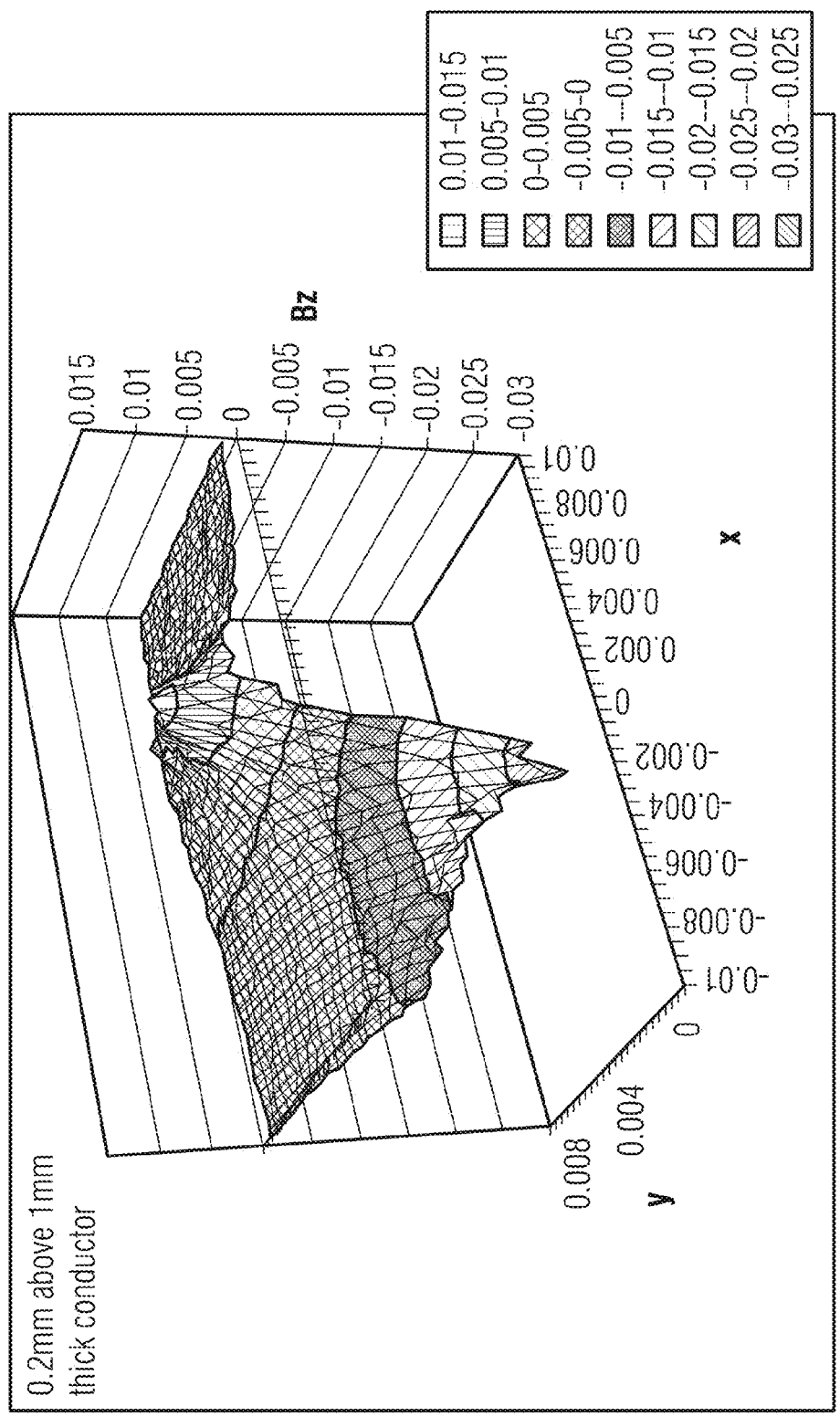
Figure 11C:
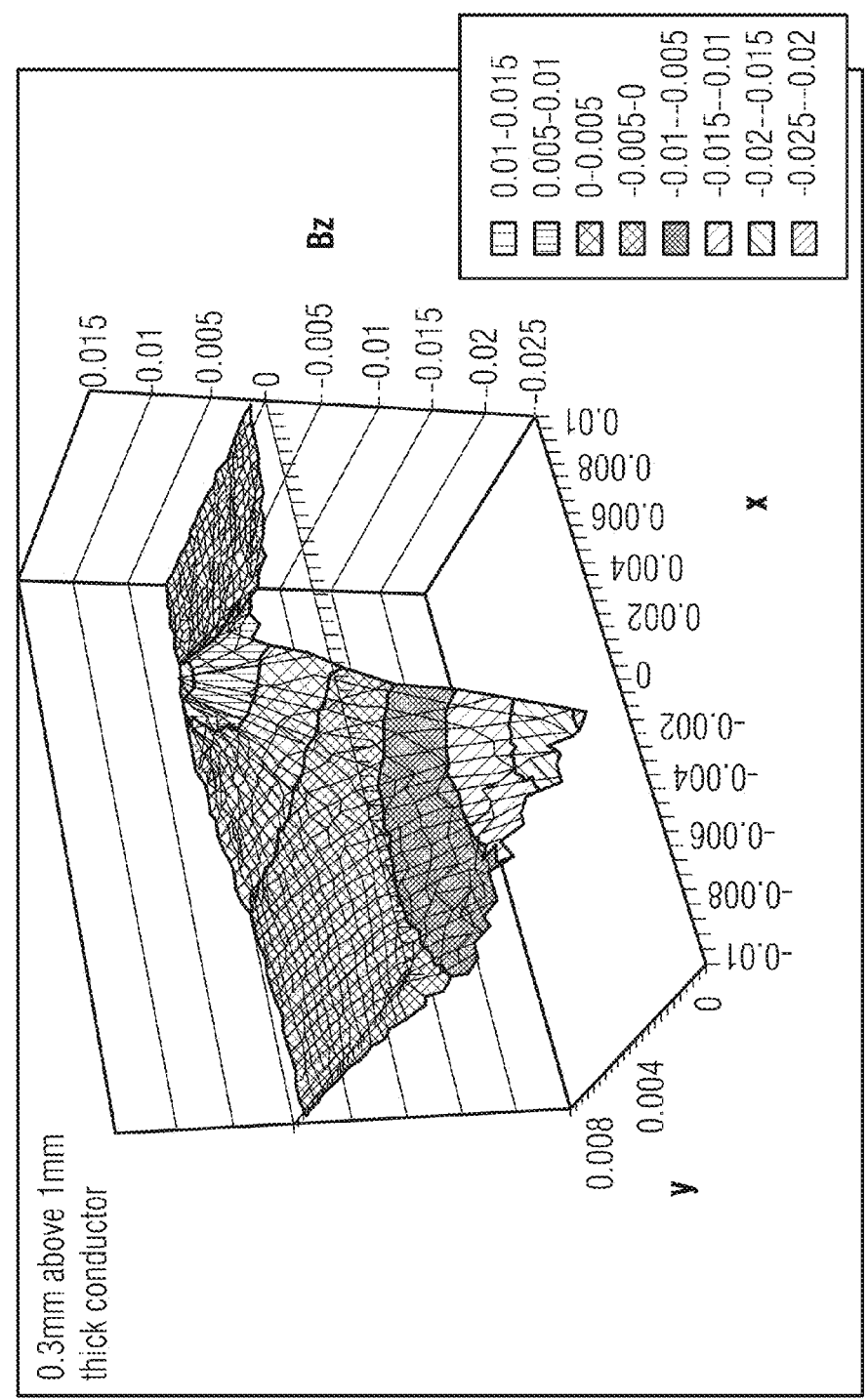

FIGS. 11a to 11d show in an illustrative view intensity profiles of the z-component of the magnetic field 0.1 mm, 0.2 mm, 0.3 mm and 0.4 mm above the conductive element of the exemplary embodiment of the current sensor for 146 A applied to one terminal area 102_1 or 102_3 and flowing between two terminal areas 102_1 and 102_3. The peak amplitude of the magnetic field does not severely degrade, if the distance of the magnetic field sensors 108_1 to 108_3 increases from 0.1 mm to 0.2 mm or even to 0.3 mm above the conductor (or conductive element), as shown in FIGS. 11a to 11c. Therefore, it is possible to put a thin isolation platelet, for example, between silicon die 140 and the conductor (or conductive element, or common conductive area 104). The reason for the mild decline of the (magnetic) field versus vertical distance is the relatively thick conductor (or conductive element), that has a thickness of 1 mm, as mentioned above. FIG.

11d further shows the intensity profile of the z-component of the magnetic field for 0.4 mm above the conductive element.

Assuming that the Hall-plates are 0.2 mm above the conductor (e.g. 60 µm die thickness+10 µm solder thickness+2.5 µm metal thickness+115 µm isolation platelet thickness+2.5 µm metal thickness+10 µm solder thickness) the magnetic field is about −24 mT and +12 mT. Then the signal for each current 106_1 to 106_3 is about 36 mT at 145 A. If the zero-point error of each Hall-probe is 50 µT, two Hall-probes have (a zero-point error of) sqrt(2)*50 µT, which corresponds to 285 mA. This is 0.034% of 834 A, which is a dynamic range of 69 dB. The strongest field at 834 A is about 140 mT. There the intrinsic nonlinearity of silicon Hall-plates is about (0.14× 0.14)$^2$=0.04% (=µ$^2$*B$^2$=square of tangent of Hall angle). Thus, the Hall-effect is still reasonably linear for these field strengths.

Figure 12:
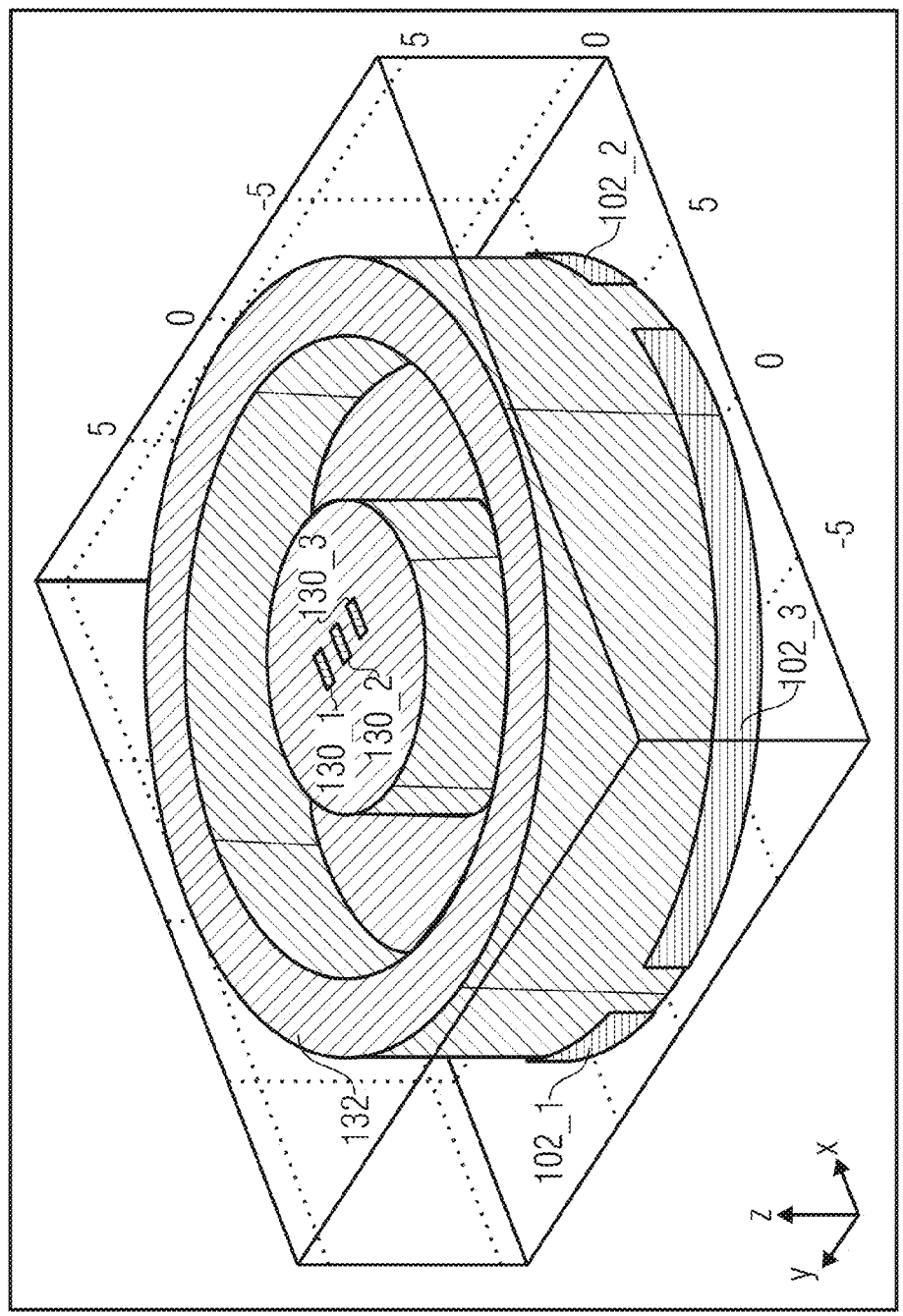
FIG. 12 shows an illustrative perspective view onto the top of an exemplary embodiment of a fully packaged current sensor.

FIG. 12 shows an illustrative perspective view onto the top of an exemplary embodiment of a fully packaged current sensor 100. The current sensor 100 or CLMCS-node comprising the common conductive area 104 and the three terminal areas 102_1 to 102_3 may be packaged with a mould compound 132, wherein the three Hall-plates 108_1 to 108_3, or an integrated circuit comprising the three Hall-plates 108_1 to 108_3, can be contacted via three signal leads 130_1 to 130_3. The three signal leads 130_1 to 130_3 may be used to supply the three magnetic field sensors 108_1 to 108_3 with electric energy. Additionally, they may be used for communication purposes and for providing the sensor signals. Furthermore, the mould compound 132 shown in FIG. 12 has a profile that may increase a creepage distance between signal leads 130_1 to 130_3 and current rail (or conductive element).

Figure 13:
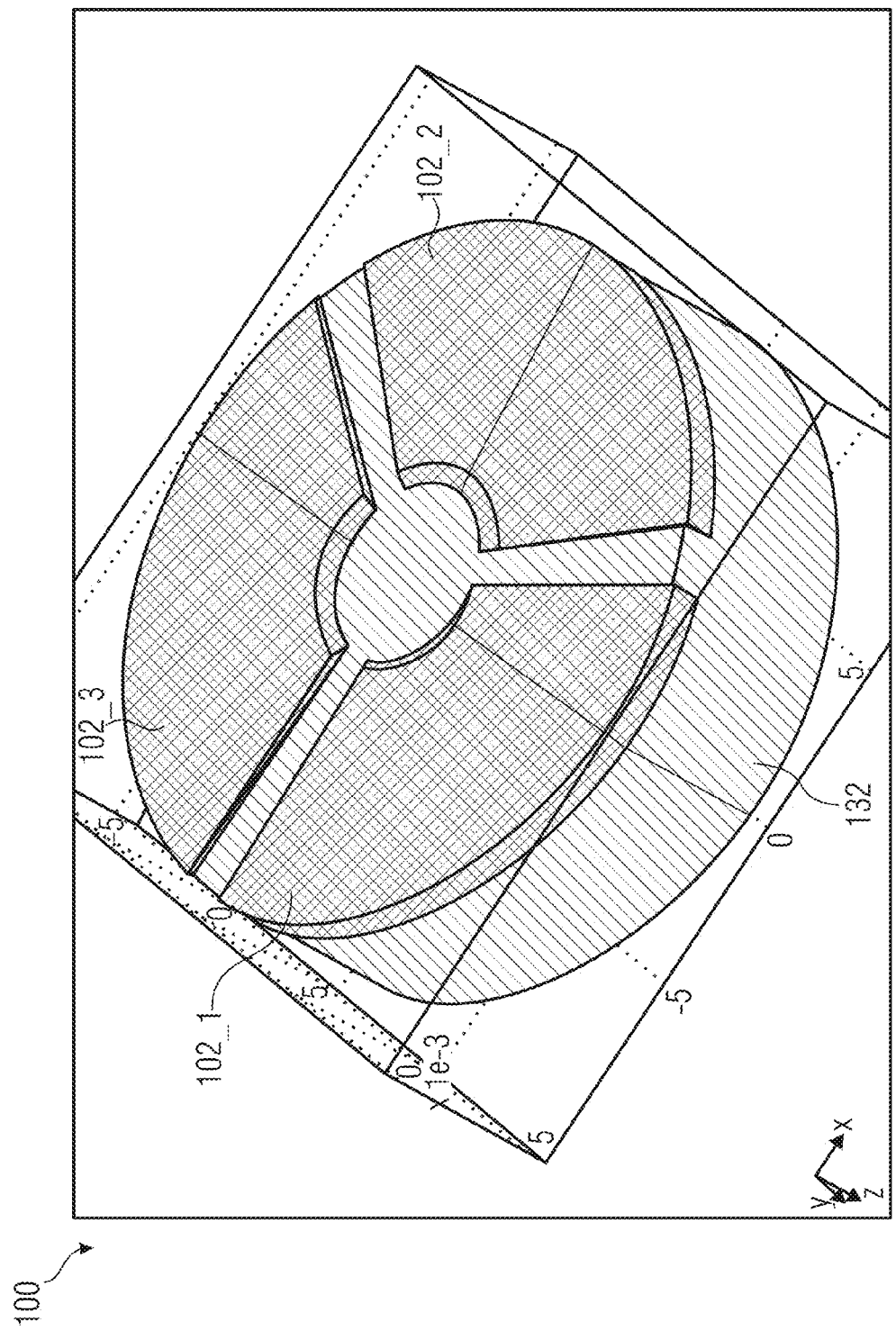
FIG. 13 shows an illustrative bottom-view of the embodiment of the fully packaged current sensor of FIG. 12.

FIG. 13 shows an illustrative bottom-view of the embodiment of the fully packaged current sensor 100 of FIG. 12. The contacts (or three terminal areas 102_1 to 102_3) are separated by the mould compound 132 to reduce the hazard of shorts when the contacts are soldered, for example, to a DCB-board. To ensure good contact the contacts (or three terminal areas 102_1 to 102_3) may protrude about 0.2 mm (or between 0.05 mm and 0.5 mm, or between 0.1 mm and 0.3 mm) from the mould (compound) 132.

Figure 14:
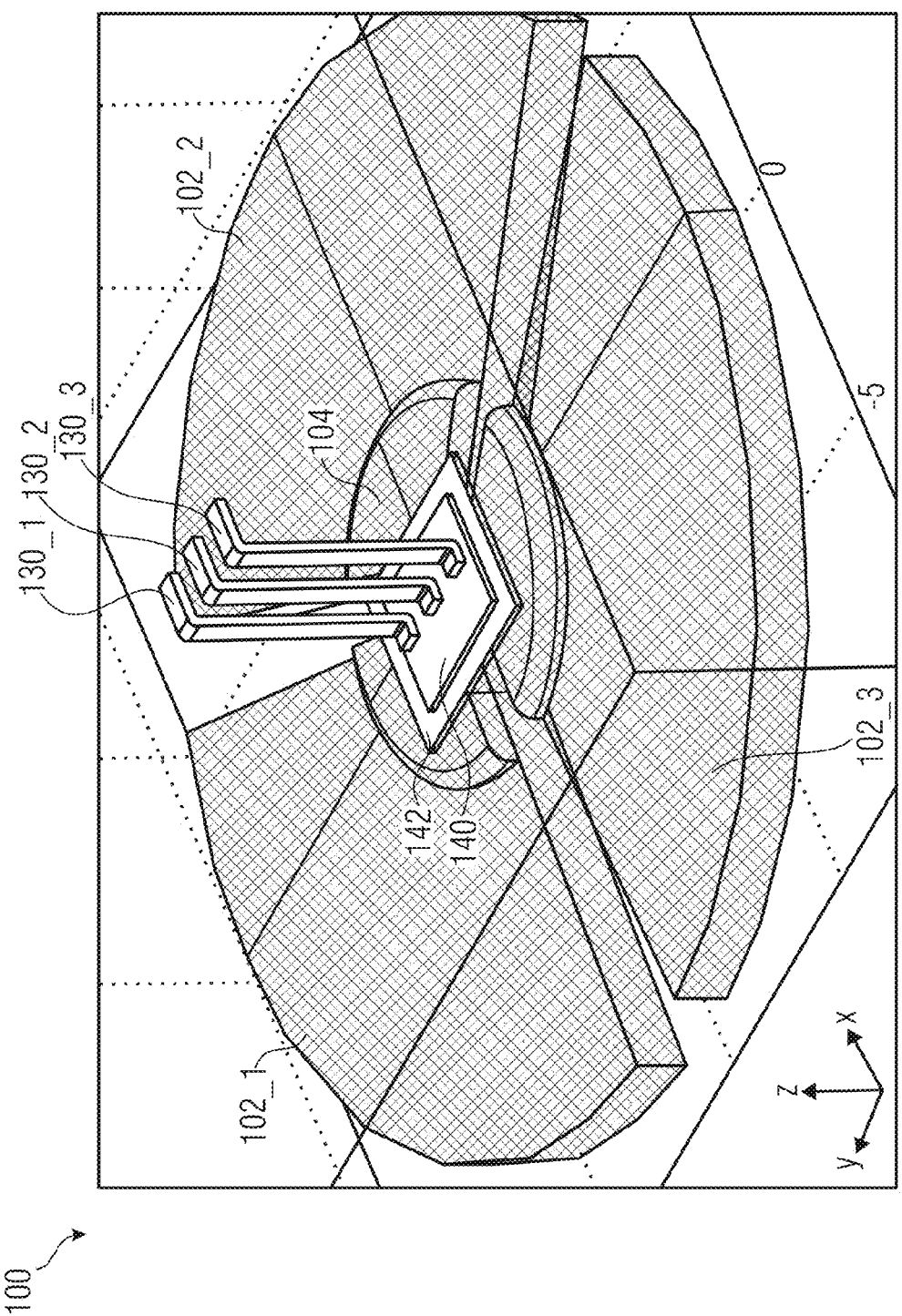
FIG. 14 shows an illustrative view of the exemplary embodiment of the current sensor of FIG. 12 without the mould compound.

FIG. 14 shows an illustrative view of the exemplary embodiment of the current sensor 100 of FIG. 12 without the mould compound 132. The current sensor 100 may comprise a silicon die 140, that is isolated from the common conductive area 104 by an isolation platelet 142. The integrated circuit 140 may comprise the three Hall-plates 108_1 to 108_3, wherein the integrated circuit can be connected via the three signal leads 130_1 to 130_3.

According to FIG. 14, all three sensor elements (or Hall-plates 108_1 to 108_3) may be mounted on a single semiconductor die 140. The isolation platelet 142 can be some kind of electrical isolation like glass, porcelain, ceramic, or some polyimide like Kapton. It is also possible to use three discrete sensor elements (or magnetic field sensors 108_1 to 108_3), for example, within a special package, directly on a PCB or on conducting material in a discrete build setup, and to then combine their outputs later on a printed circuit board, in a µC (µC=microcontroller), DSP, FPGA or an other computation solution.

In some embodiments, each of the three magnetic field sensors 108_1 to 108_3 may comprise a sensor lead 130_1 to 130_3. Thereby, the conductive element may be arranged geometrically in a first plane, wherein the sensor leads 130_1 to 130_3 of the three magnetic field sensors 108_1 to 108_3 may be arranged geometrically in a second plane, wherein the first plane and the second plane are adjacent and isolated from each other, wherein the isolation may be adapted to provide a breakdown voltage of at least 400 V (for example, due to material parameters or forming).

Furthermore, the three magnetic field sensors 108_1 to 108_3 may be located on the bottom chip side (=the side, that is closer to the isolation platelet 142), whereby they are closer to the conductive element. If all circuit elements and also the terminal pads (or signal pins) are located on the bottom chip side, then the isolation platelet 142 may support on the top side thin conductive traces contacting the terminal pads (or signal pins) and having a thickness between 1 µm to 10 µm and, for example, about 5 µm. In this case, the isolation platelet 142 may stand out beyond the chip at least at one side, where the thin conductive traces come out. The three signal leads 130_1 to 130_3 may then be attached to the conductive traces on the isolation platelet 142.

Moreover, the isolation platelet 142 may consist completely of insulating material. Additionally, the isolation platelet 142 may comprise a conductive support material on which on one side a thin insulating film may be disposed.

When the insulating film is located on the top side of the isolation platelet 142, the silicon chip (or silicon die 140) may be smaller than the isolation platelet 142 and on all sides have a minimum distance to the edge of the isolation platelet 142. The elevation of the conductive element may be smaller or greater than the isolation platelet 142, wherein the latter is shown in FIG. 14.

Alternatively, if the insulating film is located on the bottom side of the isolation platelet 142, the elevation of the conductive element may be sufficiently smaller than the isolation platelet 142, so that there might be on all sides a minimum distance between conductive element and the edge of the isolation platelet 142. The silicon chip (or silicon die 140) may be smaller or greater than the isolation platelet 142, wherein in the latter it has to be guaranteed by the height of the profile of the conductive element that a vertical distance between conductive element and chip (or silicon die 140) may be sufficiently large to achieve a sufficiently high breakdown voltage.

Figure 15:
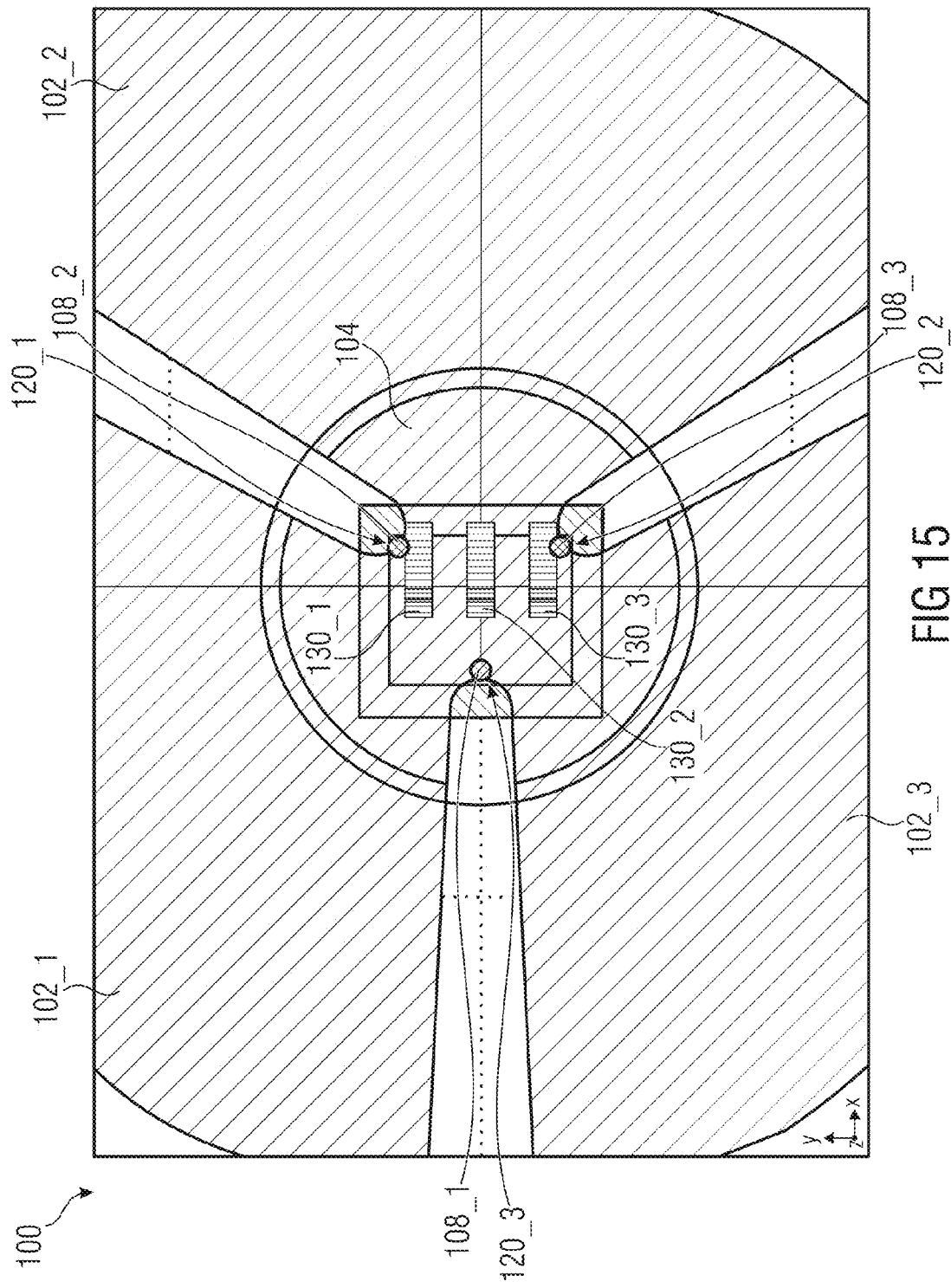
FIG. 15 shows an illustrative plan view of the exemplary embodiment of the current sensor with the isolated silicon die of FIG. 14.

FIG. 15 shows an illustrative plan view of the exemplary embodiment of the current sensor 100 with the isolated silicon die 140. The silicon die 140 and the isolation platelet 142 are transparent to provide a view to the magnetic field sensor elements (or Hall-plates 108_1 to 108_3) and their location (or arrangement) with respect to the slots. As shown in FIG. 15, each of the three Hall-plates 108_1 to 108_3 is arranged between two adjacent terminal areas 102_1 to 102_3, or in other words, at the corresponding tips 120_1 to 120_3.

Figure 16:
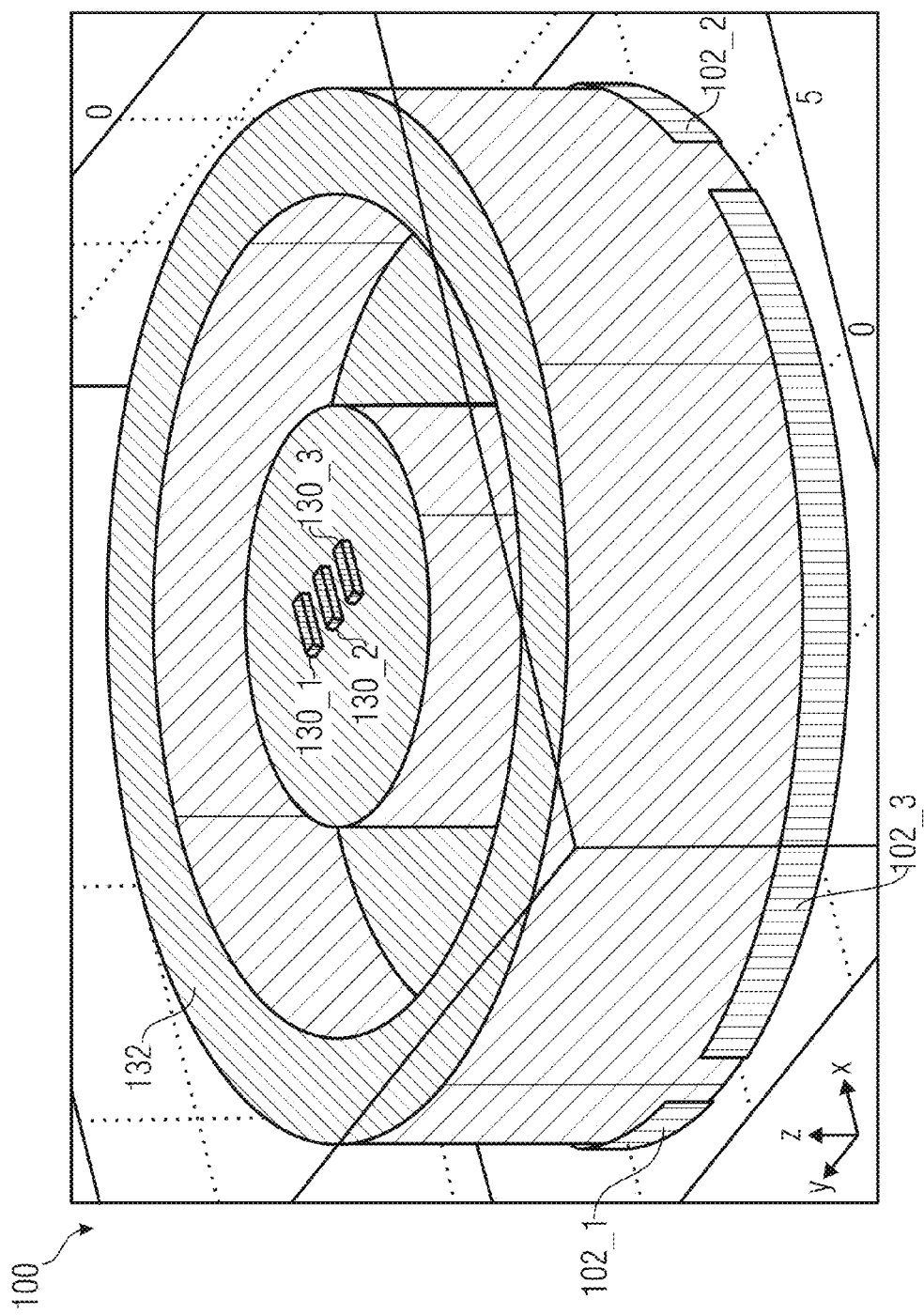
FIG. 16 shows an illustrative view of an alternative embodiment of a fully packaged current sensor and signal leads with protruding signal pins.

FIG. 16 shows an illustrative view of an alternative embodiment of a fully packaged current sensor with signal leads 130_1 to 130_3 and protruding signal pins. Signal pins protruding from the top mould surface 132 of the current sensor 100 may be easier to manufacture.

Figure 17:
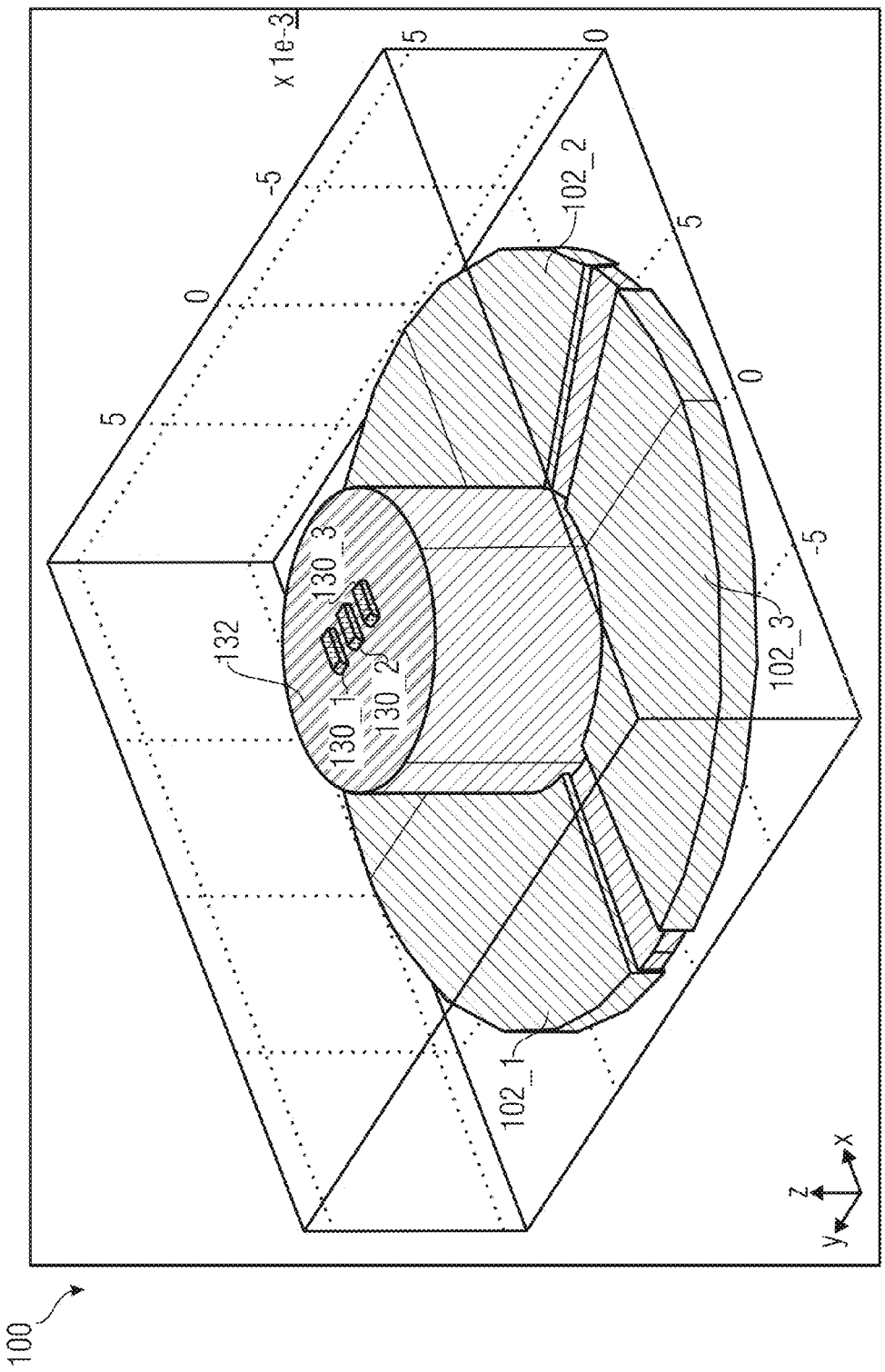
FIG. 17 shows an illustrative view of an optional embodiment of a fully packaged current sensor with three terminal areas, which are accessible from top.

FIG. 17 shows an illustrative view of an optional embodiment of a fully packaged current sensor 100, with three terminal areas 102_1 to 102_3, which are accessible from top. If the contacts (or three terminal areas 102_1 to 102_3) are to be welded, for example, ultrasonically to a trace on a DCB-module (DCB=direct copper bond) or to a massive busbar, it is necessary that the contacts (or three terminal areas 102_1 to 102_3) are accessible from the top, so that the welding nozzle can exert vertical force onto it. A package for this option is shown in FIG. 17. Furthermore, the three terminal areas 102_1 to 102_3 may be in an area outside of the common conductive area 104 isolated from each other by the mould compound 132.

Further, the height of the package may be scaled according to isolation requirements. It is also possible that the signal leads 130_1 to 130_3 extend into a vertical direction above the top mould surface in order to get a through-hole device. Then a printed-circuit board (PCB) could be used to make the electrical connection between the CLMCS-node-sensor (or current sensor 100) and the rest of the system, such as a motor control system.

In the following, an exemplary embodiment of a sensor signal processing is described taking reference to FIG. 18, wherein the evaluator of the current sensor 100 can be adapted to execute the described sensor signal processing. Naturally, the following description is also applicable to other embodiments of the current sensor 100.

The three Hall plates 108_1 to 108_3 are labeled in the following description of the sensor signal processing with H1, H2 and H3, and the contacts (or three terminal areas 102_1 to 102_3) are labeled with C1, C2 and C3. Thereby, the Hall-plate H1 is arranged between the contacts C1 and C2, the Hall-plate H2 is arranged between the contacts C2 and C3, and the Hall-plate H3 is arranged between the contacts C3 and C1. Strictly speaking, the Hall-plate H1 is above the end of the slot, which is between the contacts C1 and C2, and so on. The currents 106_1 to 106_3 are labeled likewise, wherein the current I1 flows into the contact C1, the current I2 flows into the contact C2, and the current I3 flows into the contact C3.

It may hold:

$$I1+I2+I3=0. \quad (1)$$

$$K11*I1+K12*I2+K13*I3=B1 \quad (2)$$

$$K21*I1+K22*I2+K23*I3=B2 \quad (3)$$

$$K31*I1+K32*I2+K33*I3=B3 \quad (4)$$

Wherein B1, B2 and B3 are the magnetic flux densities (vertical component, or z-component) at the corresponding Hall-plates H1, H2 and H3, in the absence of a homogeneous magnetic disturbance B0, and wherein $K_{i,j}$ (i,j: 1 . . . 3) are the coefficients of a K-matrix, wherein the K-matrix might be a calibration matrix of the current sensor 100. If a homogeneous magnetic disturbance B0 is present, the equations (2), (3) and (4) might be extended as follows:

$$K11*I1+K12*I2+K13*I3+B0=B1 \quad (2')$$

$$K21*I1+K22*I2+K23*I3+B0=B2 \quad (3')$$

$$K31*I1+K32*I2+K33*I3+B0=B3 \quad (4')$$

Due to the symmetry of the system (or current sensor 100) the K-matrix only may have three degrees of freedom:

$$\begin{pmatrix} K_{11} & K_{12} & K_{13} \\ K_{13} & K_{11} & K_{12} \\ K_{12} & K_{13} & K_{11} \end{pmatrix} \quad (5)$$

Furthermore, if the three equations (2), (3) and (4) are added and Kirchhoff's circuit law according to equation (1) is observed, it follows:

$$B1+B2+B3=(K11+K12+K13)*(I1+I2+I3)=0 \quad (6)$$

Hence, the sum of all B-fields (or magnetic fields) vanishes. Furthermore, assuming I1=−I2=1 and I3=0 it may hold:

$$B2=B3 => B1+2*B2=0 => B1=-2*B2=-2*B3 => B1=K11-K12 \text{ and } B2=K13-K11 => K11-K12=-2*(K13-K11)$$

This may lead to:

$$-K11-K12+2*K13=0 \quad (7)$$

Therefore, K11 can be replaced by:

$$2*K13-K12 \quad (8)$$

There are many other symmetric modes of operation, yet, they may all lead to equation (8).

The complete set of equations is the four equations (1), (2'), (3') and (4'). The four unknowns are the currents I1, I2 and I3 and the homogeneous magnetic disturbance B0. Hence, there are four equations for four unknowns. With linear algebra this can be solved as follows:

$$I1=(B3-B1)/3/(K12-K13) \quad (9)$$

$$I2=(B1-B2)/3/(K12-K13) \quad (10)$$

$$I3=(B2-B3)/3/(K12-K13) \quad (11)$$

$$B0=(B1+B2+B3)/3 \quad (12)$$

Thus, the CLMCS system (or current sensor 100) can compute all three currents I1, I2 and I3 and the magnetic disturbance $B_0$. It can check if this magnetic disturbance $B_0$ is too large and issue, for example, a warning for emergency shutdown of the system.

Note that equations (9), (10) and (11) may look slightly different if the conductor (or conductive element) is not perfectly symmetric or if the Hall-plates H1, H2 and H3 are not placed perfectly symmetrically above the conductor, for example, as is the case in a package assembly line.

The CLMCS algorithm (or sensor signal processing algorithm) may estimate the magnetic field B1=(h1−o1)/S1, with h1 being the Hall-output signal, o1 being its offset, and S1 its magnetic sensitivity. Furthermore, the magnetic sensitivities of the three Hall plates H1, H2 and H3 may not be exactly equal, so that this may lead to slightly different factors in the computation of the currents I1, I2 and I3 and the homogeneous magnetic disturbance B0. Thus, in a real system it may hold:

$$I1=L11*h1+L12*h2+L13*h3+L14 \quad (13)$$

$$I2=L21*h1+L22*h2+L23*h3+L24 \quad (14)$$

$$I3=L31*h1+L32*h2+L33*h3+L34 \quad (15)$$

$$B0=L41*h1+L42*h2+L43*h3+L44 \quad (16)$$

Wherein $L_{i,j}$ (i,j: 1 . . . 4) are coefficients of a calibration matrix L. The calibration matrix L can be determined, for example, by applying various currents in a test routine and reading out the Hall signals. If all kinds of current distributions are considered, they may be interpreted as a superposition of simple currents between two contacts (or terminal areas 102_1 to 102_3). Since the system is linear, superposition is allowed.

Generally, the current 106_1 to 106_n applied to each terminal area 102_1 to 102_n may be expressed as a linear combination of the magnetic fields acting on all magnetic field sensors 108_1 to 108_m.

Figure 18:
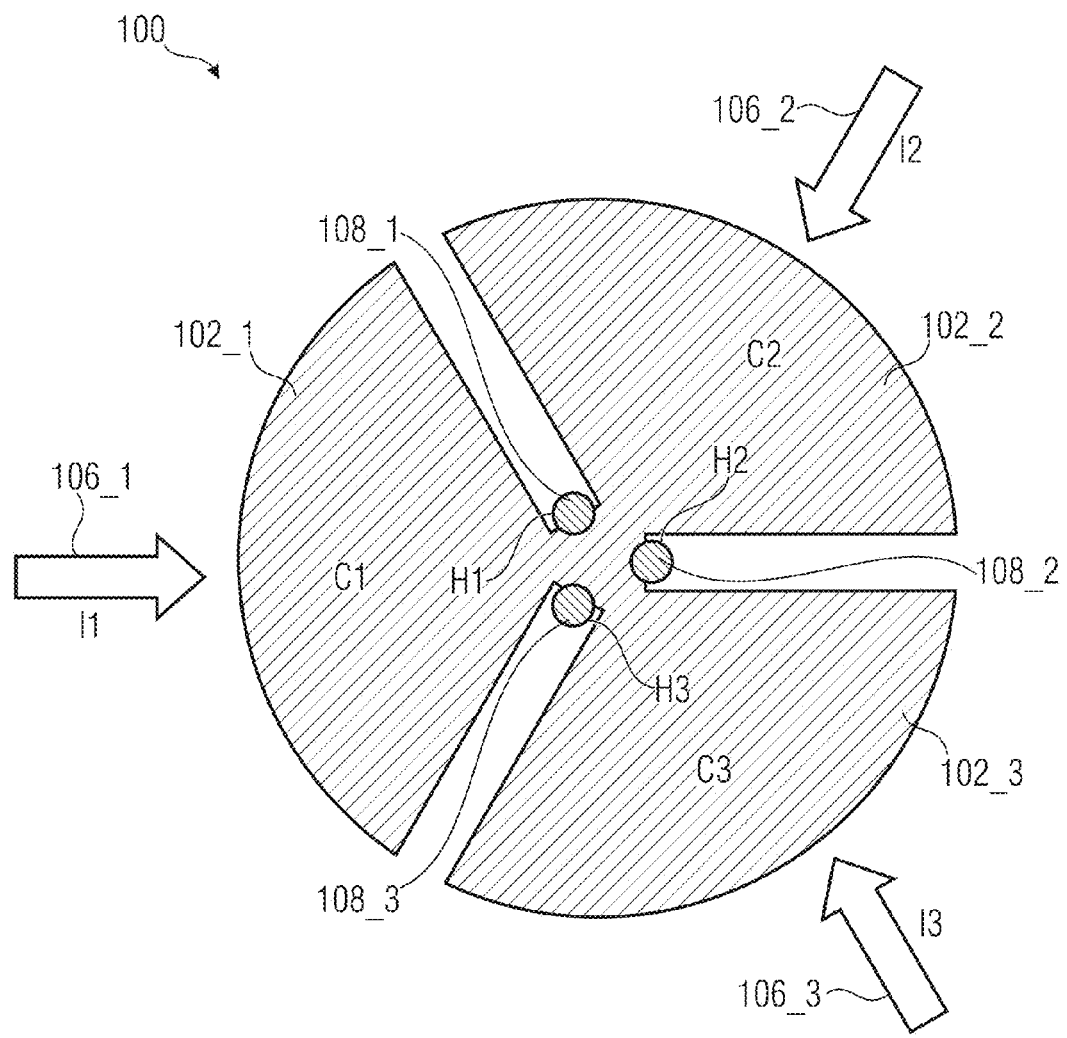
FIG. 18 shows an illustrative view of an embodiment of a current sensor with three terminal areas and three magnetic field sensors.
Figure 19:
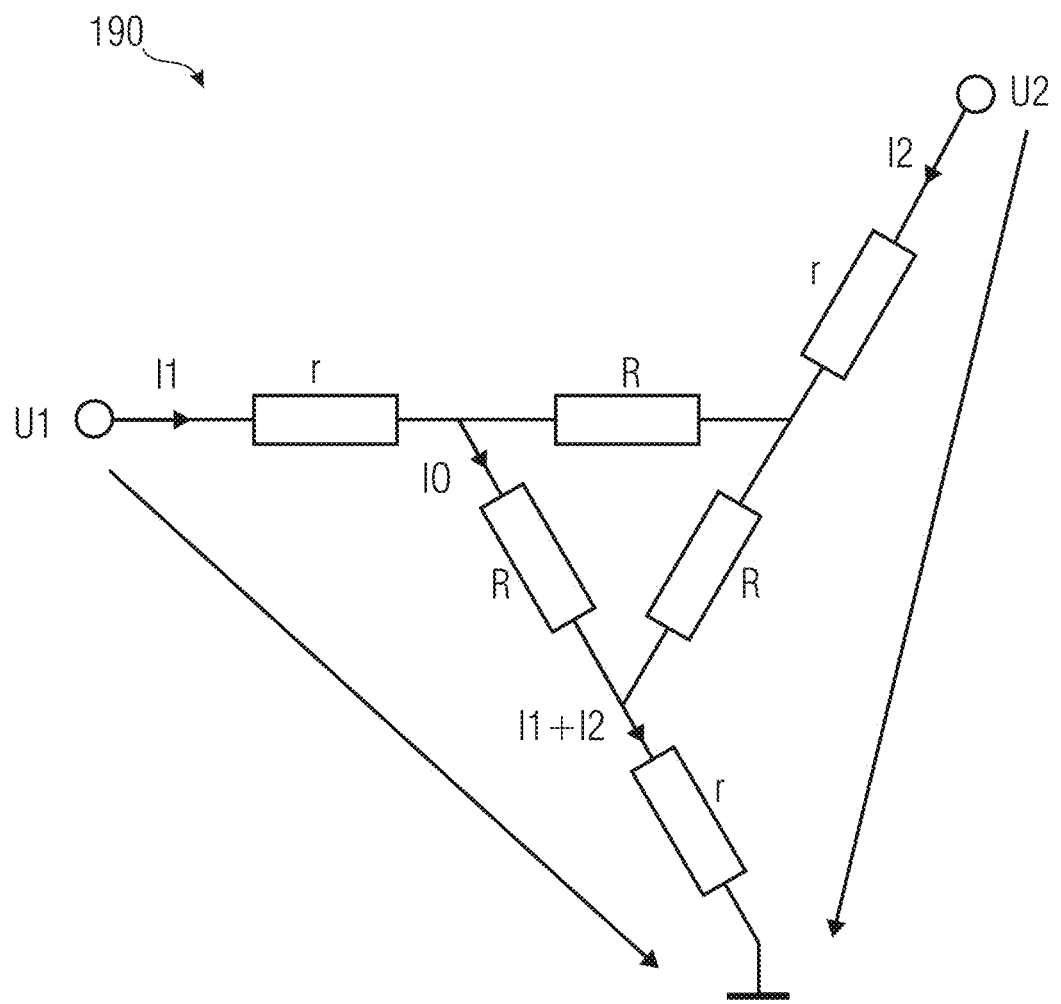
FIG. 19 shows an illustrative view of an embodiment of an equivalent circuit of the conductive element of the current sensor of FIG. 18, wherein the third terminal area is tied to ground.

FIG. 19 shows an illustrative view of an embodiment of an equivalent circuit 190 of the conductive element of the current sensor 100 of FIG. 18, wherein the third terminal area is tied to ground. The equivalent circuit 190 is used in the following for the calculation of the dissipation.

It may hold:

$$I0=2*I1/3+I2/3 \quad (17)$$

$$U1=R*(2*I1+I2)/3+r*(2*I1+I2) \quad (18)$$

$$U2=R*(I1+2*I2)/3+r*(I1+2*I2) \quad (19)$$

$$Ri=U1/I1 \text{ (for } I2=0)=2*(r+R/3) \quad (20)$$

$$Pd=U1*I1+U2*I2=Ri*(I1^2+I2^2+I1*I2) \quad (21)$$

Assuming I2=−I1, it follows $$Pd=Ri*(I1^2+I1^2-I1^2)=Ri*I1^2 \text{ q.e.d.} \quad (22)$$

Alternatively, assuming I1=I2, it may hold:

$$Pd=Ri*3*I1^2 \quad (23)$$

As described above, the CLMCS (or current sensor 100) is allowed to dissipate 71 W, which is equivalent to a current of 834 A from one contact to another contact (or flowing from the first terminal area 102_1 into the second terminal area 102_2), while the third contact (or third terminal area 102_3) is floating. Supposing that equal currents I1 and I2 are flowing into two contacts (or terminal areas 102_1 and 102_2) and the sum of them flows out of the third contact (or third terminal area 102_3), the current rating is sqrt(3) times smaller, which leads to (a current of) 481 A.

The above system is not restricted to planar Hall plates. Every magnetic field sensor 108_1 to 108_3 which is sensitive to the z-component of the magnetic field can be used. In some embodiments the three magnetic field sensors 108_1 to 108_3 are linear, i.e. their output signal doubles if the magnetic field doubles. Moreover, it is possible to use magnetic field sensors 108_1 to 108_3, which are only sensitive to the in-plane component of the magnetic field (this is the field component parallel to the x-y-plane). The three magnetic field sensors 108_1 to 108_3 might then be arranged as described in FIG. 2.

Figure 20:
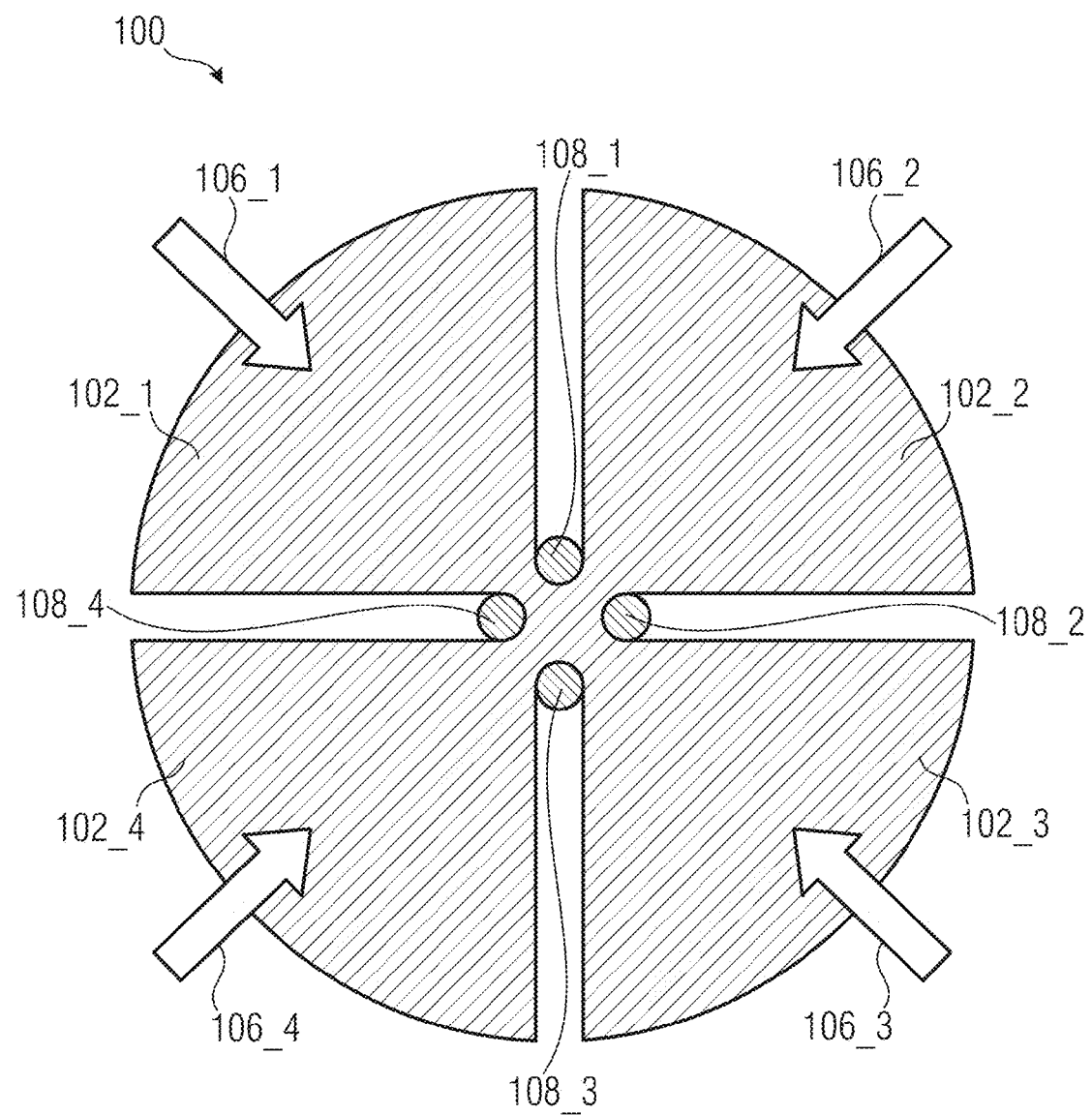
FIG. 20 shows an illustrative view of an embodiment of a current sensor with four terminal areas and four magnetic field sensors.

FIG. 20 shows an illustrative view of an embodiment of a current sensor 100 with four terminal areas 102_1 to 102_4 and four magnetic field sensors 108_1 to 108_4. In other words, FIG. 20 shows a CLMCS-node with four contacts, wherein the conductor (or conductive element) may have the shape of a clover leaf with four leaves, separated from each other by four slots, and magnetic field sensors 108_1 to 108_4 positioned or placed above the end of each slot. With the four signals of the four magnetic field sensors 108_1 to 108_4 (for example, Hall-plates) the four currents 106_1 to 106_4 applied to the corresponding terminal areas 102_1 to 102_4 can be computed. Additionally, a homogeneous background magnetic field can be computed. The current sensor 100 shown in FIG. 20 can be useful in a three-phase power distribution systems with a neutral conductor as a fourth line. To this end, the shape of the conductor (or conductive element) in FIG. 20 could be made asymmetric, so that one contact area (or terminal area) is smaller than the others. This one contact area (or terminal area) could be connected to neutral. Furthermore, the semiconductor die can be quadratic, wherein the 4 magnetic field sensors 108_1 to 108_4 could be either positioned close to the corners of the die or close to the centers of the edges of the die (or silicon die 140). In the first case, the die area is only half the size of the area in the second case for a given clover-leaf geometry.

Furthermore, embodiments of the present invention provide a current sensor 100, comprising a conductive element with n terminal areas 102_1 to 102_n_ and m magnetic field sensors 108_1 to 108_m_, wherein n is at least three and m is at least two. Each of the n terminal areas 102_1 to 102_n_ is connected to a common conductive area 104 to guide a current applied to the respective terminal area 102_1 to 102_n_ into the common conductive area 104. The m magnetic field sensors 108_1 to 108_m_ are arranged at different geometric positions adjacent to the common conductive area 104, wherein each of the m magnetic field sensors 108_1 to 108_m_ is adapted to sense a magnetic field component of the current (for example, of each current) flowing into the common conductive area 104 to provide a sensor signal based on the sensed magnetic field component.

In some embodiments, the number n of terminal areas 102_1 to 102_n_ might be equal to the number m of magnetic field sensors 108_1 to 108_m_ (m=n), as already described above in detail.

Alternatively, the number n of terminal areas 102_1 to 102_n_ might be one less than the number m of magnetic field sensors 108_1 to 108_m_ (m=n+1). Thereby, the m-th magnetic field sensor 108_m_ might be placed at the center point of the common conductive area 104. Furthermore, each of the m−1 magnetic field sensors 108_1 to 108_m_−1 might be arranged to define a center line, wherein the center lines of the m−1 magnetic field sensors 108_1 to 108_m_−1 intercept in a center point, and wherein the m-th magnetic field sensor 108_m_ might be placed at the center point. Thereby, the m-th magnetic field sensor 108_m_ might be adapted to sense a background magnetic field.

Since the mathematical sum of all currents 106_1 to 106_n_ flowing into a circuit node vanishes due to Kirchhoff's circuit law, it is possible to use m=n−1 magnetic field sensors 108_1 and 108_m_ and compute the n-th current in a separate processing entity. Hence, the number m of magnetic field sensors 108_1 to 108_m_ can be one less than the number n of terminal areas 102_1 to 102_n_ (m=n−1).

Figure 21:
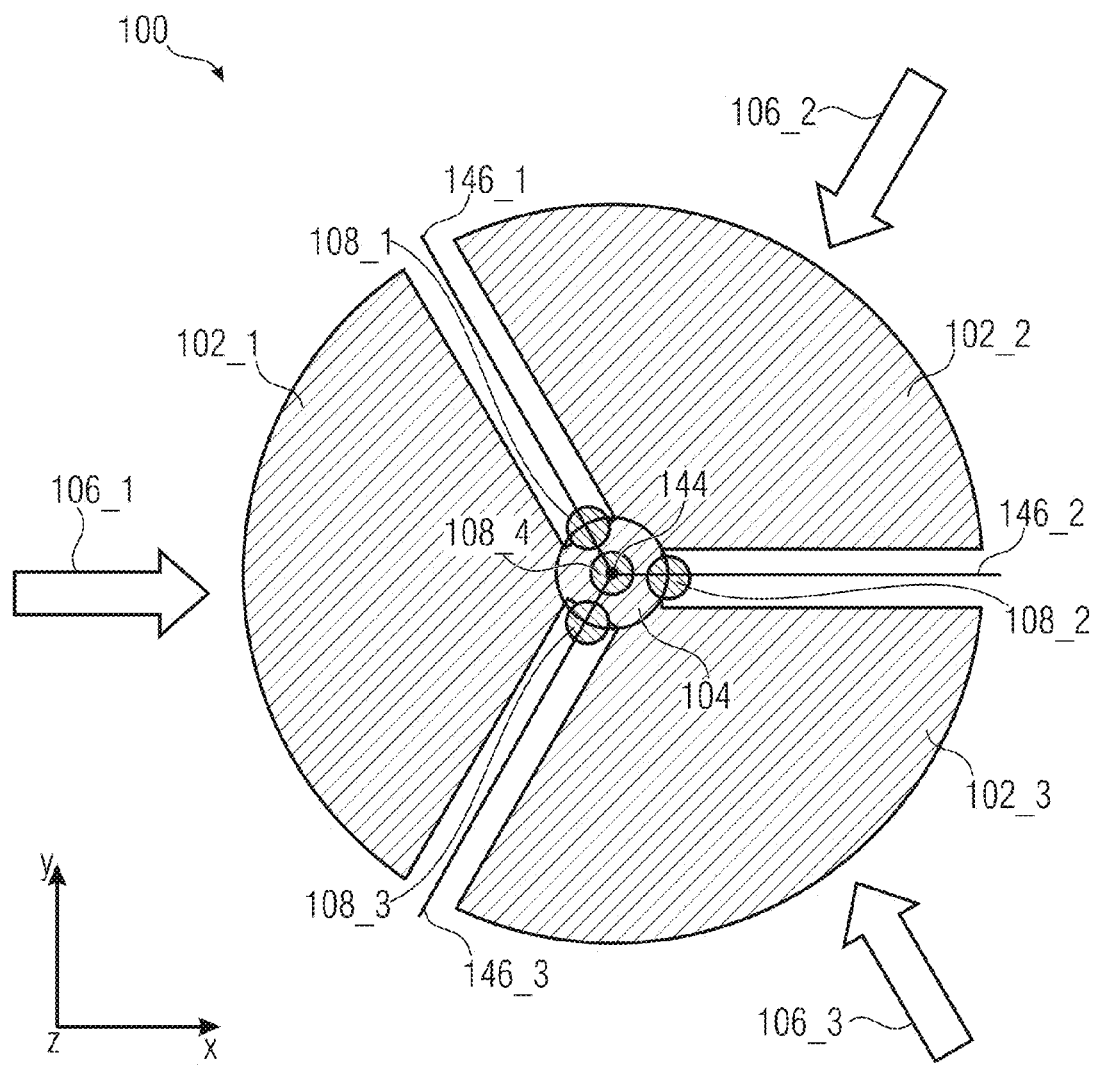
FIG. 21 shows an illustrative view of an embodiment of a current sensor with three terminal areas and four magnetic field sensors.

FIG. 21 shows an illustrative view of an embodiment of a current sensor 100 with three terminal areas 102_1 to 102_3 and four magnetic field sensors 108_1 to 108_4. Three of the four magnetic field sensors 108_1 to 108_3 are arranged symmetrically on a circle 110 with 120° symmetry. In other words, three of the four magnetic field sensors 108_1 to 108_3 are arranged at the tips 120_1 to 120_3 between the three terminal areas 102_1 to 102_3. Furthermore, the fourth magnetic field sensor 108_4 can be arranged at the center point 144 of the common conductive area 104 or at the center point 144 defined by the center lines 146_1 to 146_3 of the three magnetic field sensors 108_1 to 108_3.

Figure 22:
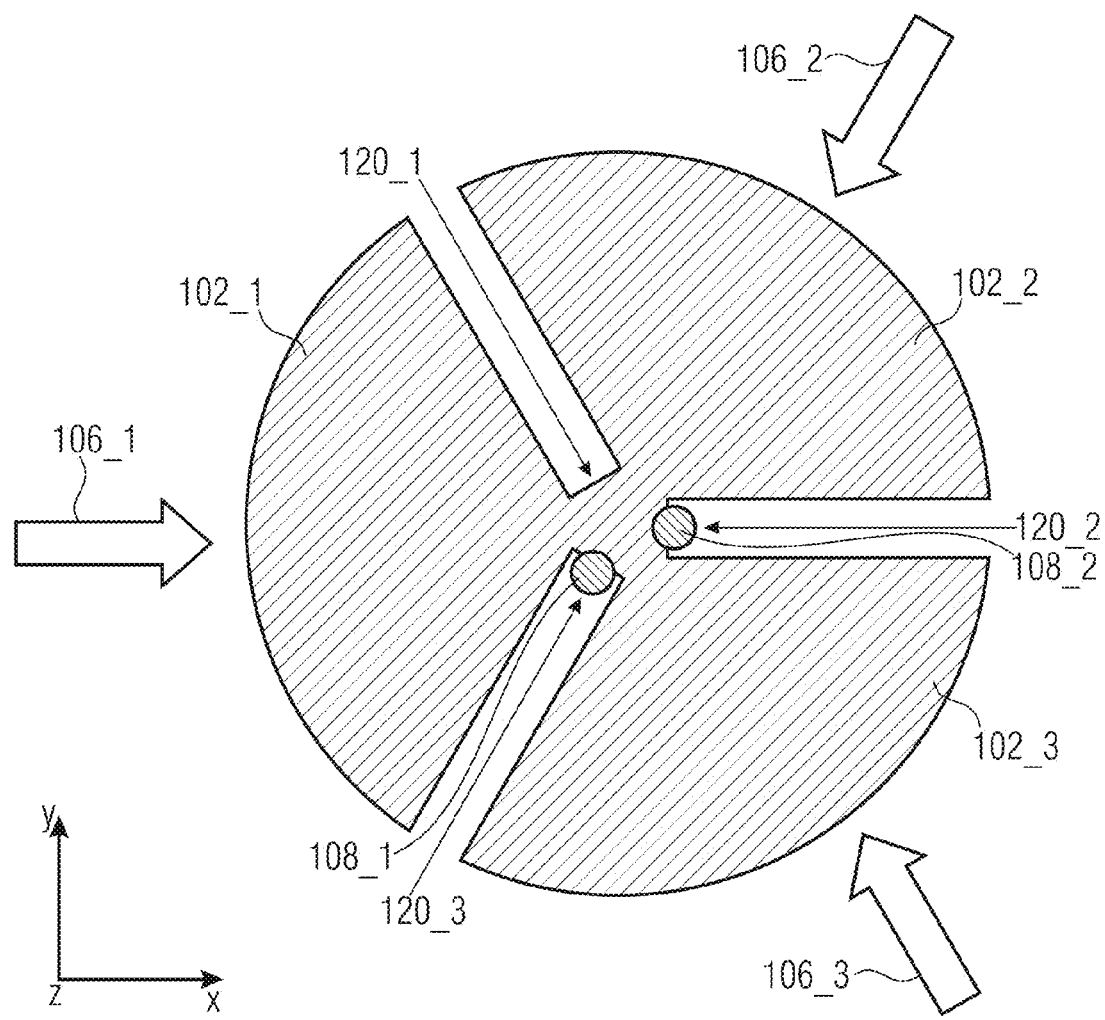
FIG. 22 shows an illustrative view of an alternative embodiment of a current sensor with three terminal areas and two magnetic field sensors.

FIG. 22 shows an illustrative view of an alternative embodiment of a current sensor 100 with three terminal areas 102_1 to 102_3 and two magnetic field sensors 108_1 and 108_2. A first magnetic field sensor 108_1 might be arranged at the tip 120_3 between the first and the third terminal area 102_1 and 102_3, wherein a second magnetic field sensor 108_2 might be arranged at the tip 120_2 between the second and the third terminal area 102_2 and 102_3.

Figure 23:
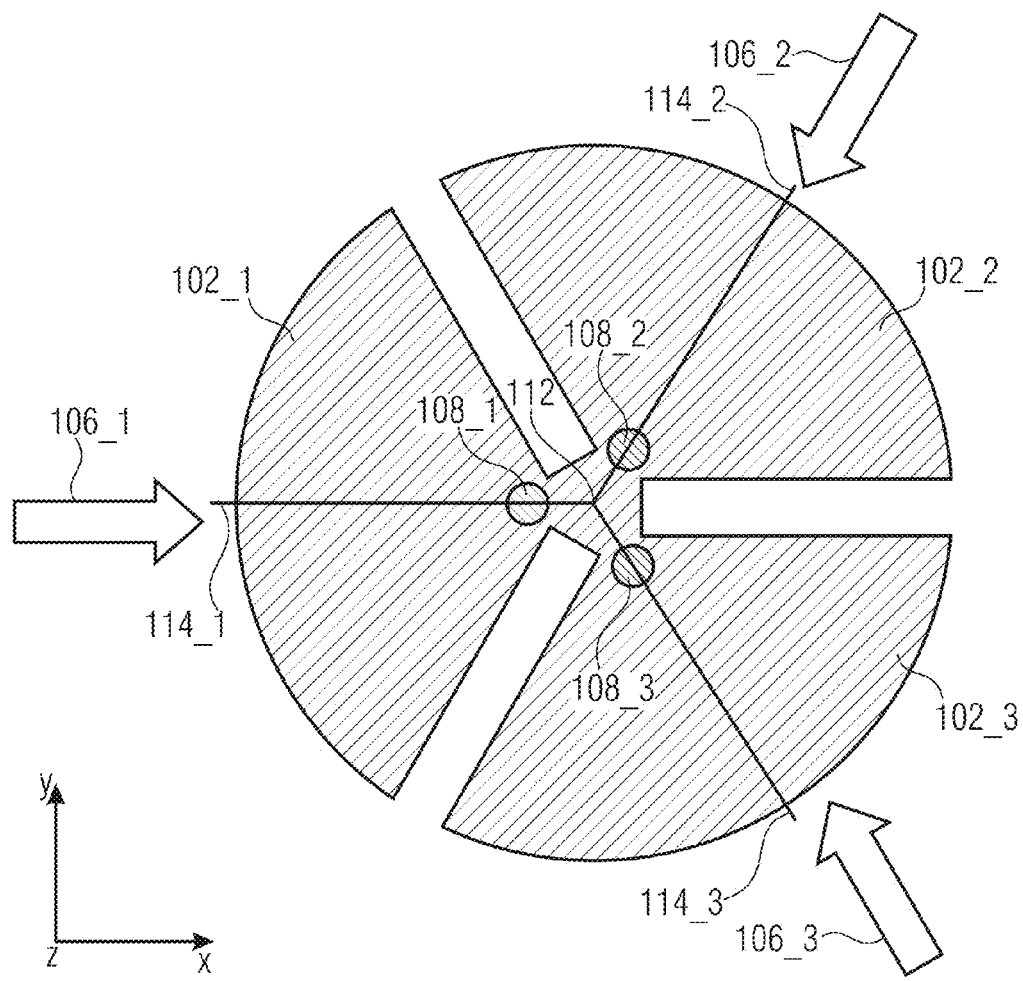
FIG. 23 shows a plan view of an optional embodiment of a current sensor with three terminal areas and three magnetic field sensors.

FIG. 23 shows a plan view of an optional embodiment of a current sensor 100 with three terminal areas 102_1 to 102_3 and three magnetic field sensors 108_1 and 108_3. As shown, the common conductive area 104 may be surrounded by three magnetic field sensors 108_1 to 108_3. Thereby, each of the three terminal areas 102_1 to 102_3 may be arranged to define a center line 114_1 to 114_3, wherein the center lines 114_1 to 114_3 of the three terminal areas 102_1 to 102_3 intercept in a center point 112, and wherein each of the three magnetic field sensors 108_1 to 108_3 is arranged on the center line 114_1 to 114_3 of the corresponding terminal area 102_1 to 102_3.

Alternatively, the three magnetic field sensors 108_1 to 108_3 may be arranged at the slots between the terminal areas

102_1 to 102_3, in such a manner, that the common conductive area 104 is surrounded by the three magnetic field sensors 108_1 to 108_3.

A typical application of the current sensor 100 is the measurement of currents, for example, in power supplies like AC-DC, AC-AC, DC-DC and DC-AC converters.

Therefore, embodiments of the present invention encompass using a current sensor as a circuit node for sensing currents flowing into the circuit node in a power supply, wherein the current sensor comprises: a conductive element with at least three terminal areas and a common conductive area, wherein each of the at least three terminal areas is connected to the common conductive area to guide a current applied to the respective terminal area into the common conductive area; and at least two magnetic field sensors arranged at different geometric positions adjacent to the common conductive area, wherein each of the at least two magnetic field sensors is adapted to sense a magnetic field component of the current (for example, of each current) flowing into the common conductive area to provide a sensor signal based on the sensed magnetic field component.

Further embodiments of the present invention encompass using a current sensor as a circuit node for sensing currents flowing into the circuit node in a power supply, wherein the current sensor comprises: a conductive element with at least three terminal areas and a common conductive area, wherein each of the at least three terminal areas is connected to the common conductive area to guide a current applied to the respective terminal area into the common conductive area; and at least two magnetic field sensors arranged at different geometric positions adjacent to the common conductive area, wherein each of the at least two magnetic field sensors is adapted to sense a magnetic field component of the current (for example, of each current) flowing into the common conductive area to provide a sensor signal based on the sensed magnetic field component.

Figure 24:
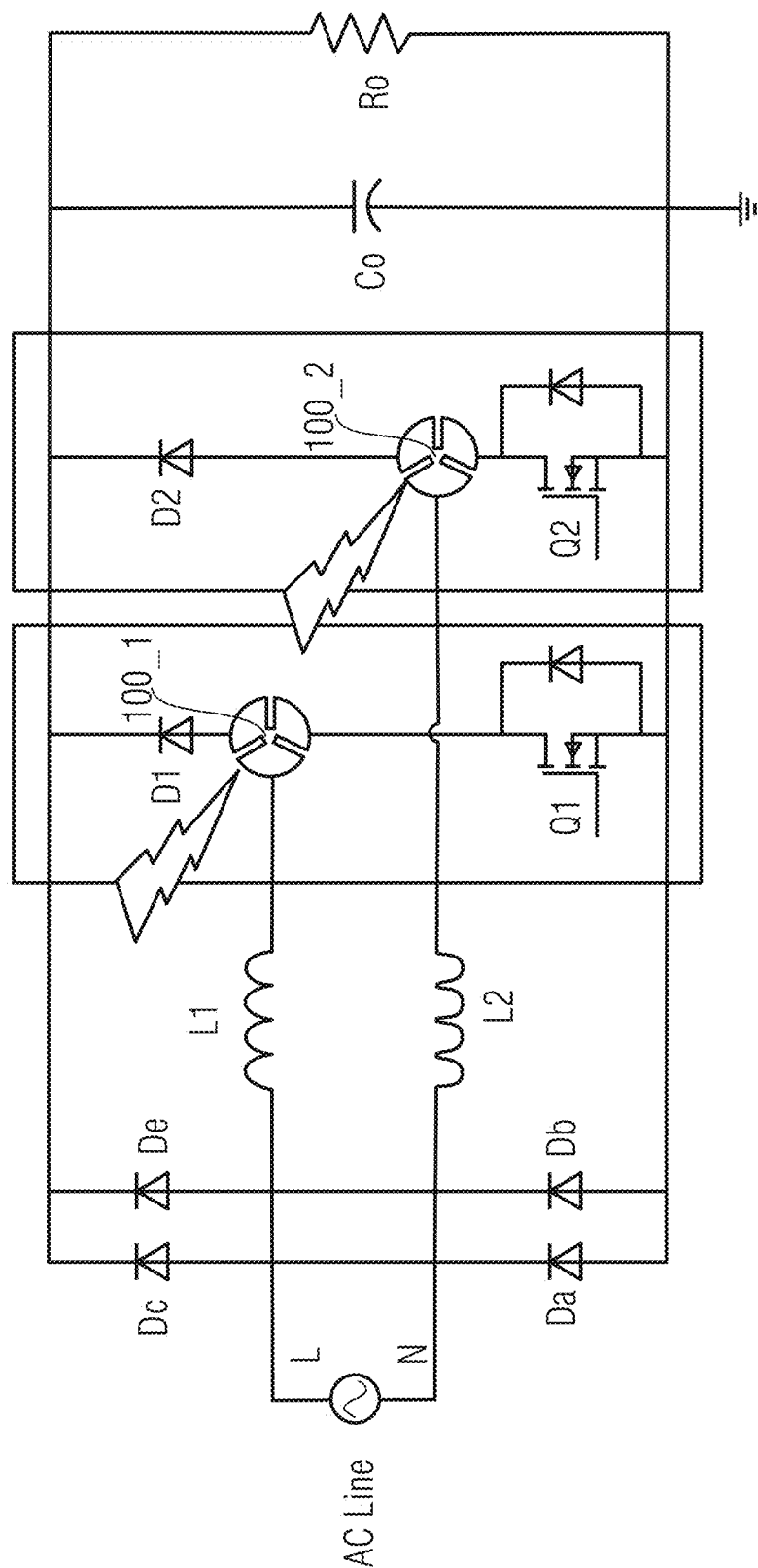
FIG. 24 shows an illustrative view of an embodiment of an application of two current sensors in a semi-bridgeless PFC.

FIG. 24 shows an illustrative view of an embodiment of an application of two current sensors 100_1 and 100_2 in a semi-bridgeless PFC (PFC=power factor correction). Thereby, the CLMCS-node (or current sensor node 100_1 or 100_2) can be inserted into the node, where inductance L1 or L2, IGBT Q1 or Q2 (IGBT=insulated gate bipolar transistor), and diode D1 or D2 are tied together, respectively. The current sensor 100_1 or 100_2 enables or allows measuring all three currents with a single current sensor 100_1 or 100_2. This reduces costs, space, and dissipation. Furthermore, the reverse current through diode D1 or D2, and IGBT Q1 or Q2 can be measured.

Figure 25:
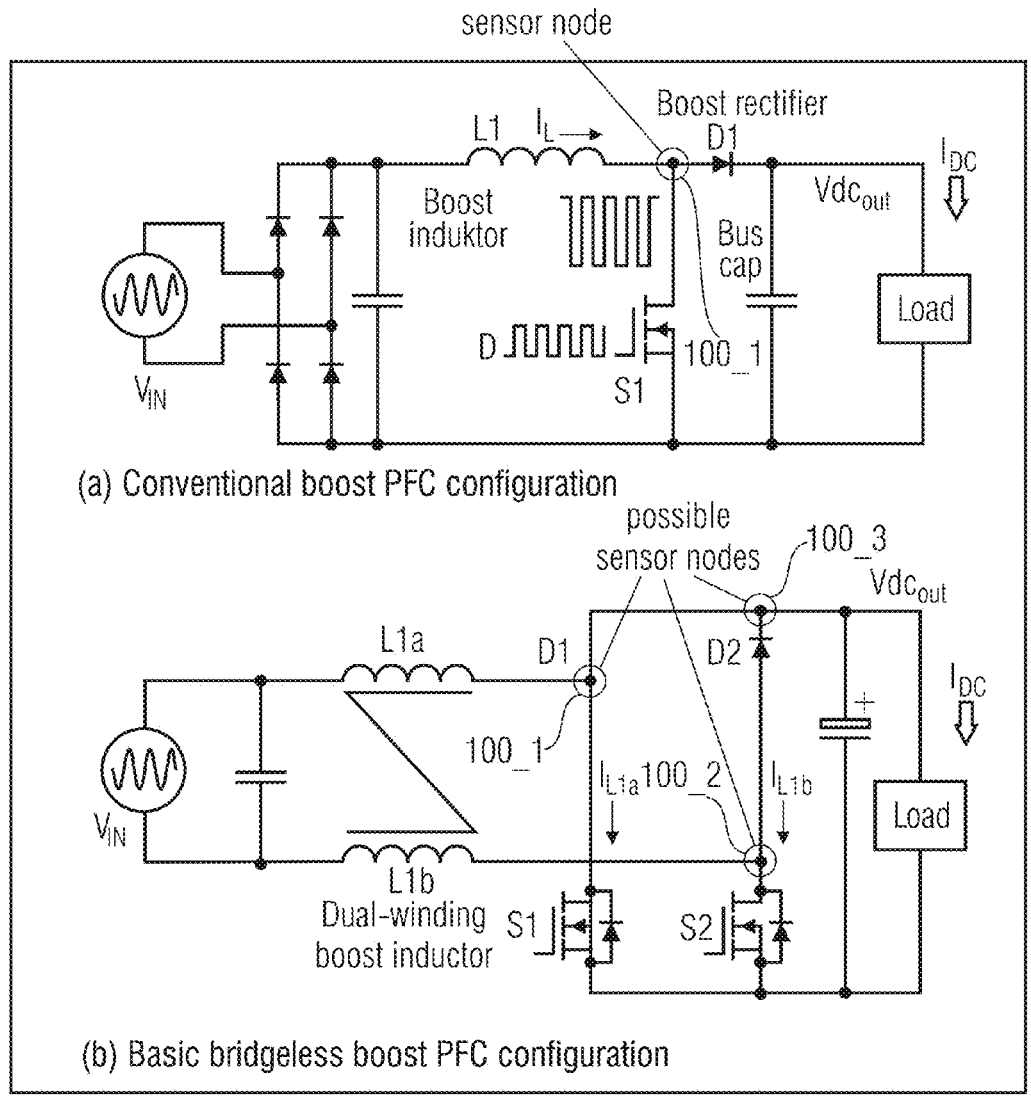
FIG. 25 show in a schematic view embodiments of (a) and (b) applications of the current sensor in PFC configurations.

In FIG. 25a the current sensor 100 is inserted in a conventional boost PFC configuration as a node that connects a first inductor L1, a first diode D1 and a first transistor S1. The current sensor node can thus simultaneously measure the three currents through the first inductor L1, the first diode D1 and the first transistor S1.

In FIG. 25b three current sensors 100_1 to 100_3 are inserted in a basic bridgeless boost PFC configuration. A first current sensor 100_1 connects as a circuit node a first upper inductor L1a, a first diode D1 and a first transistor S1. A second current sensor 100_2 is connecting as a circuit node a first lower inductor L1b, a second diode D2 and a second transistor S2. A third current sensor 100_3 connects as a circuit node the first diode D1, the second diode D2 and the current sensor 100_2. Therein, each current sensor 100_1 to 100_3 can simultaneously measure the three currents through the connected electric devices.

Figure 26A:
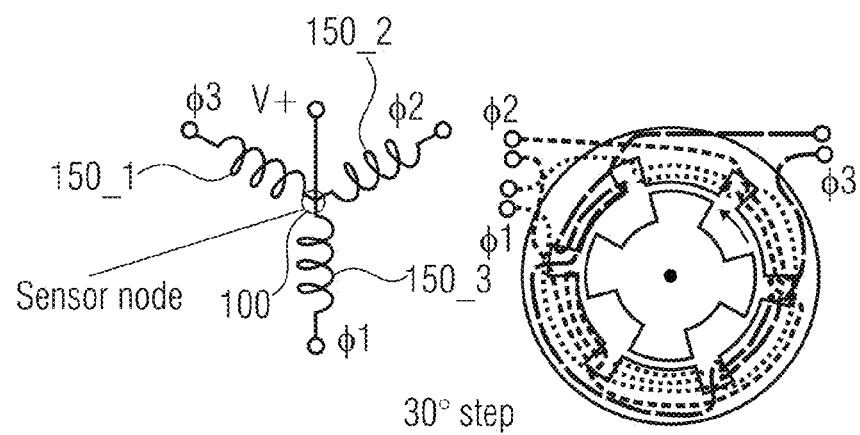
FIGS. 26A and 26B show in illustrative views embodiments of applications of the current sensor in brushless DC current sensing.
Figure 26B:
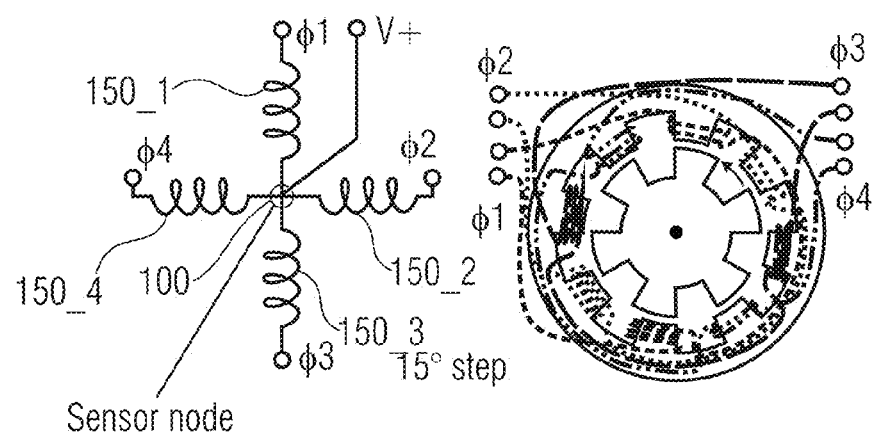

FIGS. 26a and 26b show an illustrative view of an application of a current sensor 100 in brushless DC current sensing. In FIG. 26a a current sensor 100 with three terminal areas 102_1 to 102_3 is inserted into, for example, an equivalent circuit of a three-phase brushless motor, wherein the current sensor 100 connects as a node three inductors 150_1 to 150_3, for sensing simultaneously the three currents through the three inductors 150_1 to 150_3. In FIG. 26b a current sensor 100 with four terminal areas 102_1 to 102_4 is inserted into, for example, an equivalent circuit of a four-phase brushless motor, wherein the current sensor 100 connects as a node four inductors 150_1 to 150_4, for sensing simultaneously the four currents through the four inductors 150_1 to 150_4.

As shown in FIGS. 26a and 26b, not only can the currents of the node be measured, but a voltage measurement could additionally be performed in such a star-node. Although embodiments of the present invention focus on the node current measurement method as an innovative step, it is assumed to be obvious that further parameters (like temperature, voltage) could also be obtained in parallel using classical principles, but in the same node sensor 100.

Embodiments of the present invention relate to the measurement of current and, for example, to how the current splits up if several conductors are connected in a circuit node. The current sensor allows measuring all currents flowing in this circuit node by a single sensor system. Thus, the current senor requires less parts, has a reduced dissipation and can be implemented in a small and inexpensive way.

In the following, further embodiments of the current sensor 100 are described.

Figure 27:
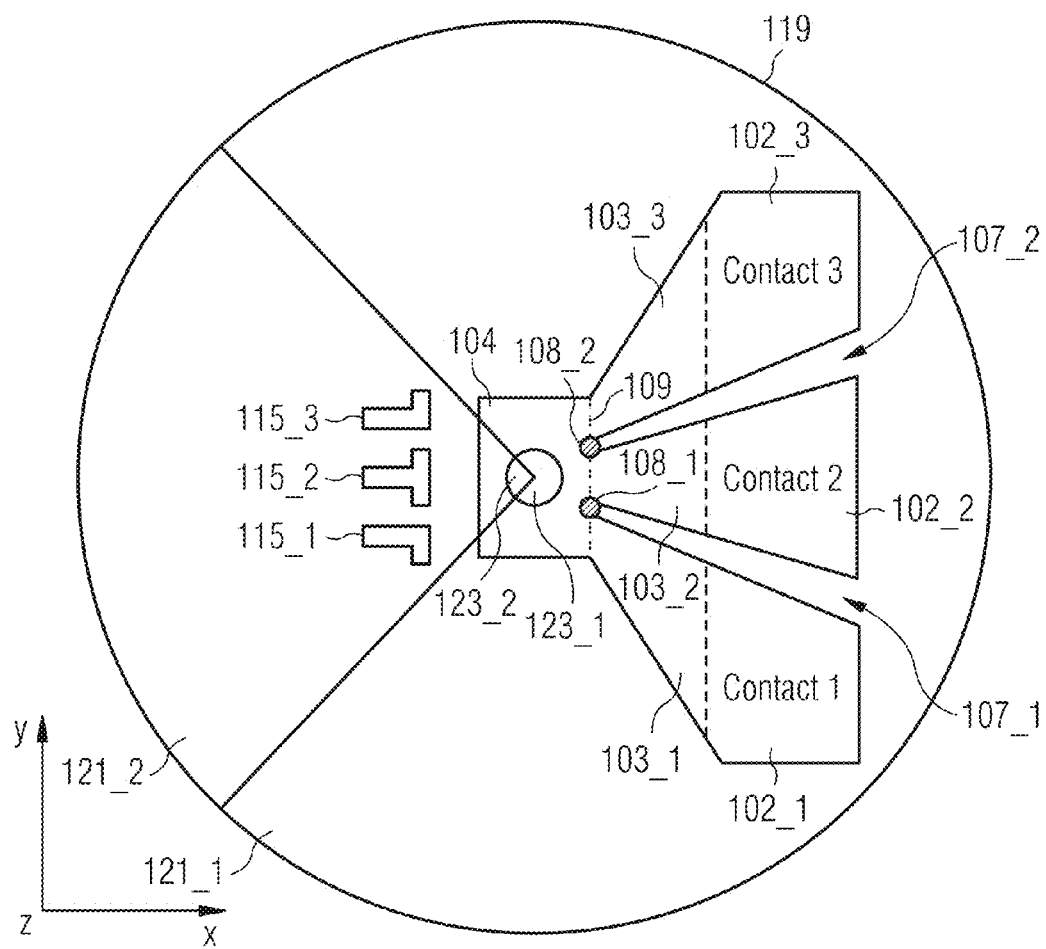
FIG. 27 shows a plan view of a further embodiment of the current sensor.

FIG. 27 shows a plan view of a current sensor 100 according to an embodiment. The current sensor 100 comprises a conductive element and at least two magnetic field sensors 108_1 and 108_2.

The conductive element comprises at least three separate terminal areas 102_1 to 102_3 (indicated with contacts 1 to 3 in FIG. 27), a common conductive area 104 and at least three separate intermediate areas 103_1 to 103_3 connecting the at least three separate terminal areas 102_1 to 102_3 to the common conductive area 104, wherein each of the at least three separate terminal areas 102_1 to 102_3 is connected separately via a respective separate intermediate area of the at least three separate intermediate areas 103_1 to 103_3 to the common conductive area 104 to guide separately a current applied to the respective terminal area into the common conductive area 104.

Thereby, a first separate terminal area 102_1 of the at least three separate terminal areas 102_1 to 102_3 is connected via a first separate intermediate area 103_1 of the at least three separate intermediate areas 103_1 to 103_3 to the common conductive area 104, wherein a second separate terminal area 102_2 of the at least three separate terminal areas 102_1 to 102_3 is connected via a second separate intermediate area 103_2 of the at least three separate intermediate areas 103_1 to 103_3 to the common conductive area, wherein a third separate terminal area 102_3 of the at least three separate terminal areas 102_1 to 102_3 is connected via a third separate intermediate area 103_3 of the at least three separate intermediate areas 103_1 to 103_3 to the common conductive area 104. Thus, the number of separate terminal areas is equal to the number of separate intermediate areas.

The at least two magnetic field sensors 108_1 and 108_2 are arranged at different geometric positions adjacent to the at least three separate intermediate areas 103_1 to 103_3, wherein each of the at least two magnetic field sensors 108_1 and 108_2 is configured to sense a magnetic field component of the current flowing into the common conductive area 104 to provide a sensor signal based on the sensed magnetic field component, wherein the at least two magnetic field sensors 108_1 and 108_2 are arranged adjacent to the at least three separate intermediate areas 103_1 to 103_3 such that the current sensor 100 can measure separately the currents 106_1 to 106_3 guided by the at least three separate terminal areas 102_1 to 102_3 via the at least three separate intermediate areas 103_1 to 103_3 into the common conductive area 104, wherein a geometric area 119 surrounding (or embedding) and abutting the common conductive area 104 is divided into two geometric sectors 121_1 and 121_2, each of the two geometric sectors 121_1 and 121_2 abutting the common conductive area 104, wherein the at least three terminal areas 102_1 to 102_3 are arranged in a first geometric sector 121_1 of the two geometric sectors 121_1 and 121_2, and wherein supply and signal terminals 115_1 to 115_3 of the at least two magnetic field sensors 108_1 to 108_2 are arranged in a second geometric sector 121_2 of the two geometric sectors 121_1 and 121_2.

In embodiments, the geometric area 119 completely surrounds (or embeds) the common conductive area 104. Further, the geometric area 119 can be divided into exactly two geometric sectors 121_1 and 121_2.

As exemplarily shown in FIG. 27, the two geometric sectors 121_1 and 121_2 can be circular sectors, wherein a sum of central angles 123_1 and 123_2 of the two circular sectors can be equal to 360°. Thereby, a central angle 123_1 of the first circular sector 121_1 can be equal to or greater than 300° (or 310°, 315°, 320°, 325° or 330°) or in the range between 300° and 330° (or between 310° and 320°).

In other words, the 360° around the sensor can be subdivided into exactly two segments 121_1 and 121_2. One segment 121_2 has the supply and signal terminals 115_1 to 115_3 of the magnetic field sensors located therein, the other segment 122_1 has the at least three terminal areas 102_1 to 102_3 to which the currents to be measured are applied.

In other words, the current sensor 100 may comprise two current circuits. One of the two current circuits (e.g., sensor current circuit arranged in the segment 121_1) for the magnetic field sensors and the 108_1 and 108_2 and the other of the two current circuits for the currents to be measured. Thereby, the currents to be measured are eventually on a potential which differs by several hundred kV from the sensor current circuit. The sensor current circuit includes the sensor supply and the sensor signals, i.e., all terminals 115_1 to 115_3 of the sensor chip are on low-voltage potential. Only the three terminal areas 102_1 to 102_3 for the currents to be measured are eventually on a high-voltage potential.

In other words, the current sensor 100 may comprise low-voltage terminals and high-voltage terminals. Thereby, in general, the sensor and supply terminals 115_1 to 115_3 of the sensor current circuit are low-voltage terminals, wherein the at least three terminal areas 102_1 to 102_3 for the currents to be measured and the common conductive area 104 are (eventually) are high-voltage terminals.

Since the terminal areas 103_1 to 103_3 are to be as low impedance as possible, and since the current is large and the temperature rise caused by power dissipation is to remain as small as possible, a large part of the geometric area 119 is used for the terminal areas 103_1 to 103_3.

On the other hand, the current sensor 100 also has supply and signal terminals 115_1 to 115_3—which for the most part are at a low voltage potential, while the terminal areas 103_1 to 103_3 for the most part are at a high voltage.

In the embodiment shown in FIG. 27, both the terminal areas 103_1 to 103_3 and the supply and signal terminals 115_1 to 115_3 are arranged at the same floor, level or plane. Thereby, the low-voltage terminals 115_1 to 115_3 of the sensor are accommodated within a range of angles which is as small and compact as possible: e.g. within a 45° circle segment. Thus, the remaining 360° to 315° are available for the terminal areas (current leads/supplies) 103_1 to 103_3—a sufficiently large spacing having to be allowed for between the two circle segment areas 121_1 and 121_2 so as to ensure the necessary clearance/creepage spacing between both areas.

The current sensor 100 shown in FIG. 27 comprises exemplarily three separate terminal areas 102_1 to 102_3 and three separate intermediate areas 103_1 to 103_3. Naturally, the current sensor 100 can comprise up to n terminal areas 102_1 to 102_n and n separate intermediate areas 103_1 to 103_n, wherein n may be a natural number greater than or equal to three.

Furthermore, the current sensor 100 can comprise up to m magnetic field sensors 108_1 to 108_m, that are adapted to sense a magnetic field component of each current 106_1 to 106_n flowing into the common conductive area 104 to provide a sensor signal based on the sensed magnetic field component, wherein m may be a natural number greater than or equal to two. In other words, the m magnetic field sensors 108_1 to 108_m are adapted to sense up to n currents 106_1 to 106_n applied to n terminal areas 102_1 to 102_n.

In some embodiments, the number m of magnetic field sensors 108_1 to 108_m may be equal to the number n of terminal areas 102_1 to 102_n. Furthermore, the number m of magnetic field sensors 108_1 to 108_m may be greater than or equal to the number n of terminal areas 102_1 to 102_n (m≥n), for sensing n independent currents 106_1 to 106_n applied to n terminal areas 102_1 to 102_n. The number m of magnetic field sensors 108_1 to 108_m optionally may be one less than the number n of terminal areas 102_1 to 102_n, wherein the n independent currents 106_1 to 106_n applied to the n terminal areas 102_1 to 102_n might be calculated based on the sensor signals of the m magnetic field sensors 108_1 to 108_m and on Kirchhoff's circuit law.

In fact not the number m of sensor elements is relevant, but the number m of locations of sensor elements. So if e.g. two sensor elements are placed at essentially the same location this counts just as one sensing spot. Moreover, if the number m of sensor locations is equal to or even exceeds the number n of currents fed to the common node then the system can infer the currents plus additionally m−n+1 error sources like background magnetic field or mismatch of sensor elements. Eventually with m sensor locations the system has m measurements and it can solve a set of m+1 equations for the n unknown currents, whereby the m+1 equations correspond to the m measured field components plus Kirchhoff's law.

In the present embodiment of the current sensor 100 shown in FIG. 27, the number m of magnetic field sensors 108_1 to 108_m is exemplarily chosen to be 2 (m=2). Furthermore, the number n of separate terminal areas 102_1 to 102_n and separate intermediate areas 103_1 to 103_n is exemplarily chosen to be 3 (n=3).

The at least two magnetic field sensors 108_1 and 108_2 can be arranged (symmetrically) on different positions corresponding to a geometric line 109. As exemplarily indicated in FIG. 27, the geometric line 109 may coincide with a transition line indicating the transition between the at least three separate intermediate areas 103_1 to 103_3 and the common conductive area 104. Naturally, it also possible that the geometric line is shifted (slightly) towards the at least three separate terminal areas 102_1 to 102_3.

Figure 30:
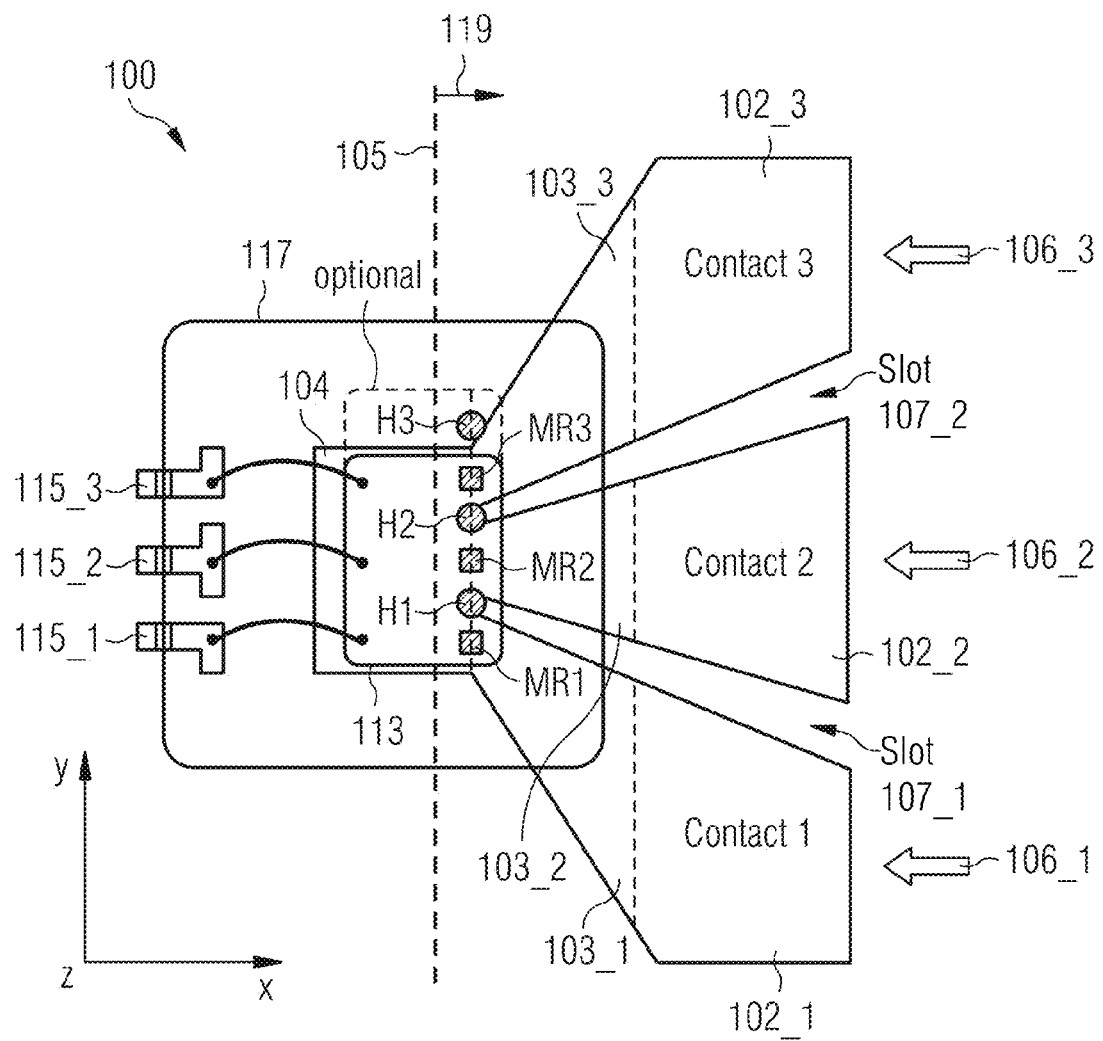
FIG. 30 shows a plan view of a further embodiment of the current sensor.

Preferably the sensor elements are placed close to those areas where the largest magnetic field components occur. In the case of FIG. 27 the largest vertical field components occur at 108_1 and 108_2. If the system needs to have three sensor locations (in order to cancel out background magnetic field disturbances) the third sensor spot can be placed e.g. at the top of line 109 (i.e. at the opposite side of 103_3, opposite of 108_2, as shown in FIG. 30) or at the bottom of line 109 (i.e. at the opposite side of 103_1, opposite of 108_1) or it may also be placed on the sensor chip closest possible to lead 115_2 (which may become necessary if the chip is shorter than the line 109). The 3rd sensor location should at least be different from 1st and 2nd sensor locations.

Figure 29:
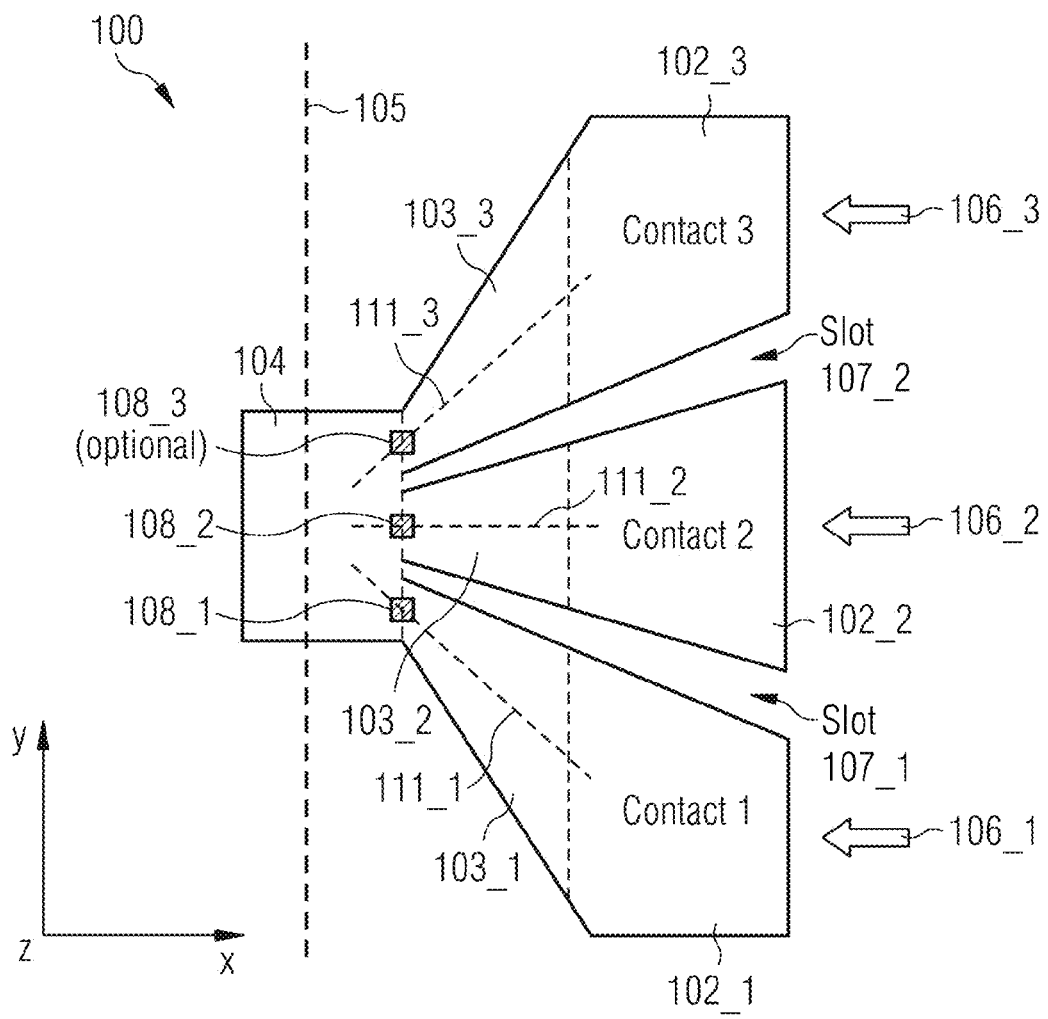
FIG. 29 shows a plan view of a further embodiment of the current sensor.

If the sensor system uses sensor elements that detect magnetic field components parallel to the drawing plane it could place them on line 109 in the centers of 103_1, 103_2, 103_3 (as shown in FIGS. 29, 30).

The at least two magnetic field sensors 108_1 and 108_2 shown in FIG. 27 can be, for example, Hall devices configured to sense a magnetic field component perpendicular to the plane spanned by the common conductive area 104, i.e. the z-component of the magnetic field.

Naturally, the at least two magnetic field sensors 108_1 and 108_2 also can be, for example, magneto-resistors configured to sense magnetic field components parallel to the plane spanned by the common conductive area 104, i.e. in-plane magnetic field components or x-components and/or y-components of the magnetic field. In this case, the at least two magnetic field sensors 108_1 and 108_2 may be arranged as shown in FIGS. 29 and 30.

In embodiments, the at least two magnetic field sensors 108_1 to 108_2 may be integrated in an integrated circuit 113 (see FIG. 30). Thereby, the sensor terminals 115_1 to 115_3 can be connected, for example, via bond vias to the integrated circuit.

Subsequently, further embodiments of the current sensor 100 are described. Thereby, the below description of embodiments of the current sensor 100 is also applicable to the embodiments of the current sensor 100 described above, especially to the embodiment of the current sensor 100 shown in FIG. 27.

Figure 28:
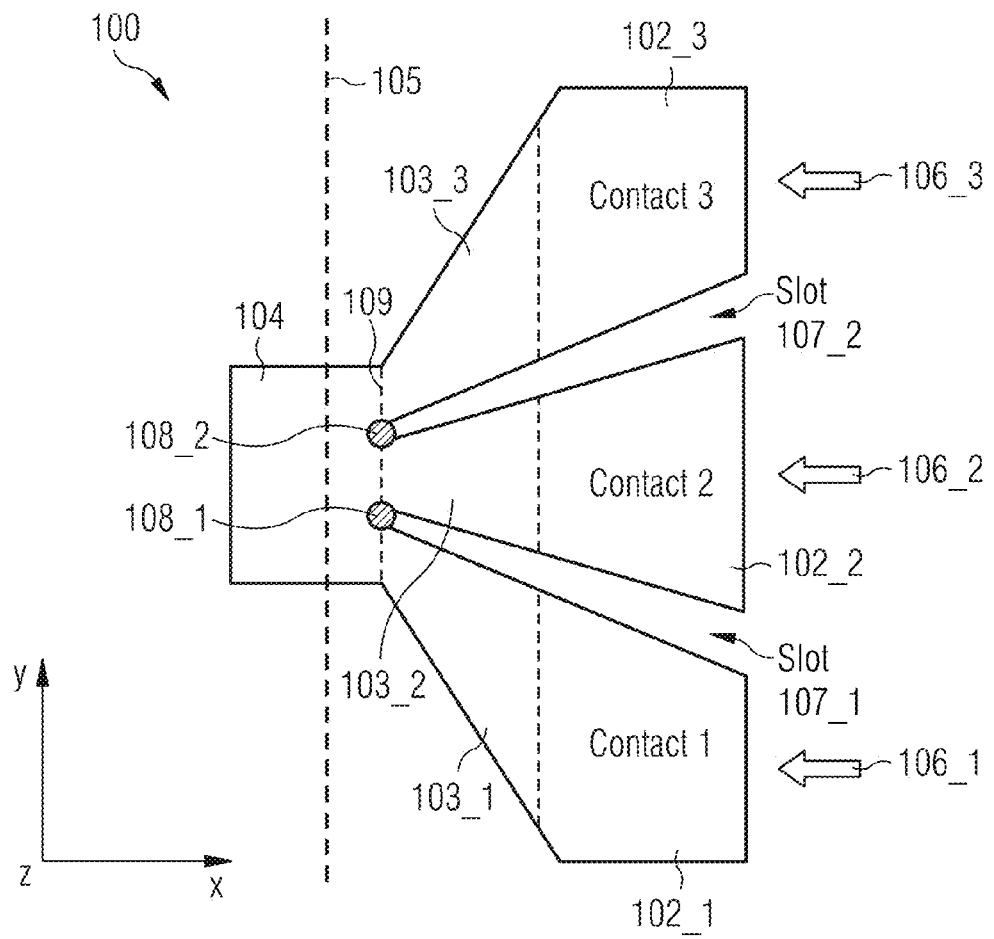
FIG. 28 shows a plan view of a further embodiment of the current sensor.

FIG. 28 shows a plan view of a current sensor 100 according to an embodiment. The current sensor 100 comprises a conductive element and at least two magnetic field sensors 108_1 and 108_2.

The conductive element comprises at least three separate terminal areas 102_1 to 102_3 (indicated with contacts 1 to 3 in FIG. 28), a common conductive area 104 and at least three separate intermediate areas 103_1 to 103_3 connecting the at least three separate terminal areas 102_1 to 102_3 to the common conductive area 104, wherein each of the at least three separate terminal areas 102_1 to 102_3 is connected separately via a respective separate intermediate area of the at least three separate intermediate areas 103_1 to 103_3 to the common conductive area 104 to guide separately a current applied to the respective terminal area into the common conductive area 104.

Thereby, a first separate terminal area 102_1 of the at least three separate terminal areas 102_1 to 102_3 is connected via a first separate intermediate area 103_1 of the at least three separate intermediate areas 103_1 to 103_3 to the common conductive area 104, wherein a second separate terminal area 102_2 of the at least three separate terminal areas 102_1 to 102_3 is connected via a second separate intermediate area 103_2 of the at least three separate intermediate areas 103_1 to 103_3 to the common conductive area, wherein a third separate terminal area 102_3 of the at least three separate terminal areas 102_1 to 102_3 is connected via a third separate intermediate area 103_3 of the at least three separate intermediate areas 103_1 to 103_3 to the common conductive area 104. Thus, the number of separate terminal areas is equal to the number of separate intermediate areas.

The at least two magnetic field sensors 108_1 and 108_2 are arranged at different geometric positions adjacent to the at least three separate intermediate areas 103_1 to 103_3, wherein each of the at least two magnetic field sensors 108_1 and 108_2 is configured to sense a magnetic field component of the current flowing into the common conductive area 104 to provide a sensor signal based on the sensed magnetic field component, wherein the at least two magnetic field sensors 108_1 and 108_2 are arranged adjacent to the at least three separate intermediate areas 103_1 to 103_3 such that the current sensor 100 can measure separately the currents 106_1 to 106_3 guided by the at least three separate terminal areas 102_1 to 102_3 via the at least three separate intermediate areas 103_1 to 103_3 into the common conductive area 104, and wherein the at least three separate terminal areas 102_1 to 102_3 are arranged in a geometric half-space defined by a geometric plane intersecting the common conductive area 104.

Thus, when comparing FIGS. 28 and 29, the two circular sectors 121_1 and 121_2 of the current sensor 100 shown in FIG. 28 would each have a central angle of 180°, in order to obtain the embodiment of the current sensor 100 shown in FIG. 29.

In embodiments, the geometric plane intersecting the common conductive area 104 may be arranged substantially perpendicular to a plane spanned by the common conductive area 104, as indicated by the dashed line 105 in FIG. 28. Naturally, the geometric plane may also be inclined with respect to the plane spanned by the common conductive area 104.

Further, in some embodiments the conductive element may be a sheet-like conductor with cut-out slots 107_1 and 107_2 to form the at least three separate terminal areas 102_1 to 102_3 and at least three separate intermediate areas 103_1 to 103_3, i.e., the conductive element may be substantially planar. In this case, the at least three separate terminal areas 102_1 to 102_3 can be arranged in a geometric half-plane defined by a geometric line 105 intersecting the common conductive area 104.

In other words, the conductors or leads for connecting the at least three separate terminal areas 102_1 to 102_3 do not originate from 360° as it may be the case with the current sensor 100 shown in FIG. 1 but only from a half space of 180°.

The current sensor 100 shown in FIG. 28 comprises exemplarily three separate terminal areas 102_1 to 102_3 and three separate intermediate areas 103_1 to 103_3. Naturally, the current sensor 100 can comprise up to n terminal areas 102_1 to 102_*n* and n separate intermediate areas 103_1 to 103_*n*, wherein n may be a natural number greater than or equal to three.

Furthermore, the current sensor 100 can comprise up to m magnetic field sensors 108_1 to 108_*m*, that are adapted to sense a magnetic field component of each current 106_1 to 106_*n* flowing into the common conductive area 104 to provide a sensor signal based on the sensed magnetic field component, wherein m may be a natural number greater than or equal to two. In other words, the m magnetic field sensors 108_1 to 108_*m* are adapted to sense up to n currents 106_1 to 106_*n* applied to n terminal areas 102_1 to 102_*n*.

In some embodiments, the number m of magnetic field sensors 108_1 to 108_*m* may be equal to the number n of terminal areas 102_1 to 102_*n*. Furthermore, the number m of magnetic field sensors 108_1 to 108_*m* may be greater than or equal to the number n of terminal areas 102_1 to 102_*n* (m≥n), for sensing n independent currents 106_1 to 106_*n* applied to n terminal areas 102_1 to 102_*n*. The number m of magnetic field sensors 108_1 to 108_m optionally may be one less than the number n of terminal areas 102_1 to 102_n, wherein the n independent currents 106_1 to 106_n applied to the n terminal areas 102_1 to 102_n might be calculated based on the sensor signals of the m magnetic field sensors 108_1 to 108_m and on Kirchhoff's circuit law.

In the present embodiment of the current sensor 100 shown in FIG. 28, the number m of magnetic field sensors 108_1 to 108_m is exemplarily chosen to be 2 (m=2). Furthermore, the number n of separate terminal areas 102_1 to 102_n and separate intermediate areas 103_1 to 103_n is exemplarily chosen to be 3 (n=3).

The at least two magnetic field sensors 108_1 and 108_2 can be arranged (symmetrically) on different positions corresponding to a geometric line 109. As exemplarily indicated in FIG. 28, the geometric line 109 may coincide with a transition line indicating the transition between the at least three separate intermediate areas 103_1 to 103_3 and the common conductive area 104. Naturally, it also possible that the geometric line is shifted (slightly) towards the at least three separate terminal areas 102_1 to 102_3. However, the current 106_1 to 106_3 flowing into the common conductive area 104 is bended at the tips of the slots 107_1 and 107_2 which leads to an increased current density and in turn to an increased magnetic field strength, which is why the magnetic field sensors 108_1 and 108_2 should be placed near to these bends.

In other words, three different basic areas of the conductive element can be differentiated, the common conductive area 104, the separate terminal areas 102_1 to 102_3 (e.g. leads or contacts or contact pads) and the connecting pieces between the same, referred herein as to separate intermediate areas 103_1 to 103_3. The magnetic field within the inner area of the common conductive area 104 can no longer be clearly associated with a current 106_1 to 106_3, which is why it is not desirable to place any magnetic field sensors therein. The magnetic field in the at least three separate terminal areas 102_1 to 102_3 is influenced by the external conductor lead not known by the current sensor 100 and thus implying errors—i.e. also not suitable for placing the magnetic field sensors 108_1 to 108_2. Thus, the at least three separate intermediate areas 103_1 to 103_3 remain, which additionally have the advantage for Hall sensors that the ends of the slots reside therein and generate regions of enhanced field—i.e. ideal locations for the at least two magnetic field sensors 108_1 to 108_2. As can be seen in FIG. 28, the ideal sensor positions are located on a straight line 109.

For example, the at least two magnetic field sensors 108_1 and 108_2 can be arranged between two adjacent separate intermediate areas immediately adjacent to the common conductive area 104, as it is indicated in FIG. 29 by way of example.

The at least two magnetic field sensors 108_1 and 108_2 shown in FIG. 28 can be, for example, Hall devices configured to sense a magnetic field component perpendicular to the plane spanned by the common conductive area 104, i.e. the z-component of the magnetic field.

FIG. 29 shows a plan view of a current sensor 100 according to an embodiment. In contrast to FIG. 28, in FIG. 29 each of the at least two magnetic field sensors 108_1 and 108_2 (108_3 is optional) is arranged on a center line 111_1 to 111_3 of a respective separate intermediate area 103_1 to 103_3. In detail, each of the at least three separate intermediate areas 103_1 to 103_3 is arranged to define a center line associated therewith such that the center lines 111_1 to 111_3 extend from the at least three separate terminal areas 102_1 to 102_3 to the common conductive area 104.

The at least two magnetic field sensors 108_1 and 108_2 (108_3 is optional) shown in FIG. 29 can be, for example, magneto-resistors configured to sense magnetic field components parallel to the plane spanned by the common conductive area 104, i.e. in-plane magnetic field components or x-components and/or y-components of the magnetic field.

FIG. 30 shows a plan view of a current sensor 100 according to an embodiment.

In FIG. 30, the realization of the at least two magnetic field sensors 108_1 to 108_2 (108_3 is optional) as Hall devices is indicated with H1 and H2 (H3 is optional) or as magneto resistors is indicated with MR1 and MR2 (MR3 is optional).

The at least two magnetic field sensors 108_1 to 108_2 may be integrated in an integrated circuit 113, wherein the size of the integrated circuit 113 may be adapted to the number of magnetic field sensors integrated in the integrated circuit 113, i.e. the size of the integrated circuit may be increased when integrating three magnetic field sensors 108_1 to 108_3 (indicated with the dashed line in FIG. 30) comparted to when integrating only two magnetic field sensors 108_1 to 108_2.

The current sensor 100 may further comprise signal terminals and supply terminals 115_1 to 115_3 for externally connecting the integrated circuit 113.

Further, the current sensor 100 may comprise a mold compound or mold body 117 for packaging the integrated circuit 113, the common conductive area 104 and the signal terminals and supply terminals 115_1 to 115_3.

Figure 31:
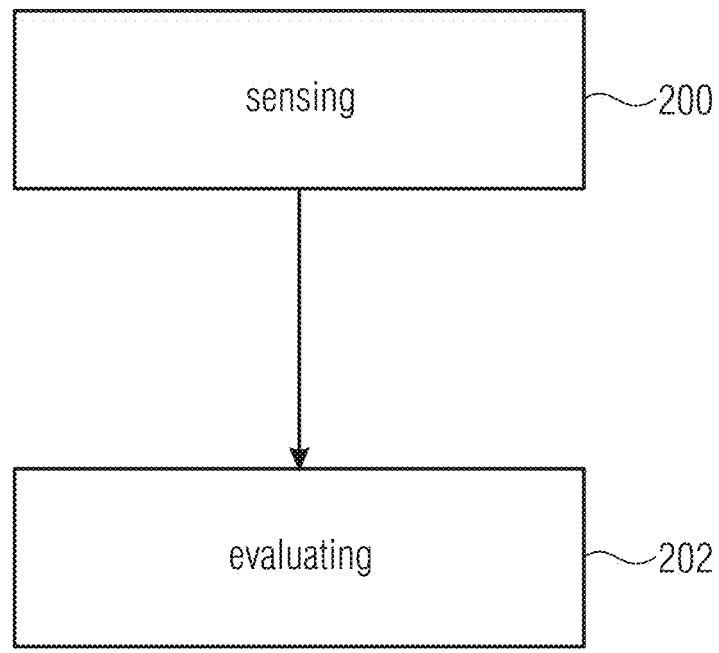
FIG. 31 shows an embodiment of a method for sensing at least three currents in a measuring node.
Figure 32:
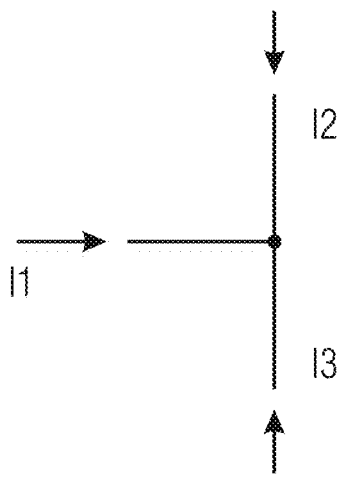
FIG. 32 shows an illustrative view of three wires connected in a common node.

Further embodiments of the present invention provide a method for measuring at least three currents in a measuring node as shown in FIG. 31, wherein the measuring node comprises at least two magnetic field sensors. In a first step 200 a magnetic field component of the current flowing into the measuring node is sensed with the at least two magnetic field sensors. In a second step 202 the value of the current flowing into the measuring node is evaluated based on the sensed magnetic field component.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block, item or feature of a corresponding apparatus. Some or all of the method steps may be executed by (or using) a hardware apparatus, for example, a microprocessor, a programmable computer or an electronic circuit. In some embodiments, one or more of the most important method steps may be executed by such an apparatus.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment comprises a processing means, for example a computer or a programmable logic device, configured to, or adapted to, perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A current sensor, comprising:
    a conductive element with at least three separate terminal areas, a common conductive area and at least three separate intermediate areas connecting the at least three separate terminal areas to the common conductive area, wherein each of the at least three separate terminal areas is connected separately via a respective separate intermediate area of the at least three separate intermediate areas to the common conductive area to guide separately a current applied to the respective terminal area into the common conductive area; and
    at least two magnetic field sensors arranged at different geometric positions adjacent to the at least three separate intermediate areas, wherein each of the at least two magnetic field sensors is configured to sense a magnetic field component of the current flowing into the common conductive area to provide a sensor signal based on the sensed magnetic field component;
    wherein the at least two magnetic field sensors are arranged adjacent to the at least three separate intermediate areas such that the current sensor can measure separately the currents guided by the at least three separate terminal areas via the at least three separate intermediate areas into the common conductive area; and
    wherein a geometric area surrounding and abutting the common conductive area is divided into two geometric sectors, each of the two geometric sectors abutting the common conductive area, wherein the at least three terminal areas are arranged in a first geometric sector of the two geometric sectors, and wherein signal and supply terminals of the at least two magnetic field sensors are arranged in a second geometric sector of the two geometric sectors.

2. The current sensor according to claim 1, wherein the geometric area completely surrounds the common conductive area.

3. The current sensor according to claim 1, wherein the geometric area is divided into exactly two geometric sectors.

4. The current sensor according to claim 1, wherein the two geometric sectors are two circular sectors, wherein a sum of central angles of the two circular sectors is equal to 360°.

5. The current sensor according to claim 1, wherein a central angle of the first circular sector is equal to or greater than 300°.

6. The current sensor according to claim 1, wherein a first separate terminal area of the at least three separate terminal areas is connected via a first separate intermediate area of the at least three separate intermediate areas to the common conductive area;
    wherein a second separate terminal area of the at least three separate terminal areas is connected via a second separate intermediate area of the at least three separate intermediate areas to the common conductive area; and
    wherein a third separate terminal area of the at least three separate terminal areas is connected via a third separate intermediate area of the at least three separate intermediate areas to the common conductive area.

7. The current sensor according to claim 1, further comprising an evaluator configured to determine a value of each current flowing into the common conductive area based on the sensor signals of the at least two magnetic field sensors.

8. The current sensor according to claim 7, wherein the evaluator is configured to derive a value of a background magnetic field based on the sensor signals of the at least two magnetic field sensors, and to determine evaluate the value of each current flowing into the common conductive area further based on the value of the background magnetic field.

9. The current sensor according to claim 7, wherein the evaluator comprises an output for outputting the value of each current flowing into the common conductive area.

10. The current sensor according to claim 1, wherein each current flowing into the common conductive area generates a magnetic field through each of the at least two magnetic field sensors.

11. The current sensor according to claim 1, wherein the at least two magnetic field sensors are arranged on different positions corresponding to a geometric line.

12. The current sensor according to claim 1, wherein the at least two magnetic field sensors are arranged symmetrically on different positions corresponding to a geometric line.

13. The current sensor according to claim 1, wherein each of the at least two magnetic field sensors is arranged between two adjacent separate intermediate areas.

14. The current sensor according to claim 1, wherein each of the at least two magnetic field sensors is arranged between two adjacent separate intermediate areas immediately adjacent to the common conductive area.

15. The current sensor according to claim 1, wherein each of the at least three separate intermediate areas is arranged to define a center line associated therewith such that the center lines extend from the at least three separate terminal areas to the common conductive area, and wherein each of the at least two magnetic field sensors is arranged on the center line of the respective separate intermediate area.

16. The current sensor according to claim 15, wherein each of the at least two magnetic field sensors is arranged at an equal distance from the common conductive area on the center line of the respective separate intermediate area.

17. The current sensor according to claim 1, wherein the at least two magnetic field sensors are discrete sensors.

18. The current sensor according to claim 1, wherein the at least two magnetic field sensors are part of an integrated circuit.

19. The current sensor according to claim 1, wherein each current flowing into the common conductive area provides a mean temperature increase to each of the at least two magnetic field sensors, wherein a maximum tolerance in increase of temperature between two magnetic field sensors amounts to 10% of the mean temperature increase.

20. The current sensor according to claim 1, wherein the at least three separate terminal areas and the at least three separate intermediate areas are in an area outside of the common conductive area isolated from each other by an isolating material.

21. The current sensor according to claim 1, wherein in a plan view the common conductive area is surrounded by the at least two magnetic field sensors.

22. The current sensor according to claim 1, wherein the conductive element comprises a homogenous electric conducting material with an electrical conductivity of at least $3*10^7$ S/m.

23. A current sensor, comprising:
a conductive element with n separate terminal areas and n separate intermediate areas, wherein n is at least three, and a common conductive area, wherein each of the n separate terminal areas is connected separately via a respective separate intermediate area of the n separate intermediate areas to the common conductive area and configured to guide separately a current applied to the respective terminal area into the common conductive area; and
m magnetic field sensors, wherein m is at least two, arranged at different geometric positions adjacent to the separate intermediate areas, wherein each of the m magnetic field sensors is configured to sense a magnetic field component of the current flowing into the common conductive area to provide a sensor signal based on the sensed magnetic field component, wherein the m magnetic field sensors are arranged at different geometric positions adjacent to the separate intermediate areas such that the current sensor can measure separately the currents guided by the n separate terminal areas via the n separate intermediate areas into the common conductive area;
wherein a geometric area surrounding and abutting the common conductive area is divided into two geometric sectors, each of the two geometric sectors abutting the common conductive area, wherein the n separate terminal areas are arranged in a first geometric sector of the two geometric sectors, and wherein signal and supply terminals of the at least two magnetic field sensors are arranged in a second geometric sector of the two geometric sectors.

24. The current sensor according to claim 23, wherein m=n.

25. The current sensor according to claim 23, wherein m=n−1.

26. The current sensor according to claim 23, wherein m=n+1.

27. A method for measuring at least three separate currents in a measuring node, wherein the measuring node comprises at least two magnetic field sensors and a conductive element with at least three separate terminal areas, a common conductive area and at least three separate intermediate areas connecting the at least three separate terminal areas to the common conductive area, wherein each of the at least three separate terminal areas is connected separately via a respective separate intermediate area of the at least three separate intermediate areas to the common conductive area to guide separately one of the at least three currents applied to the respective terminal area into the common conductive area, wherein the at least two magnetic field sensors are arranged adjacent to the at least three separate intermediate areas such that values of the at least three currents separately guided by the at least three separate terminal areas via the at least three separate intermediate areas into the common conductive area are separately evaluated, wherein a geometric area surrounding and abutting the common conductive area is divided into two geometric sectors, each of the two geometric sectors abutting the common conductive area, wherein the at least three terminal areas are arranged in a first geometric sector of the two geometric sectors, and wherein signal and supply terminals of the at least two magnetic field sensors are arranged in a second geometric sector of the two geometric sectors, the method comprising:
sensing separately magnetic field components of the at least three separate currents flowing into the measuring node with the at least two magnetic field sensors; and
evaluating separately the values of the at least three separate currents flowing into the measuring node based on the separately sensed magnetic field components.

28. The method for measuring at least three currents in a measuring node according to claim 27, further with the following steps:
evaluating a value of a background magnetic field based on the sensed magnetic field component; and
evaluating the value of each current flowing into the measuring node further based on the value of the background magnetic field.

29. A computer readable non-transitory digital storage medium having stored thereon a computer program having a program code for performing, when running on a computer, a method for measuring at least three currents in a measuring node, wherein the measuring node comprises at least three magnetic field sensors and a conductive element, wherein the conductive element comprises at least three separate terminal areas, a common conductive area and at least three separate intermediate areas connecting the at least three separate terminal areas to the common conductive area, wherein each of the at least three separate terminal areas is separately connected via a respective separate intermediate area of the at least three separate intermediate areas to the common conductive area to separately guide one of the at least three currents applied to the respective terminal area into the common conductive area, wherein the at least two magnetic field sensors are arranged adjacent to the at least three separate intermediate areas such that values of the at least three currents separately guided by the at least three separate terminal areas via the at least three separate intermediate areas into the common conductive area are separately evaluated, wherein a geometric area surrounding and abutting the common conductive area is divided into two geometric sectors, each of the two geometric sectors abutting the common conductive area, wherein the at least three terminal areas are arranged in a first geometric sector of the two geometric sectors, and wherein signal and supply terminals of the at least two magnetic field sensors are arranged in a second geometric sector of the two geometric sectors, the method comprising:
sensing separately a magnetic field component of each current flowing into a measuring node with the at least two magnetic field sensors; and
evaluating separately the value of each current flowing into the measuring node based on the sensed magnetic field component.

* * * * *